United States Patent
Okuno et al.

(10) Patent No.: US 6,747,640 B2
(45) Date of Patent: Jun. 8, 2004

(54) IMAGE DISPLAY DEVICE AND IMAGE DISPLAY METHOD

(75) Inventors: Yoshiaki Okuno, Tokyo (JP); Jun Someya, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 82 days.

(21) Appl. No.: 09/909,870

(22) Filed: Jul. 23, 2001

(65) Prior Publication Data

US 2002/0047923 A1 Apr. 25, 2002

(30) Foreign Application Priority Data

Oct. 24, 2000 (JP) ........................................ 2000-323728

(51) Int. Cl.[7] ................................................. G09G 5/00
(52) U.S. Cl. .......................... 345/213; 345/98; 345/660
(58) Field of Search ............................ 345/98, 660, 213

(56) References Cited

U.S. PATENT DOCUMENTS 5,963,221 A * 10/1999 Shimizu et al. ............. 345/539
5,978,041 A * 11/1999 Masuda et al. ............. 348/563
6,486,922 B1 * 11/2002 Ueno .......................... 348/589

FOREIGN PATENT DOCUMENTS

JP 10-207432 8/1998
JP 11-038955 2/1999

* cited by examiner

Primary Examiner—Richard Hjerpe
Assistant Examiner—Jean Lesperance
(74) Attorney, Agent, or Firm—Birch, Stewart, Kolasch & Birch, LLP

(57) ABSTRACT

An image display device comprises a first clock generator for generating and outputting a first clock based on input horizontal synchronizing signals corresponding to horizontal lines making up input image signals, a second clock generator for generating and outputting a second clock, storage configured so as to accumulate image data sampled from the input image signals based on the first clock using the first clock output from the first clock generator and read out the accumulated image data using the second clock output from the second clock generator, a controller for outputting control signals for controlling the cycle of output horizontal synchronizing signals at the time of reading out and displaying the accumulated image data from the storage, according to image size information of the input image signals, cycle information of the input horizontal synchronizing signals, display panel size information, and cycle information of the second clock, and a synchronizing signal generator for outputting the output horizontal synchronizing signals based on the control signals output from the controller. Accordingly, image scaling processing can be performed properly at arbitrary conversion ratios.

92 Claims, 32 Drawing Sheets

Fig. 11
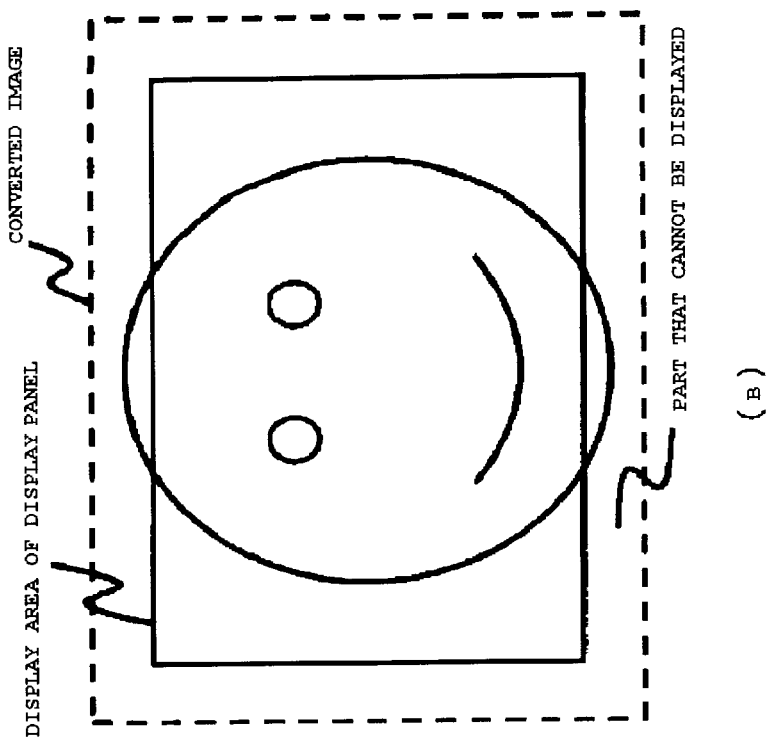
(B)
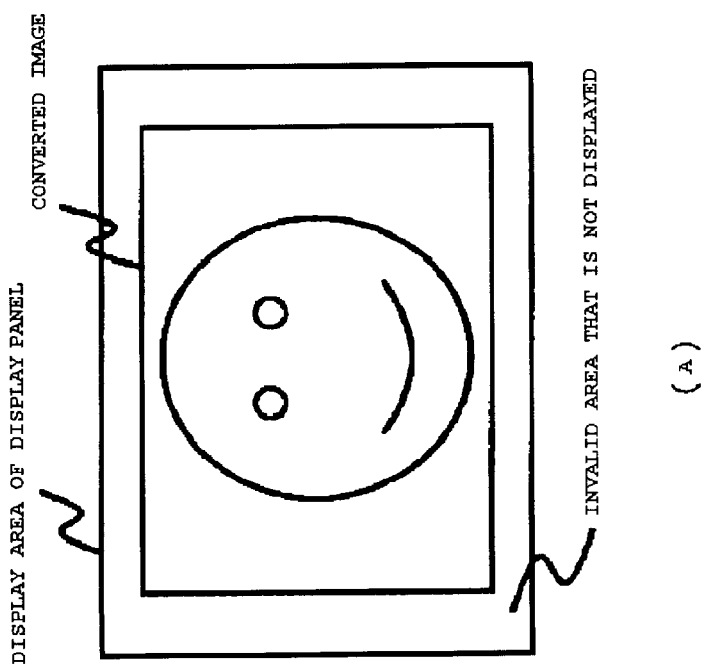
(A)

Fig. 15

| HORIZONTAL CONVERSION RATIO Zx | VERTICAL CONVERSION RATIO Zy | OPERATION MODE OF FIRST SIGNAL PROCESSING CIRCUIT | OPERATION MODE OF SECOND SIGNAL PROCESSING CIRCUIT |
|---|---|---|---|
| Zx ≧ 1 (ENLARGE) | Zy ≧ 1 (ENLARGE) | THROUGH | HORIZONTAL ENLARGEMENT, VERTICAL ENLARGEMENT |
| Zx ≧ 1 (ENLARGE) | Zy < 1 (REDUCE) | THROUGH | HORIZONTAL ENLARGEMENT, VERTICAL REDUCTION |
| Zx < 1 (REDUCE) | Zy ≧ 1 (ENLARGE) | HORIZONTAL REDUCTION | VERTICAL ENLARGEMENT, (HORIZONTAL THROUGH) |
| Zx < 1 (REDUCE) | Zy < 1 (REDUCE) | HORIZONTAL REDUCTION | VERTICAL REDUCTION, (HORIZONTAL THROUGH) |

Fig. 24

| ADDRESS | DATA HPW |
|---|---|
| 0 | N |
| 1 | N |
| 2 | N |
| 3 | N+1 |
| 4 | N |
| 5 | N |
| 6 | N+1 |
| 7 | N |
| 8 | N |
| ⋮ | ⋮ |

Fig. 27

| ADDRESS | DATA F |
|---|---|
| 0 | 0 |
| 1 | 0 |
| 2 | 0 |
| 3 | 1 |
| 4 | 0 |
| 5 | 0 |
| 6 | 1 |
| 7 | 0 |
| 8 | 0 |
| ⋮ | ⋮ |

| ADDRESS | DATA b3 | DATA b2 | DATA b1 | DATA b0 |
|---|---|---|---|---|
| 0 | 1 | 0 | 0 | 0 |
| 1 | 0 | 1 | 0 | 0 |
| 2 | 0 | 0 | 1 | 0 |
| 3 | 0 | 0 | 1 | 0 |
| ⋮ | ⋮ | ⋮ | ⋮ | ⋮ |

(a)

(b)

| LINE COUNT RESULTS | CTU | CTL |
|---|---|---|
| 0 | 0 | 0 |
| 1 | 0 | 1 |
| 2 | 0 | 2 |
| 3 | 0 | 3 |
| 4 | 1 | 0 |
| 5 | 1 | 1 |
| 6 | 1 | 2 |
| 7 | 1 | 3 |
| 8 | 2 | 0 |
| 9 | 2 | 1 |
| 10 | 2 | 2 |
| 11 | 2 | 3 |
| ⋮ | ⋮ | ⋮ |

(c)

IMAGE DISPLAY DEVICE AND IMAGE DISPLAY METHOD

BACKGROUND OF THE INVENTION

1. Field of the Invention

The present invention relates to an image display device comprising a matrix display device such as an LCD (liquid crystal display), PDP (plasma display panel), or DMD (digital micro-mirror device) and to an image display method, and more particularly relates to an art for enlarging and reducing images for displaying image signals on a display device having a higher or lower number of pixels.

2. Description of the Related Art

First, description will be made regarding image scaling processing as an example of image enlarging processing, following which description will be made of memory control accompanying processing in the vertical direction.

Here, an x-y orthogonal coordinates system will be used to describe the relation between the original image and the image following the enlarging processing (post-conversion image) with the x coordinates in the horizontal direction and the y coordinates in the vertical direction. The original image is sampled in the horizontal direction and vertical direction, and is made up of image data which is m pixels in the horizontal direction and k pixels in the vertical direction.

Let us consider a case of taking the image data made up of the m×k pixels and enlarging the data into image data made up of M×K pixels, M pixels in the horizontal direction and K pixels in the vertical direction.

FIG. 1 is a diagram schematically illustrating the relation between the original image and the image following enlarging conversion (post-conversion image). In the enlarged example of this image, the original image made up of m×k pixels is converted into an image made up of M×K pixels. In the drawings, the white dots indicate pixel data of the original image. The solid dots in the post-conversion image indicate image area in the post-conversion image provided based on the white dot pixel data in the original image. In this case, the ratio of enlargement in the horizontal direction is M/m, and the ratio of enlargement in the vertical direction is K/k.

In order to study the relation between the pixels of the original image and the pixels of the post-conversion image, reverse mapping will be performed wherein the coordinates of the post-conversion image are correlated to the coordinates of the original image. FIG. 2 is an example of reverse mapping of the pixel D in the post-conversion image to the coordinates in the original image.

In this figure, the white dots indicate pixels in the original image, and the solid dots indicate pixels in the post-conversion image which has been reverse-mapped. For the sake of simplicity, let us say that the pixels of the original image are adjacent by a distance of 1 in the horizontal direction and the vertical direction, with the pixel data being represented by the format of d(x, y). Here, x and y are integers.

In this example, an interpolating pixel D of the post-conversion image is reverse-mapped to coordinates wherein an area consisting of the four surrounding points of d(x, y), d(x+1, y), d(x, y+1), and d(x+1, y+1), is divided by the ratio of p:1−p in the horizontal direction and q:1−q in the vertical direction, wherein $0 \leq p < 1$ and $0 \leq q < 1$ hold. In this case, the coordinates of the reverse-mapped interpolating pixel D are expressed as (x+p, y+q).

In the event of a linear interpolating filter for example, the above p and q, and the four surrounding points of d(x, y), d(x+1, y), d(x, y+1), and d(x+1, y+1) around the interpolating pixel D yield the pixel data of the interpolating pixel D by calculation expressed as the following Mathematical Expression 1.

$$D=(1-p)\cdot(1-q)\cdot d(x, y)+p\cdot(1-q)\cdot d(x+1, y)+(1-p)\cdot q\cdot d(x, y+1)+p\cdot q\cdot d(x+1, y+1) \quad \text{[Mathematical Expression 1]}$$

Now, description will be made regarding the scaling processing of the image in the vertical direction. Here, we will study an example of enlarging processing in the vertical direction for converting five lines into eight lines, as an example for description.

FIG. 3 is a diagram illustrating the manner in which coordinates in the post-conversion image are correlated to coordinates in the original image, with regard to the vertical direction. In the figure, the white dots and d represent image data of the original image, and d(0) represents image data on the line 0 in the original image.

Pixels d(0), d(1), d(2), and so forth of the original image are adjacent by a distance of 1. Also, the solid dots and D represent image data of the post-conversion image. D(0) represents image data in line No. 0 in the post-conversion image.

In the items shown in this figure, the five lines of the original image and the eight lines of the post-conversion image correlated, so the image data D of the post-conversion image naturally has spacing of ⅝=0.625 as compared to that of the image data of the original image. Representing the position of the image data of the post-conversion image by coordinates of the original image expresses D(0) as being 0.0, D(1) as 0.625, and D(2) as 0.625×2=1.250.

Now, looking more closely at the image data D(2) of the post-conversion image, the coordinate thereof is 1.250, at a position dividing the coordinate of the line data d(1) and d(2) of the original image by a ratio of 0.25 to 0.75. That is to say, in the event of using linear interpolation, for example, the image data D(2) of the post-conversion image can be obtained by D(2)=0.75×d(1)+0.25×d(2), from the image data d(1) and d(2) of the original image.

The line data D(0) and D(1) of the post-conversion image are calculated from the image data d(0) and d(1) of the original image. Also, D(2) and D(3) are calculated from d(1) and d(2). In the same way, D(4) is calculated from d(2) and d(3), and D(5) and D(6) are calculated from d(3) and d(4).

In the event that such a correlating relation between the line data of the original image and the line data of the post-conversion image are satisfied, scaling processing of the image is carried out normally. Incidentally, in the event of performing computation by image data on multiple lines as described above, a method is used wherein multiple lines of image data are read out using memory provided within the device.

FIG. 4 is a timing chart showing a case of performing image scaling processing in the vertical direction using line memory for three lines. This example also involves enlarging processing for converting five pixels into eight pixels, for the sake of explanation.

In the figure, the symbol (a) represents horizontal synchronizing signals of the input image signals, and (b) represents image data of the input image signals (i.e., original image data). The symbols (c), (d), and (e) represent write addresses and read addresses in the three lines of memory (wherein time passes in the direction of traveling right in the figure, and the address values of each increase with the passage of time).

The symbol (f) represents horizontal synchronizing signals of the output image signals. Now, let us say that the output image signals are image signals containing post-conversion image data. The symbols (g), (h), and (k) represent image data read out from the line memory.

In (a), Th represents the cycle of the horizontal synchronizing signals in the input image signals, and y, y+1, y+2, and so forth represent line position in the input image signals. In (b), d(y), d(y+1), d(y+2), and so forth represent image data corresponding to the line positions y, y+1, y+2, and so forth.

In (c), (d), and (e), the vertical axis represents addresses, with the dotted lines representing write addresses and the solid lines representing read addresses. In (f), Tid represents the cycle of the horizontal synchronizing signals in the output image signals, and Y, Y+1, Y+2, and so forth represent line position in the image signals of the post-conversion image.

The symbols (g), (h), and (k) represent image data read out from the line memory, each being output data of the operation of reading out the line memory of (c), (d), and (e).

The symbol (m) represents the results of performing interpolation filter processing to the image data read out from the line memory, i.e., image data of the post-conversion image. D(Y), D(Y+1), D(Y+2), and so forth represent image data corresponding to the line positions Y, Y+1, Y+2, and so forth.

The line memory writing operation is performed based on the horizontal synchronizing signal (a) of the input image signals. The image data d(y) of the line y is written to the line memory (e). At the point that the horizontal synchronizing signal from line y+1 is input, the line memory which is the object of writing thereof is switched from (e) to (c), and the image data d(y+1) is written to the line memory (c).

In the same way, the image data d(y+2) of the line y+2 is written to the line memory (d), and the image data d(y+3) of the line y+3 is written to the line memory (e). Subsequently, the writing operation of the image data d is performed while cyclically switching the line memory for each line.

In the figure, at the stage of the image data d(y) being written to the line memory (e), the image data d(y−2) is stored to the line memory (c), and the image data d(y−1) is stored to the line memory (d).

The read-out operation of the line memory is performed with the horizontal synchronizing signal (f) of the output image signals as the reference thereof, and operates such that the correlating relation between the original image data and the post-conversion image data is satisfied, as shown in FIG. 3. That is, at line Y, image data d(y−2) and d(y−1) are read out of the line memory (c) and (d) respectively, and output as shown by (g) and (h).

The image data (g) and (h) that have been read out are subjected to interpolation filter processing, thereby generating the image data D(Y) of the line Y in the post-conversion image. Looking more closely at the line memory that is read out, the reading out operation is performed from line memory (c) and (d) for line Y+1, from line memory (d) and (e) for line Y+2, from line memory (d) and (e) for line Y+3, from line memory (e) and (c) for line Y+4, from line memory (c) and (d) for line Y+5, from line memory (c) and (d) for line Y+6, and from line memory (d) and (e) for line Y+7.

Looking more closely at the image data read out, image data d(y−2) and d(y−1) is the image data read out at line Y+1, d(y−1) and d(y) at line Y+2, d(y−1) and d(y) at line Y+3, d(y) and d(y+1) at line Y+4, d(y+1) and d(y+2) at line Y+5, d(y+1) and d(y+2) at line Y+6, and d(y+2) and d(y+3) at line Y+7.

In order to perform the writing operation and reading operation of line memory, there is the need for the horizontal synchronizing signals (f) of the output image signals to occur at an appropriate cycle Tid. For example, in order to perform enlarging processing wherein five lines are converted into eight lines as described above, there is the need for the five lines of the input image signals and the eight lines of the output image signals to correlate.

That is to say, ideally, there needs to be a correlating relation of 5×Th=8×Tid between the horizontal synchronizing signal cycle Th in the input image signal and horizontal synchronizing signal cycle Tid in the output image signal. Hence, the ideal horizontal cycle of the output image signals can be obtained by Tid=Th×⅝.

Now, let us consider a case wherein the cycle of the horizontal synchronizing signal (f) of the output image signals is shorter than the ideal horizontal cycle Tid.

FIG. 5 is a timing chart showing a case wherein the cycle of the horizontal synchronizing signal (f) of the output image signals is Tid−α. For the sake of comparison, the timing of horizontal synchronizing signals of the ideal horizontal cycle Tid is shown above (f).

At the leading end of the line Y+1 of the output image signals, the leading end of the line is in a state of being shifted forwards timewise by an amount of α (i.e., a margin of error α has occurred as compared to the ideal horizontal synchronizing signal timing). Next, the margin of error α also occurs at the following line Y+2 as well, so the margin of error thus is 2α at the leading end of the line Y+2 of the output image signals. In the same way, the margin of error is 3α at the leading end of the line Y+3, and the margin of error α continues to accumulate for each subsequent line.

On the other hand, the horizontal synchronizing signal cycle Th on the input image signals remains the same. The timing of the writing operation of the line memory does not change, so the correlating relation between the line memory writing operation and the reading operation shifts away by an amount of α for each line of the output image signals.

Now, let us look more closely at the line Y+8 of the output image signals. A solid slanted line indicating the reading address of the line memory (c) and a dotted slanted line indicating the write address intersect at the time t1. The accumulated margin of error at this point is 8·α.

In the line Y+8 of the output image signals, the image data read out from the line memory (c) is d(y+4) written at line y+4 of the input image signals before the time t1, but is d(y+1) written at line y+1 of the input image signals after the time t1 (i.e., the hatched portion of (g)).

In other words, after the time t1, image data three lines before the intended line is read out instead of the image data intended to be read out. Image data D(Y+8) which is the read out image data (k) and (g) which have been subjected to interpolation processing is abnormal data after the time t1 (i.e., the hatched portion of (m)). Thus, in such a case, the processing of scaling the image becomes impossible.

Note that hereafter, the phenomena of image data which should be read out being rendered unreadable due to the correlating relation between the writing operation and reading operation of the line memory shifting, will be referred to as "overtaking" on the line memory.

FIG. 6 is a diagram zooming in on the line memory (c) near the line y+4 of the input image signal in FIG. 5 and the read data (g) nearby. In FIG. 6, the upper part of the drawing shows a timing chart in a case wherein the cycle of the horizontal synchronizing signal (f) of the output image signals is Tid (i.e., ideal cycle), and the lower part shows a timing chart in a case wherein the cycle of (f) is Tid−α.

The notation WA(y+4) represents the write address on the line memory at line y+4 of the image input signal. Now, RA(Y+6) RA(Y+8) represent the read address on the line memory at line Y+6 and line Y+8 at the upper part (ideal cycle). Also, RA'(Y+8) represents the read address on the line memory at line Y+8 at the lower part (horizontal cycle Tid−α).

As described above, RA'(Y+8) at the lower part has shifted forwards by an amount of time 8α as to RA(Y+8) at the upper part, and at the lower part the hatched portion of RA'(Y+8) and WA(y+4) intersect at the time t1. After time t1, the read out data (g) of the line memory (c) is not the image data d(y+4) which was intended to be read out, but rather the image data d(y+1) from three lines back.

At the upper part, the hatched portion of WA(y+4) and RA(Y+8) do not intersect and an interval (timing margin) of the time Tm1 exists at the timing of accessing the final address of each.

On the other hand, RA'(Y+8) at the lower part has shifted forwards by an amount of time 8α as to RA(Y+8) at the upper part, in the event that the accumulated margin of error 8α≧Tm1 as shown in the figure, the intended image data cannot be read. In order to correctly read the image data from the line memory, the accumulated margin of error for every lines of output image signals must always be smaller than Tm1.

That is to say, with the timing margin at line Y+Q as Tm(Q), image scaling processing will be impossible unless the accumulated margin of error Qα for Q lines satisfies the relation of Qα<Tm(Q).

Next, let us consider a case wherein the cycle of the horizontal synchronizing signal (f) of the output image signals is longer than the ideal horizontal cycle Tid.

FIG. 7 is a timing chart showing a case wherein the cycle of the horizontal synchronizing signal (f) of the output image signals is Tid+α. For the sake of comparison, the timing of horizontal synchronizing signals of the ideal horizontal cycle Tid is shown above (f).

At the leading end of the line Y+1 of the output image signals, a margin of error α occurs at the leading end of the line Y+1 of the output image signals, as compared to the ideal horizontal synchronizing signal timing, and the leading end of the line is in a state of being shifted backwards timewise by an amount of α. Next, the margin of error α also occurs at the following line Y+2 as well, so the margin of error thus is 2α at the leading end of the line Y+2 of the output image signals. In the same way, the margin of error is 3α at the line Y+3, and the margin of error α continues to accumulate for each subsequent line.

In this case also, the horizontal synchronizing signal cycle Th of the input image signals remains the same. The timing of the writing operation of the line memory does not change, so the correlating relation between the line memory writing operation and the reading operation shifts away by an amount of α for each line of the output image signals.

Now, looking more closely at the line Y+6 of the output image signals, the accumulated margin of error is 6α, and a solid slanted line indicating the reading address of the line memory (c) and a dotted slanted line indicating the write address intersect at the time t2.

In the line Y+6 of the image signals, the image data read out from the line memory (c) is d(y+4) written at line y+4 of the input image signals before the time t2 (i.e., the hatched portion of (g)), but is d(y+1) written at line y+1 of the input image signals after the time t2.

In other words, before the time t2, image data three lines after the intended line is read out instead of the image data intended to be read out. Image data D(Y+6) which is the read out image data (g) and (h) which have been subjected to interpolation processing is abnormal data before the time t2 (i.e., the hatched portion of (m)). Thus, in such a case as well, the processing of scaling the image becomes impossible.

FIG. 8 is a diagram zooming in on the line memory (c) near the line y+4 of the input image signal in FIG. 7 and the read data (g). In FIG. 8, the upper part of the drawing shows a timing chart in a case wherein the cycle of the horizontal synchronizing signal (f) of the output image signals is Tid (i.e., ideal cycle), and the lower part shows a timing chart in a case wherein the cycle of (f) is Tid+α.

The notation WA(y+4) represents the write address on the line memory at line y+4 of the image input signal. RA(Y+6) and RA(Y+8) represent the read address on the line memory at line Y+6 and line Y+8 at the upper part (ideal cycle).

Also, RA'(Y+6) and RA'(Y+8) represent the read address on the line memory at line Y+6 and line Y+8 in the event that the horizontal synchronizing signal cycle of the output image signals is Tid+α.

As described above, RA'(Y+6) at the lower part has shifted by an backwards amount of time 6α as to RA(Y+6) at the upper part, and at the lower part the hatched portion of RA'(Y+6) and WA(y+4) intersect at the time t2. After time t2, the read out data (g) of the line memory (c) is not the image data d(y+1) which was intended to be read out, but rather the image data d(y+4) from three lines later.

At the upper part, the hatched portion of WA(y+4) and RA(Y+6) do not intersect and an interval (timing margin) of the time Tm2 exists at the timing of accessing the leading end address of each.

On the other hand, RA'(Y+6) at the lower part has shifted back by an amount of time 6α as to RA(Y+6) at the upper part, and in the event that the accumulated margin of error 6α≧Tm2 as shown in the figure, the intended image data cannot be read. In order to correctly read the image data from the line memory, the accumulated margin of error per line of output image signals must always be smaller than Tm2.

Here as well, with the timing margin at line Y+Q as Tm(Q), image scaling processing will be impossible unless the accumulated margin of error Qα for Q lines satisfies the relation of Qα<Tm(Q).

From the above, it can be understood that in the event that the cycle of the horizontal synchronizing signal of the output image signals is longer than the ideal cycle Tid by an a amount of time, or in the event that the cycle is shorter than the ideal cycle Tid by an a amount of time, image scaling processing is impossible unless the accumulated margin of error Qα for Q lines of output image signals and the timing margin Tm(Q) at that line position satisfy the relation of Qα<Tm.

FIG. 9 is a diagram illustrating a conventional image display device disclosed in Japanese Unexamined Patent Application Publication No. 11-38955, for example. In the figure, reference numeral 101 denotes a PLL (Phase Locked Loop) circuit, 102 denotes an A/D converter, 103 denotes an oscillator, 104 denotes a read-start pulse generating circuit, 105 and 106 denote line memory, 107 denotes a scan converter, 108 denotes a D/A converter, 109 denotes a display unit, and 110 denotes a reset signal generating circuit.

Next, the operation thereof will be described. The PLL circuit 101 generates a write clock WCK synchronously with the horizontal synchronizing signal HSYNC obtained separated from the picture signals, and supplies this to the A/D converter 102 and the line memory 105 and 106.

The A/D converter 102 digitizes the input picture signals according to a predetermined sampling interval based on the write clock WCK from the PLL circuit 101, and supplies the picture data to the line memory 105 and the scan converter 107. The oscillator 103 generates read clocks RCK of a predetermined frequency, and supplies these to the read-start pulse generating circuit 104.

The reset signal generating circuit 110 generates a reset signal HRST each time five horizontal synchronizing signals HSYNC are counted, and supplies these to the read-start pulse generating circuit 104. The read-start pulse generating circuit 104 is reset each time reset signals HRST are supplied thereto, and generates read start pulses RDST and display start pulses HST each time the read clock RCK counts a predetermined number of counts.

The read start pulses RDST are supplied to the line memory 105 and 106, and the scan converter 107 and D/A converter 108. The display start pulses HST are supplied to the display unit 109.

FIG. 10 is a diagram illustrating the operation of the reset signal generating circuit 110 and the read-start pulse generating circuit 104. Here, the example of converting five lines into eight lines is used as an example. In the figure, a reset signal HRST is generated each time five horizontal synchronizing signals HSYNC are counted.

A count value for the read clock RCK is set to the read-start pulse generating circuit 104, so as to allow generating of eight read start pulses RDST during the period of five horizontal synchronizing signals HSYNC.

Picture data is written to the line memory 105 in a manner synchronous with the write clock WCK from the PLL circuit 101, and data is read out in a manner synchronous to the read clock RCK from the oscillator 103 and the read start pulse RDST from the read-start pulse generating circuit 104, and the read out picture data is supplied to the line memory 106 and the scan converter 107.

Picture data written to the line memory 105 is written to the line memory 106 synchronously with the write clock WCK, picture data is read out in a manner synchronous with the read clock RCK and read start pulse RDST, and the read picture data is supplied to the scan converter 107.

The scan converter 107 performs predetermined interpolation processing to the picture data read from the line memory 105 and 106 respectively, and the picture data subjected to the interpolation processing is supplied to the display unit 109 via the D/A converter 108.

The display unit 109 is driven by the picture signals from the D/A converter 108 and the display start pulses HST from the read-start pulse generating circuit 104, and thus can display an enlarged picture.

Conventional image display devices and image processing devices have had the following problems, due to the above configuration.

As shown in FIG. 10, a count value is set for the read clock RCK at the read-start pulse generating circuit 104 so that eight read start pulses RDST can be generated during the period of five horizontal synchronizing signals HSYNC being input. The cycle of the read start pulse RDST ideally is ⅝ of the cycle of the horizontal synchronizing signal HSYNC.

Now, with the cycle of the read clock RCK as Tr, the ideal RDST cycle which is ⅝ of the horizontal synchronizing signal HSYNC cycle is not normally an integer multiple of the read clock cycle Tr, since the horizontal synchronizing signal HSYNC and the read clock RCK are asynchronous.

Here, an ideal read start pulse cycle can be expressed as $(N+\alpha) \cdot Tr$, wherein N represents an integer and $\alpha$ represents a decimal numeral, i.e., $0 \leq \alpha 1$. These N and $\alpha$ represent cycle information, and in the following description, the integer N may be referred to as "First cycle information", and $\alpha$ as "Second cycle information".

However, the read start pulse RDST is generated by the read clock RCK, and accordingly the cycle of the read start pulse RDST can only be provided in integer multiples of the read clock RCK cycle Tr.

With the count value of the read clock RCK for generating the read start pulses RDST as N, the cycle of the read start pulse RDST for seven lines following the reset signal HRST is $N \cdot Tr$, and is shorter than the ideal RDST cycle $(N+\alpha) \cdot Tr$ by $\alpha \cdot Tr$.

Accordingly, the read start pulse RDST shifts away from the ideal RDST cycle by a margin of error of $\alpha \cdot Tr$ by each line. That is, seven lines worth of margin of error are accumulated after seven lines following the reset signal HRST, so an accumulated margin of error of $7 \cdot \alpha \cdot Tr$ occurs at the leading end of the eighth line following the HRST.

Then, the next reset signal HRST resets the timing of generating read start pulses RDST at the read-start pulse generating circuit 104. Accordingly, the accumulated margin of error of $7 \cdot \alpha \cdot Tr$ is corrected here at the time of resetting. Or, conversely, it can be said that the accumulated margin of error will continue to increase until the generation timing of the read start pulses is corrected by the reset signal HRST.

As already described with reference to FIGS. 6 and 8, in the event that the reading operation shifts off of the line memory writing operation by a timing margin of Tm(Q) or more, proper scaling processing of the image becomes impossible.

With the example shown in FIG. 10, image scaling processing can be correctly performed in the event that the accumulated margin of error of $7 \cdot \alpha \cdot Tr$ of the generation timing of the read start pulse RDST is less than the time margin Tm, i.e., in the event that $7 \cdot \alpha \cdot Tr < Tm$ holds. However, in the event that $7 \cdot \alpha \cdot Tr \geq Tm$ holds, proper scaling processing of the image is impossible.

In the event of converting a 480-line image into a 768-line image, the conversion ratio is 480:768, which translates into 5:8, so this processing is an operation of repeatedly converting five lines into eight lines. That is to say, the maximum accumulated margin of error is $7 \cdot \alpha \cdot Tr$.

However, considering a case of converting a 480-line image into a 767-line image, the conversion ratio of 480:768 cannot be expressed in smaller integers, so the read-start pulse generating circuit 104 operates so as to generate 767 read start pulses RDST in a period of 480 horizontal synchronizing signals HSYNC.

The read-start pulse generating circuit 104 must generate 767 lines of read start pulses before the correction of the timing of generating the read start pulses RDST. In this case, the accumulated margin of error has a maximal value of $766 \cdot \alpha \cdot Tr$. Depending on the value of $\alpha$, $766 \cdot \alpha \cdot Tr$ will exceed the timing margin Tm(Q), and proper scaling processing of the image will become impossible.

Comparing the maximum accumulated margin of error of the conversion ratio of 5:8 with that of the conversion ratio of 480:767, the latter is more than 100 times the former, so the probability of the latter exceeding the timing margin Tm(Q) is great. That is, there are scaling ratios which allow image scaling processing, and scaling ratios which do not.

Accordingly, conventional image display devices have hand the problem that image scaling processing could not be performed at arbitrary conversion ratios using a clock which is asynchronous with input image signals.

FIGS. 11A and 11B are diagrams illustrating an example of image display with a conventional image display device.

With the conventional image display device, the conversion ratio (conversion ratio) cannot be arbitrarily set, so only conversion images smaller or greater than the display area size of the display panel can be generated.

FIG. 11A is a display example wherein the conversion image size is smaller than the display area. Here, an invalid area (a) wherein no image is displayed occurs on the display area. FIG. 11B is a display example wherein the conversion image size is larger than the display area. Here, here is the problem that there is an area (b) wherein the conversion image cannot be displayed.

SUMMARY OF THE INVENTION

The present invention has been made to solve the above problems, and accordingly, it is an object thereof to provide an image display device and an image processing method enabling proper scaling processing of images at arbitrary conversion ratios.

Primarily, input picture signals are sampled and accumulated based on a first clock generated from horizontal synchronizing signals of the input picture signals, and at the time of reading out accumulated image data based on a second clock, reading control is performed according to information relating to the input image signals.

Thus, image scaling processing can be properly carried out at arbitrary conversion ratios.

BRIEF DESCRIPTION OF THE DRAWINGS

FIGS. 11A and 11B are explanatory diagrams illustrating a display example of a conventional image display device;

FIG. 15 is an explanatory diagram describing the operation of the controller according to the first embodiment of the present invention;

FIG. 24 is an explanatory diagram illustrating LUT table data according to the third embodiment of the present invention;

FIG. 27 is an explanatory diagram illustrating LUT table data according to the fourth embodiment of the present invention;

DETAILED DESCRIPTION OF THE PREFERRED EMBODIMENTS

First Embodiment

Figure 12:
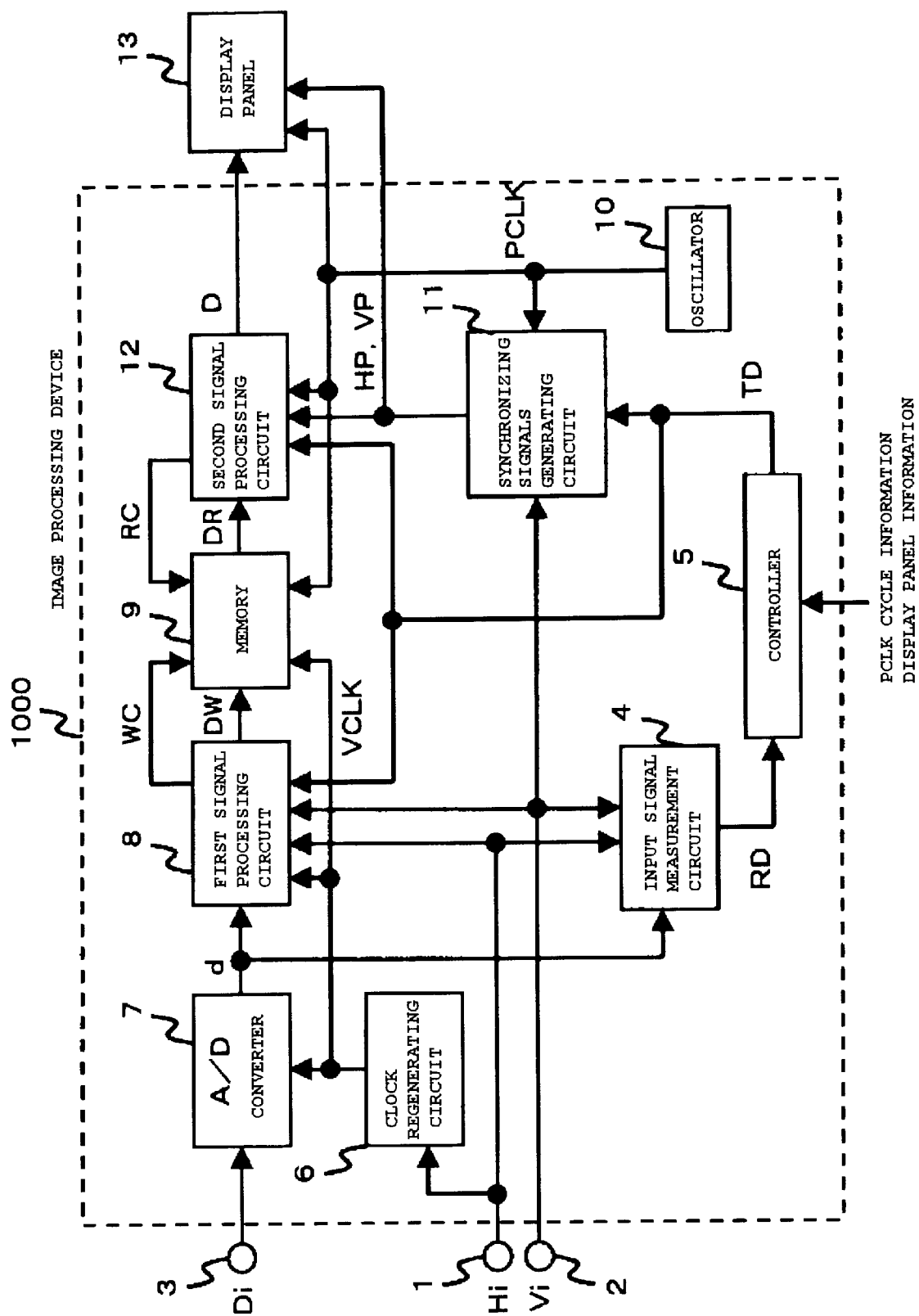
FIG. 12 is a block diagram illustrating the configuration of an image display device and an image processing device according to a first embodiment of the present invention.

FIG. 12 is a diagram illustrating an image display device and an image processing device according to the first embodiment of the present invention. In the figure, reference numerals 1, 2 and 3 denote terminals, 4 denotes an input signal measuring circuit, 5 denotes a controller, 6 denotes a clock regenerating circuit, 7 denotes an A/D converter, 8 denotes a first signal processing circuit, 9 denotes memory, 10 denotes an oscillator, 11 denotes a synchronizing signal generating circuit, 12 denotes a second signal processing circuit and 13 denotes a display panel.

The symbol Di denotes input image signals, Hi denotes input horizontal synchronizing signals, Vi denotes input vertical synchronizing signals, VCLK denotes a video clock generated by the clock regenerating circuit 6, PCLK denotes a panel clock generated by the oscillator 10, d denotes image data sampled by the A/D converter 7, DW denotes image data signals processed at the first signal processing circuit 8, WC denotes write control signals of the memory 9, RC denotes read control signals of the memory 9, DR denotes image data signals read out from the memory 9, D denotes image data processed at the second signal processing circuit 12, HP and VP denote horizontal synchronizing signals and vertical synchronizing signals generated by the synchronizing signal generating circuit 11, TD denotes control signals generated by the controller 5, and RD denotes measurement data generated by the input signal measuring circuit 4. Reference numeral 1000 denotes the image processing device. The image display device comprises the image processing device 1000 and the display panel 13.

Figure 13:
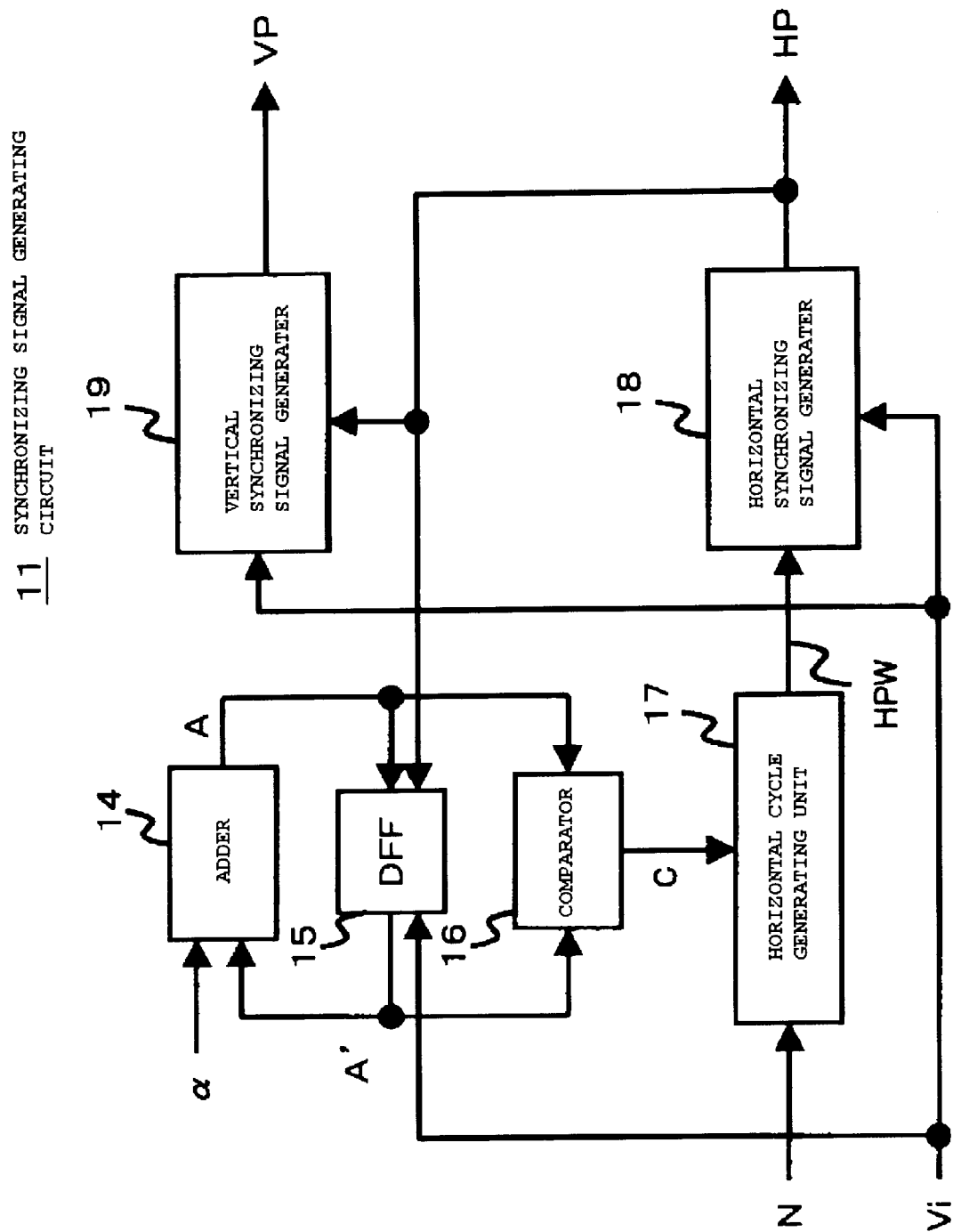
FIG. 13 is a block diagram illustrating the configuration of a synchronizing signal generating circuit according to the first embodiment of the present invention.

FIG. 13 is a diagram illustrating the configuration of the synchronizing signal generating circuit 11 according to the first embodiment of the present invention. Here, reference numeral 14 denotes an adder, 15 denotes a DFF (D flip-flop) 16 denotes a comparator, 17 denotes a horizontal cycle generator, 18 denotes a horizontal synchronizing signal generator, and 19 denotes a vertical synchronizing signal generator. Symbols N and a denotes cycle information of the horizontal synchronizing signal HP (N is an integer, wherein $0 \leq \alpha < 1$ holds. These are coefficients to be multiplied by the clock cycle, and in the following description, the integer N may be referred to as "First cycle information", and decimal $\alpha$ as "Second cycle information").

Symbol A denotes the currently-accumulated addition results output by the adder 14, A' denotes the accumulated addition results from one line back output by the DFF 15, C denotes the comparison results generated by the comparator 16, and HPW denotes the horizontal cycle count value output by the horizontal cycle generator 17.

Next, the operation will be described. Horizontal synchronizing signals Hi are input to the terminal 1. Vertical synchronizing signals Vi are input to the terminal 2. Input to terminal 3 are image signals Di comprising the three primary colors of R, G, and B, for example. The input image signals Di are synchronous with the horizontal synchronizing signals Hi and vertical synchronizing signals Vi.

The horizontal synchronizing signals Hi are input to the input signal measuring circuit 4, clock regenerating circuit 6, and the first signal processing circuit 8. The vertical synchronizing signals Vi are input to the input signal measuring circuit 4, first signal processing circuit 8, and the synchronizing signal generating circuit 11. the image signals Di are input to the A/D converter 7.

The clock regenerating circuit 6 generates a video clock VCLK of a predetermined frequency, based on the horizontal synchronizing signals Hi. The video clock VCLK generated by the clock regenerating circuit 6 is input to the A/D converter 7, first signal processing circuit 8, and memory 9.

The oscillator 10 generates a panel clock PCLK of a predetermined frequency, asynchronous to the video clock VCLK generated by the clock regenerating circuit 6. The panel clock PCLK generated by the oscillator 10 is input to the memory 9, synchronizing signal generating circuit 11, second signal processing circuit 12, and display panel 13.

At the A/D converter 7, the input image signals Di are sampled using the input video clock VCLK, thereby converting into the digital image data d. The digital image data d converted at the A/D converter 7 is input to the input signal measuring circuit 4 and the first signal processing circuit 8.

The input signal measuring circuit 4 measures a cycle of the horizontal synchronizing signals Hi, and the image size of the image signals Di from the image data d, and outputs measurement data RD. The measurement data RD output from the input signal measuring circuit 4 is input to the controller 5.

The controller 5 calculates the horizontal and vertical conversion ratios Zx and Zy, and the cycle information N and a of the output horizontal synchronizing signals HP, based on the input measurement data RD, i.e., the cycle of the horizontal synchronizing signals Hi and the image size of the input image signals Di, the size of the display panel 13 and the cycle of the panel clock PCLK generated by the oscillator 10, and outputs the calculation results as control signals TD. The output control signals TD are input to the synchronizing signal generating circuit 11, first signal processing circuit 8, and second signal processing circuit 12.

The first signal processing circuit 8 performs reduction processing in the horizontal direction to the image data d output from the A/D converter 7, based on the control signals TD output from the controller 5, and horizontal synchronizing signals Hi and vertical synchronizing signals Vi, thereby generating horizontally-reduced image data DW and write control signals WC for the memory 9. The image data DW and the write control signals WC output from the first signal processing circuit 8 are input to the memory 9.

The synchronizing signal generating circuit 11 generates horizontal synchronizing signals HP and vertical synchronizing signals VP of the output image signals, based on vertical synchronizing signals Vi, the control signals TD output from the controller 5, and the panel clock PCLK output from the oscillator 10.

The horizontal synchronizing signals HP and vertical synchronizing signals VP generated at the synchronizing signal generating circuit 11 are input to the second signal processing circuit 12 and the display panel 13.

At the memory 9, writing operation of the image data DW is performed based on the video clock VCLK and the write control signals WC, and reading operation is performed based on the panel clock PCLK and the read control signal RC, and thereby image data DR is output.

The image DR data read out from the memory 9 is input to the second signal processing circuit 12. The second signal processing circuit 12 executes either enlarging processing or reduction processing in the vertical direction and also enlarging processing in the horizontal direction, based on the control signals TD output from the controller 5.

Also, the second signal processing circuit 12 generates read control signals RC of the memory 9 based on the horizontal synchronizing signals HP and vertical synchronizing signals VP, and performs interpolation processing in the horizontal and vertical directions for the read image data DR, and thereby outputs image data D.

The image data D output from the second signal processing circuit 12 is input to the display panel 13. The display panel 13 displays the image data D output from the second signal processing circuit 12, based on the horizontal synchronizing signals HP and vertical synchronizing signals VP output from the synchronizing signal generating circuit 11.

Figure 14:
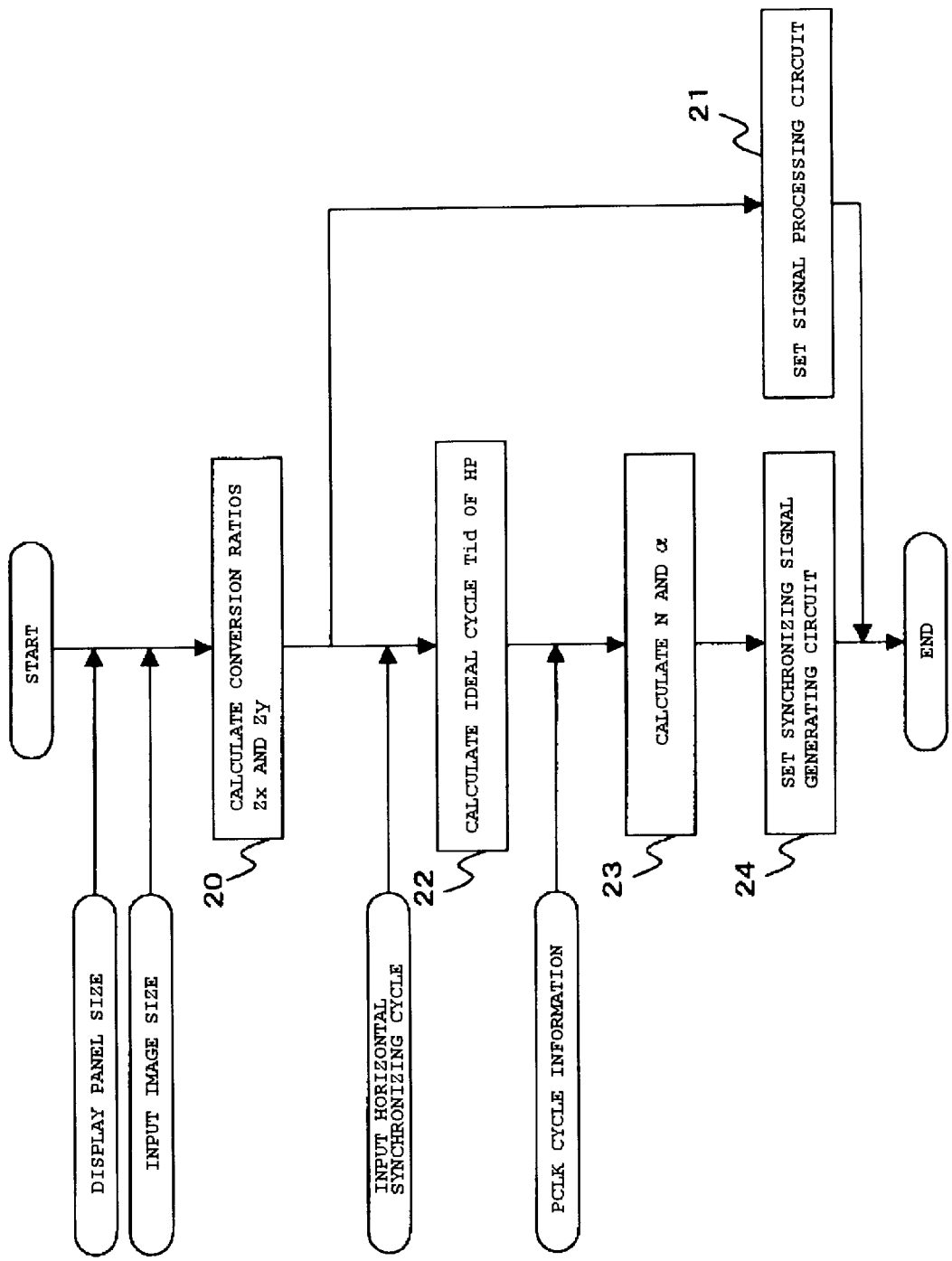
FIG. 14 is a flowchart describing the operation of the controller according to the first embodiment of the present invention.

FIG. 14 is a flowchart describing the operation of the controller 5. In Step 20, the horizontal and vertical conversion ratios Zx and Zy are calculated from the display panel size and input image size input via the measurement data RD output from the input signal measuring circuit 4.

The horizontal direction conversion ratio Zx is calculated by Zx=(width of display panel/width of input image), and the vertical direction conversion ratio zy is calculated by Zy=(height of display panel/height of input image).

In Step 21, control signals TD are output for setting the operation mode of the first signal processing circuit 8 and the second signal processing circuit 12, based on the conversion ratios Zx and Zy calculated in Step 20.

In the event that the conversion ratio (the horizontal direction conversion ratio Zx or the vertical direction conversion ratio Zy) is 1 or more, enlarging processing must be performed, and in the event that the conversion ratio is less than 1, reduction processing must be performed. Here, we will assume that a case of conversion ratio of 1 is enlarging processing of the conversion ratio of 1, and continue the description.

In Step 22, an ideal cycle Tid of the horizontal synchronizing signal HP is calculated based on the vertical direction conversion ratio Zy calculated in Step 20 and the cycle of the input horizontal synchronizing signals Hi (represented by Th). The ideal cycle in this case can be calculated by Tid=Th/Zy.

In Step 23, first, a count value in the event that the ideal cycle Tid of the horizontal synchronizing signal HP calculated in Step 22 has been counted by the panel clock PCLK, is calculated. That is to say, with the cycle of the panel clock PCLK as Tp, this count value can be obtained by Tid/Tp= (Th/Zy)/Tp.

The input horizontal synchronizing signals Hi and the panel clock PCLK are asynchronous, so this count value is not normally an integer, i.e., is indivisible. In other words, this count value has a decimal, and the integer N and decimal $\alpha$ (wherein $0 \leq \alpha < 1$) can be used to express the count value as (N+$\alpha$). N represents the integer component of Tid/Tp, and $\alpha$ represents the decimal component thereof. That is to say, Tid/Tp=N+$\alpha$. Accordingly, the ideal cycle Tid of the horizontal synchronizing signal HP can be expressed as Tid= (N+$\alpha$)·Tp.

In Step 24, the synchronizing signal generating circuit 11 is set, based on the integer N and decimal $\alpha$ which is the cycle information obtained in Step 23. Here, control signals TD are output so as to provide the cycle information N and a to the synchronizing signal generating circuit 11.

FIG. 15 is a diagram illustrating the processing of Step 21, a table illustrating the relation between the operation modes of the conversion ratios Zx, Zy, the first signal processing circuit 8, and the second signal processing circuit 12.

In the event that the horizontal direction conversion ratio Zx$\geq$1 (i.e., enlargement), a through operation (wherein the image size is not changed) is performed at the first signal processing circuit 8, and horizontal direction enlarging processing is executed at the second signal processing circuit 12. In the event that the horizontal direction conversion ratio Zx<1 (i.e., reduction), horizontal direction reduction processing is executed at the first signal processing circuit 8, and the second signal processing circuit 12 does not execute conversion processing in the horizontal direction (horizontal through).

In the event that the vertical direction conversion ratio Zy$\geq$1 (i.e., enlargement), vertical direction enlarging processing is executed at the second signal processing circuit 12. In the event that the vertical direction conversion ratio Zy<1 (i.e., reduction), vertical direction reduction processing is executed at the second signal processing circuit 12.

The present embodiment is not equipped with vertical direction reduction processing functions for the first signal processing circuit 8, for example, but does have horizontal reduction processing functions. With such a configuration, in the event of performing horizontal direction reduction processing before the memory 9, the memory 9 suffices to store image data following reduction processing in the horizontal direction, and the memory length of the memory 9 only needs the number of horizontal pixels of the display panel.

In the event of performing horizontal direction reduction processing after the memory 9, horizontal direction reduction processing can be realized by providing a memory 9 capable of storing the image data before the reduction processing (i.e., memory with a memory length (memory capacity) exceeding the number of horizontal pixels of the display panel).

Comparatively, performing the horizontal direction reduction processing before the memory 9 is more efficient, in that the memory capacity necessary and circuit scale required can be reduced, meaning the related cost and electric consumption can also be reduced.

Figure 16:
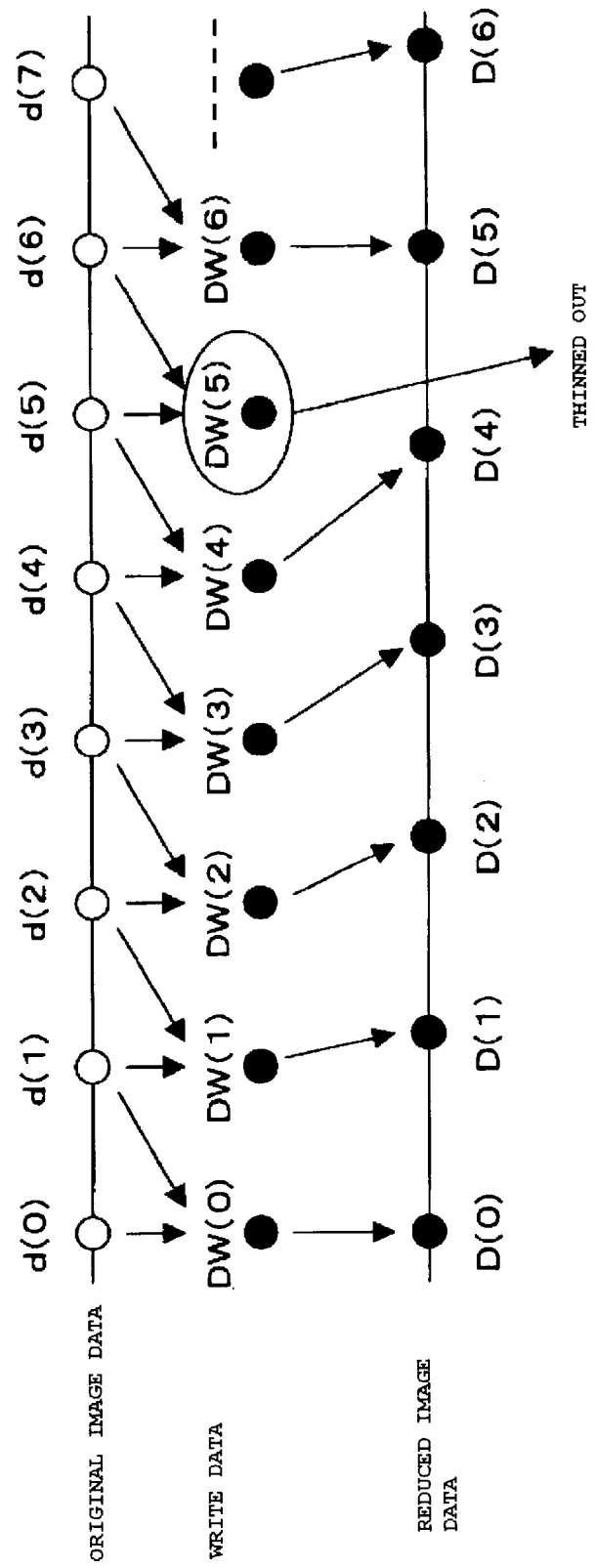
FIG. 16 is an explanatory diagram describing the operation of a first signal processing circuit according to the first embodiment of the present invention.

FIG. 16 is a diagram describing the operation of the first signal processing circuit 8. The white dots on the upper line represent original image data (input data), the solid dots at the middle represent memory writing data, and the solid dots on the bottom line represent image data following reduction processing. Here, an example of reduction conversion of six pixels to five pixels will be used for description.

As can be understood with reference to the figure, interpolation processing between the original image data d(0) and d(1) generates write data DW(0). Also, interpolation processing between d(1) and d(2) generates write data DW(1), and so on, so that DW(2) through DW(6) is generated (hereafter, DW(0), DW(1), and so forth, when collectively referred to, will be simply referred to as "DW").

Thus, the write data DW is generated based on the data rate of the original image data d, so six pixels of write data DW(0) through DW(5) are generated for the six pixels in input image data d(0) through d(5).

Of DW(0) through DW(5), the five pixels of DW(0) through DW(4) are image data effective to become reduction image data, but DW(5) is handled as invalid data unnecessary for the post-reduction image. There is the need to thin out invalid data such as DW(5) for the reduction conversion processing of the image.

The processing of thinning out can be realized by generating a write control signal so that invalid data such as DW(5) is not written to the memory 9. Or, the above thinning out processing can be realized by generating a write control signal WC so as to overwrite the subsequent valid data such as DW(6) over the invalid data such as DW(5) once written to the memory.

Thus, the first signal processing circuit 8 generates write control signals WC, and performs interpolation processing and thinning out processing for the image data d, thereby generating write data DW.

Figure 17:
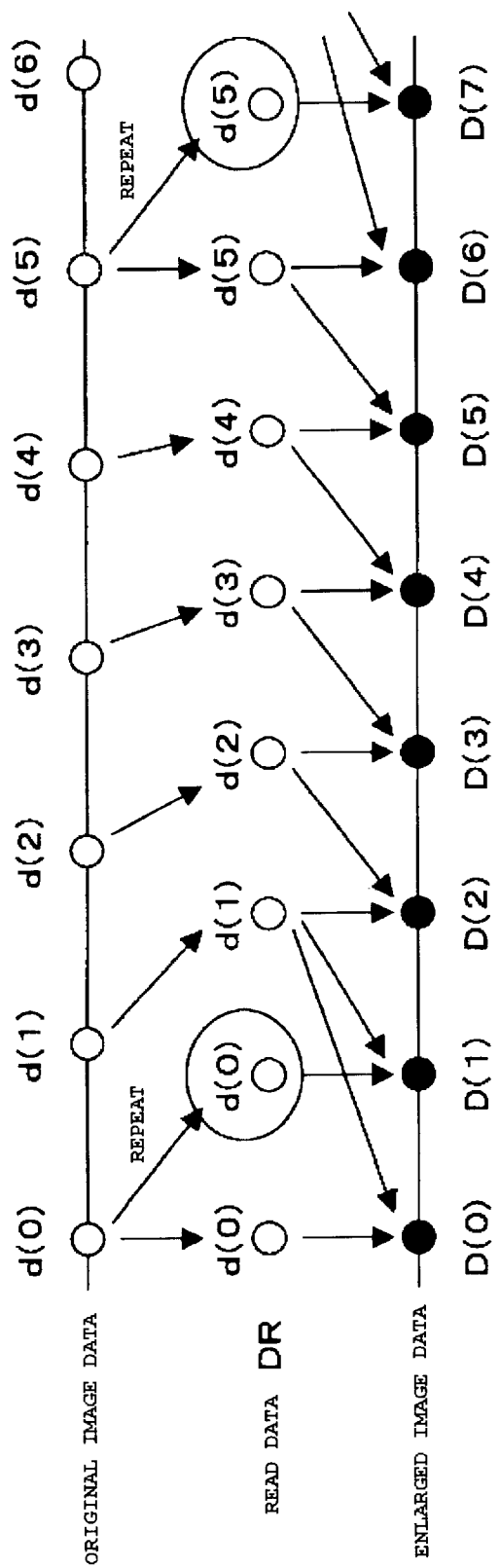
FIG. 17 is an explanatory diagram describing the operation of a second signal processing circuit according to the first embodiment of the present invention.

FIG. 17 is a diagram describing the operation of the second signal processing circuit 12. The white dots on the upper line represent original image data (input data), the white dots at the middle represent memory reading data, and the solid dots on the bottom line represent image data following enlarging processing. Here, an example of enlarging conversion of five pixels to six pixels will be used for description.

The reading operation from the memory 9 is performed based on the data rate of the image data following enlargement. In the event of converting five pixels into six pixels as with the present embodiment, memory reading is performed six times to the five pixels of original image data d(0)

through d(4), so there is the need for the same image data to be read out over again one of the six times as with d(0) in the read data DR. To this end, read control signals RC should be generated so as to read out the same memory address repeatedly.

The original image data d is read out as read data DR, and interpolation between d(0) and d(1) generates enlarged image data D(0) and D(1). Also, interpolation is performed between d(1) and d(2) which generates D(2). Also, interpolation is performed between d(2) and d(3) which generates D(3), and in the same way D(4) and D(5) are subsequently generated. Thus, the second signal processing circuit 12 performs enlarging processing in the horizontal direction of the image, for the image data d.

Figure 1:
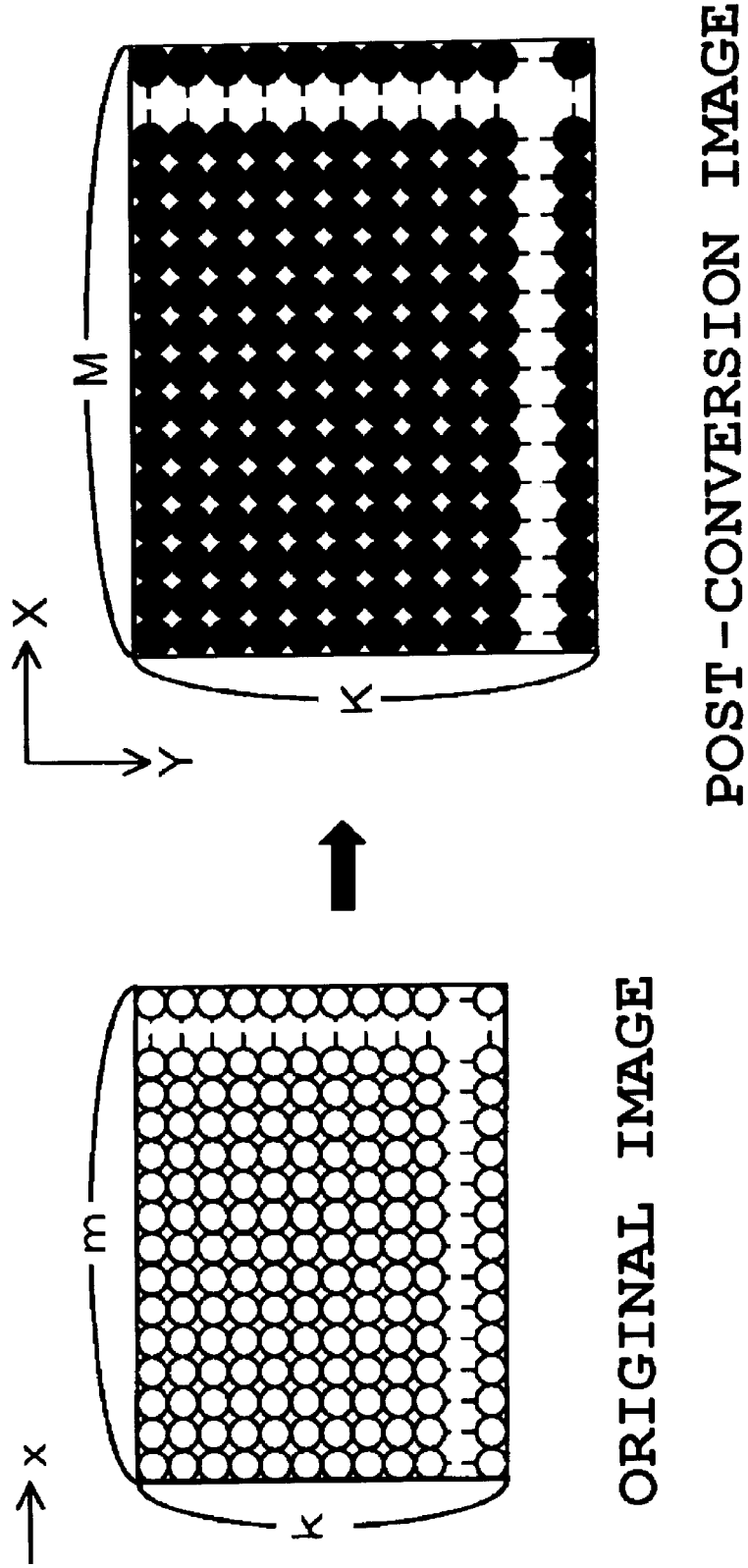
FIG. 1 is an explanatory diagram schematically illustrating the relation between an original image and a post-conversion image.
Figure 2:
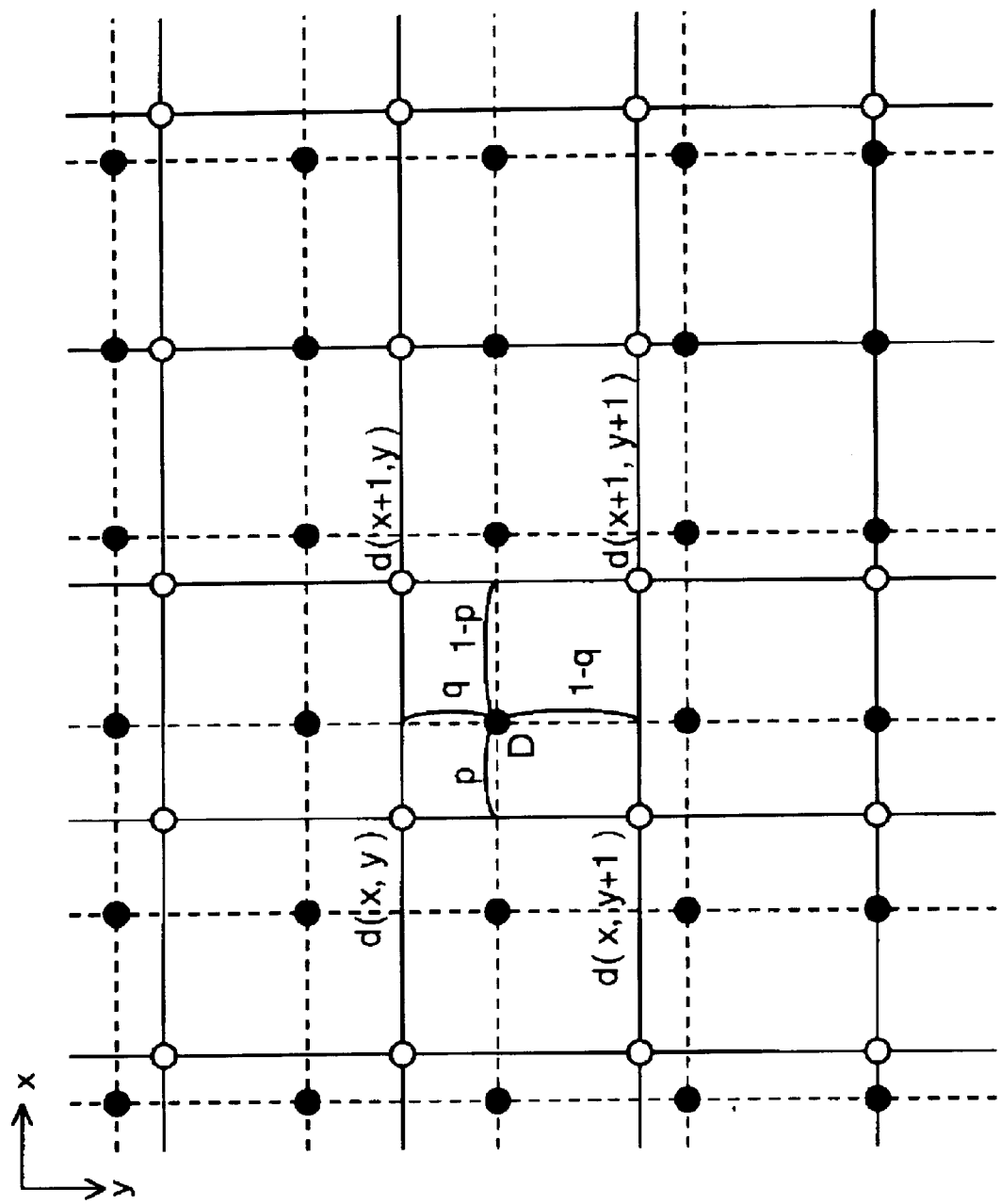
FIG. 2 is an explanatory diagram describing reverse mapping.
Figure 3:
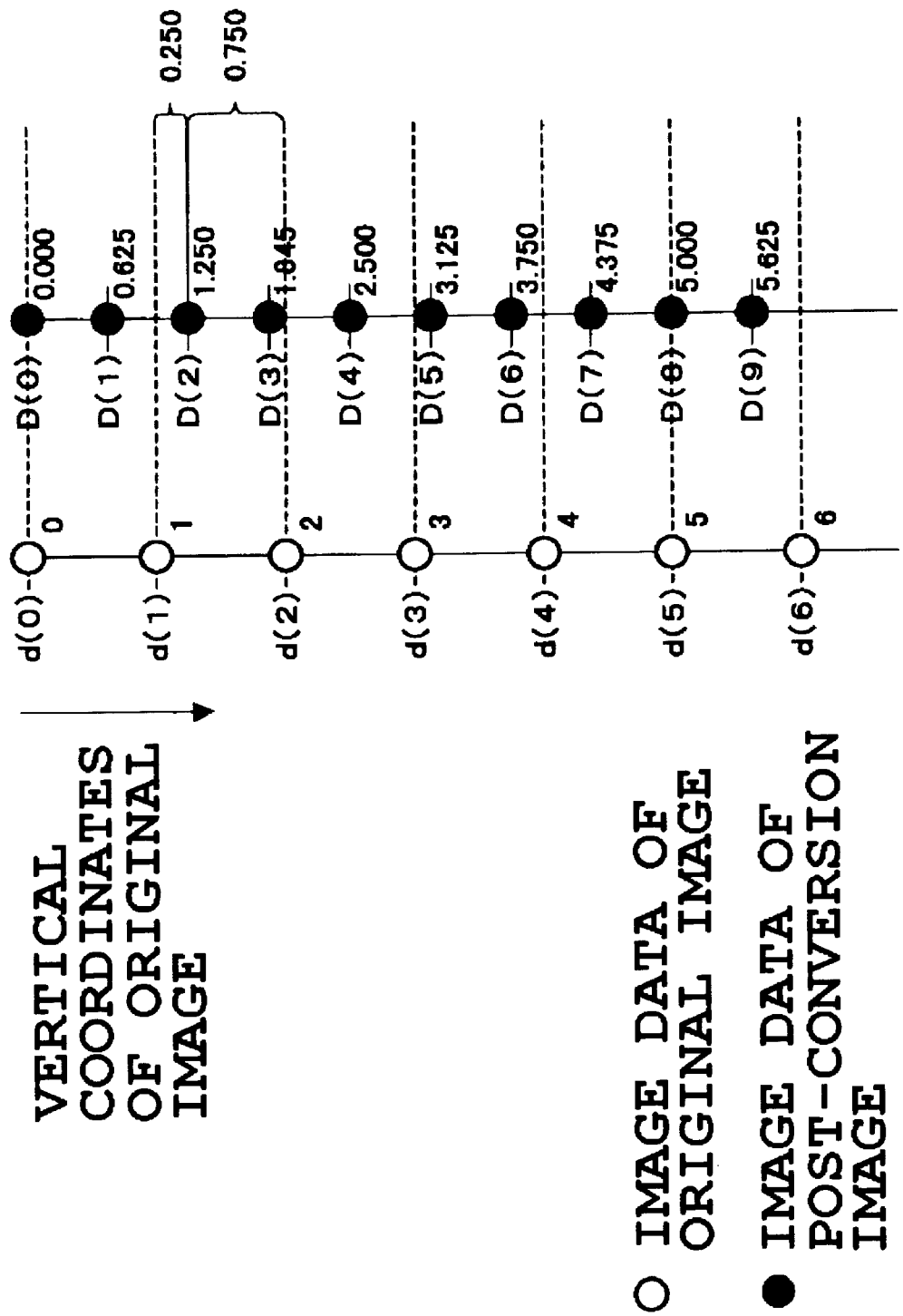
FIG. 3 is an explanatory diagram describing memory control accompanying scaling processing in the vertical direction.
Figure 4:
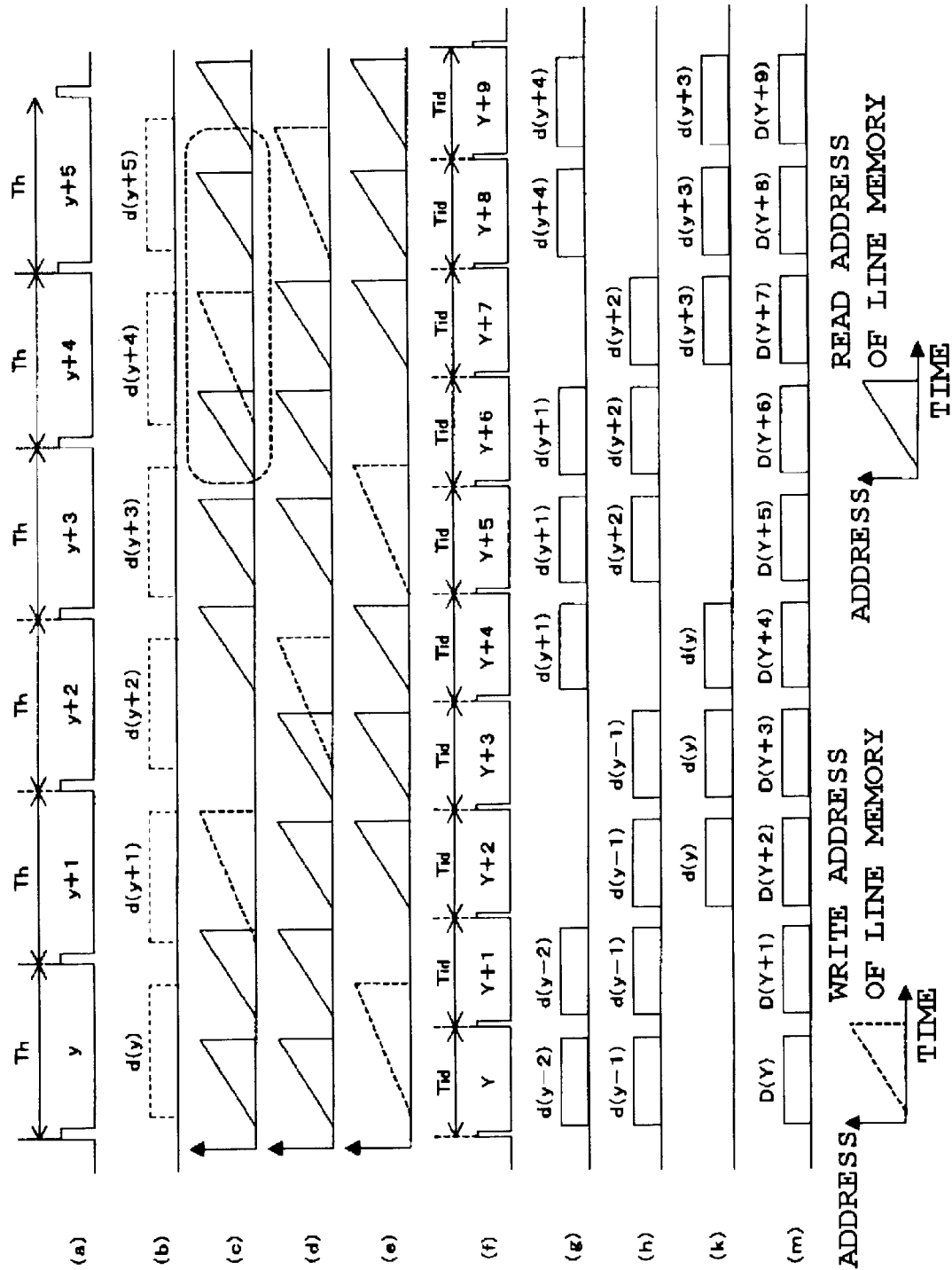
FIG. 4 is another explanatory diagram describing scaling processing in the vertical direction.
Figure 5:
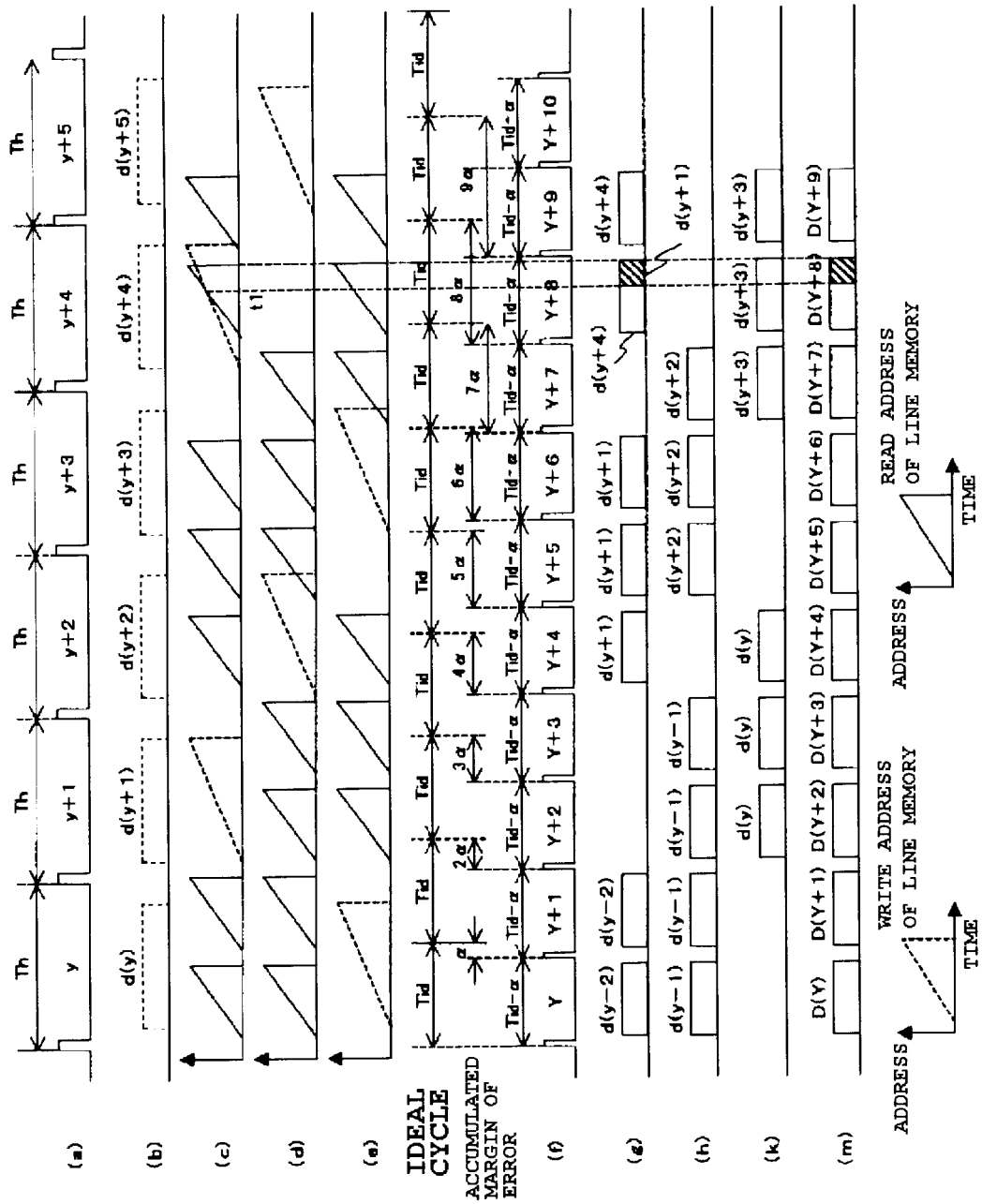
FIG. 5 is an explanatory diagram describing memory control accompanying scaling processing in the vertical direction.
Figure 6:
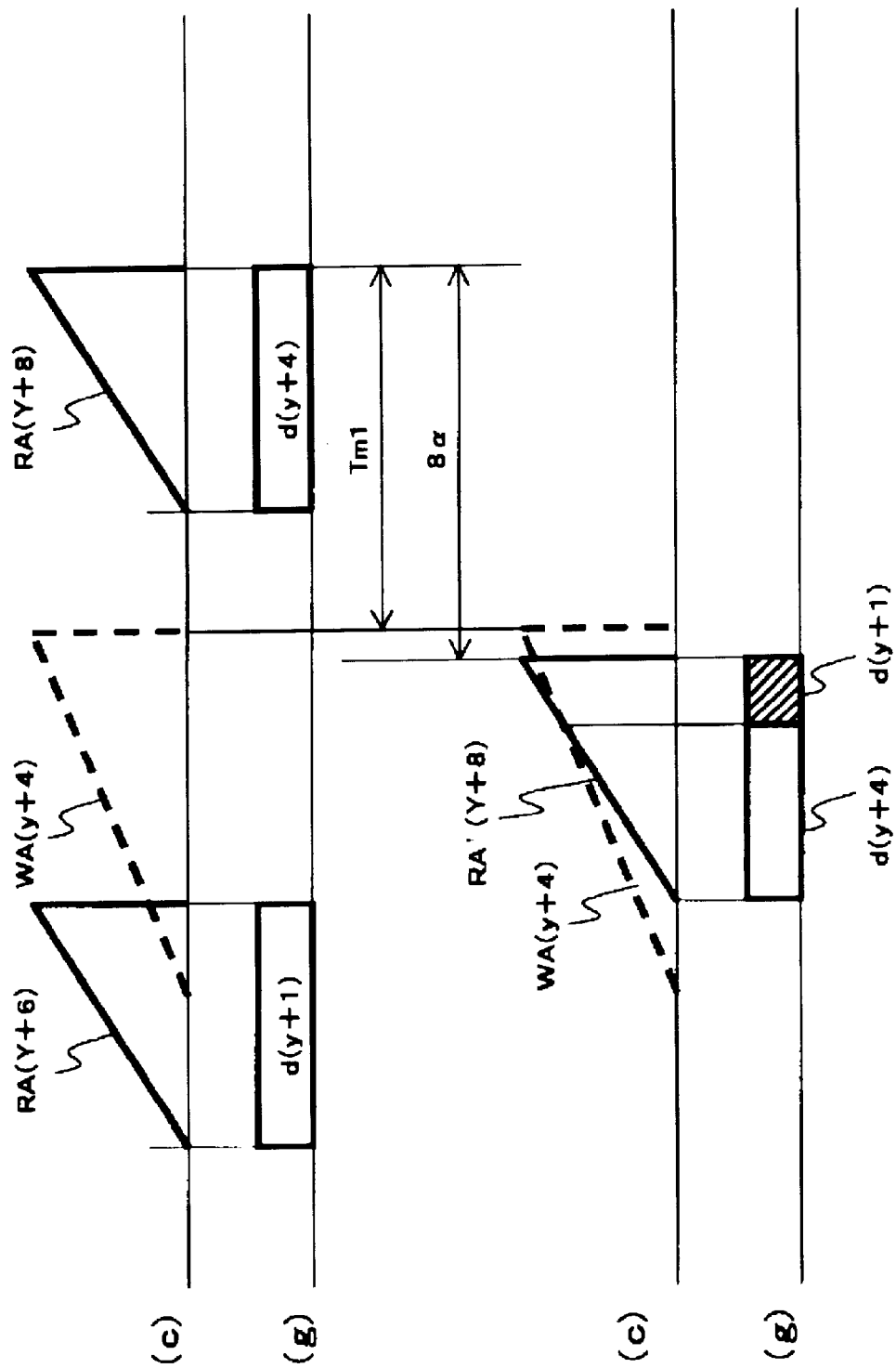
FIG. 6 is another explanatory diagram describing memory control accompanying scaling processing in the vertical direction.
Figure 7:
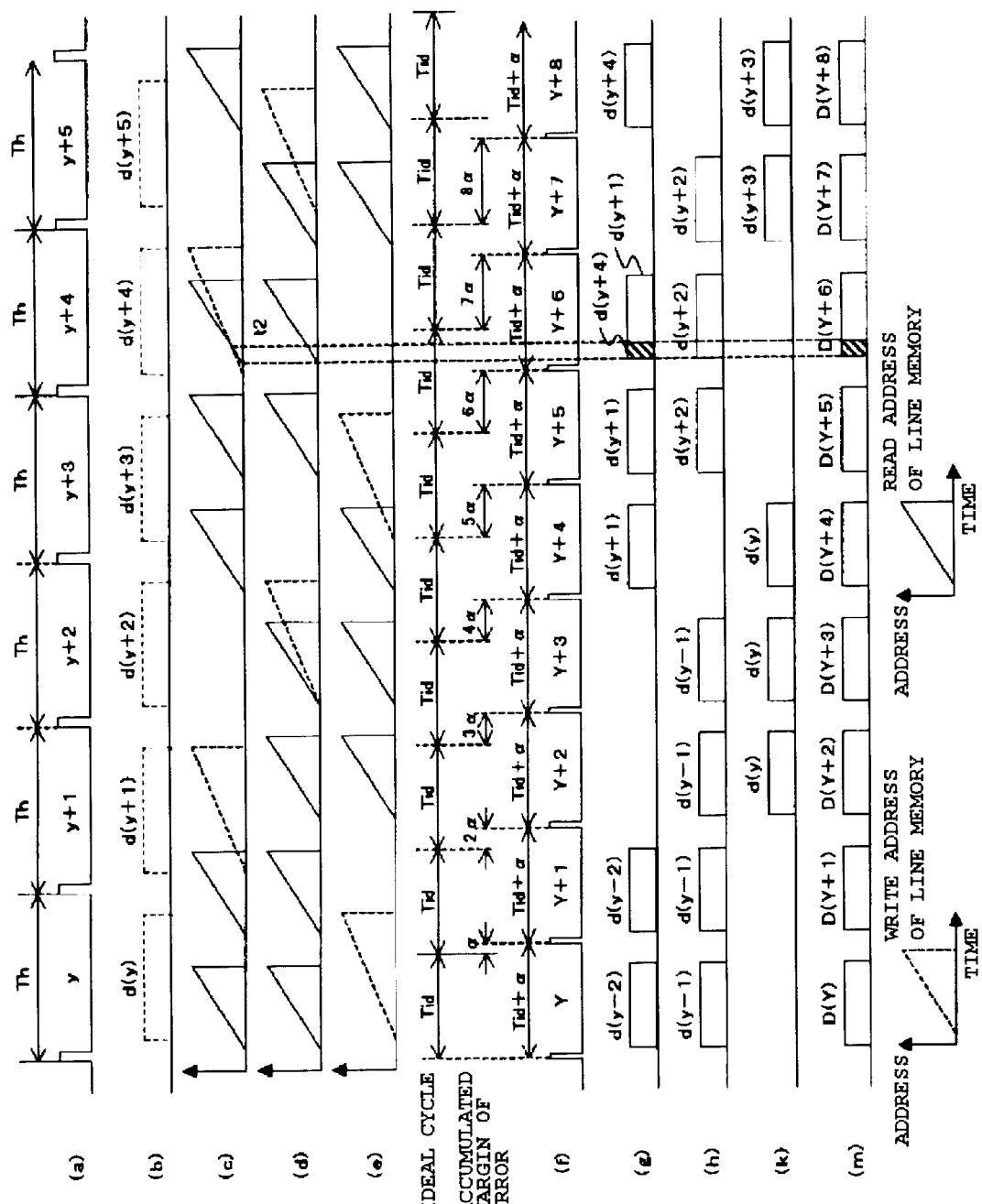
FIG. 7 is another explanatory diagram describing memory control accompanying scaling processing in the vertical direction.
Figure 8:
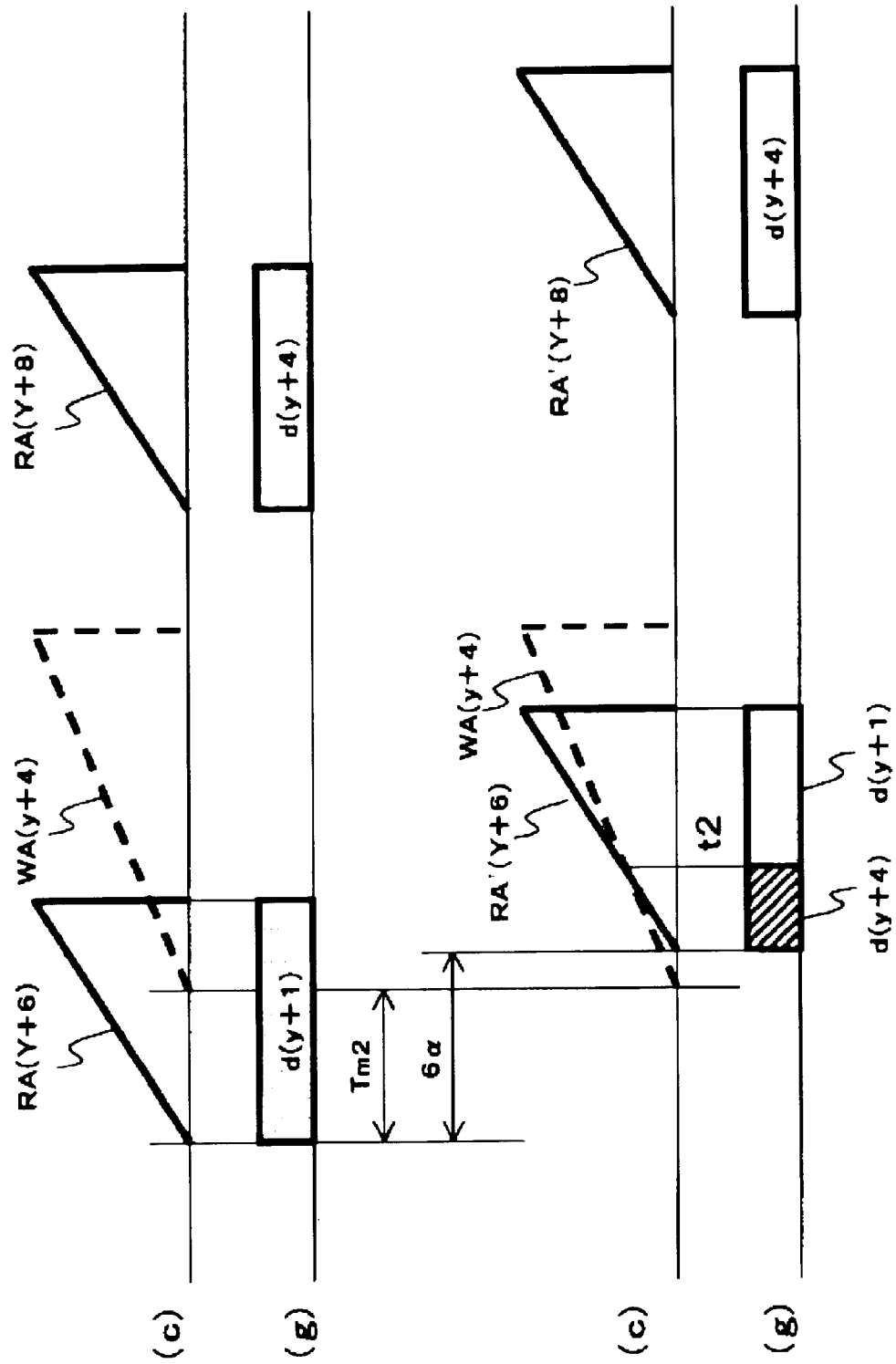
FIG. 8 is another explanatory diagram describing memory control accompanying scaling processing in the vertical direction.
Figure 9:
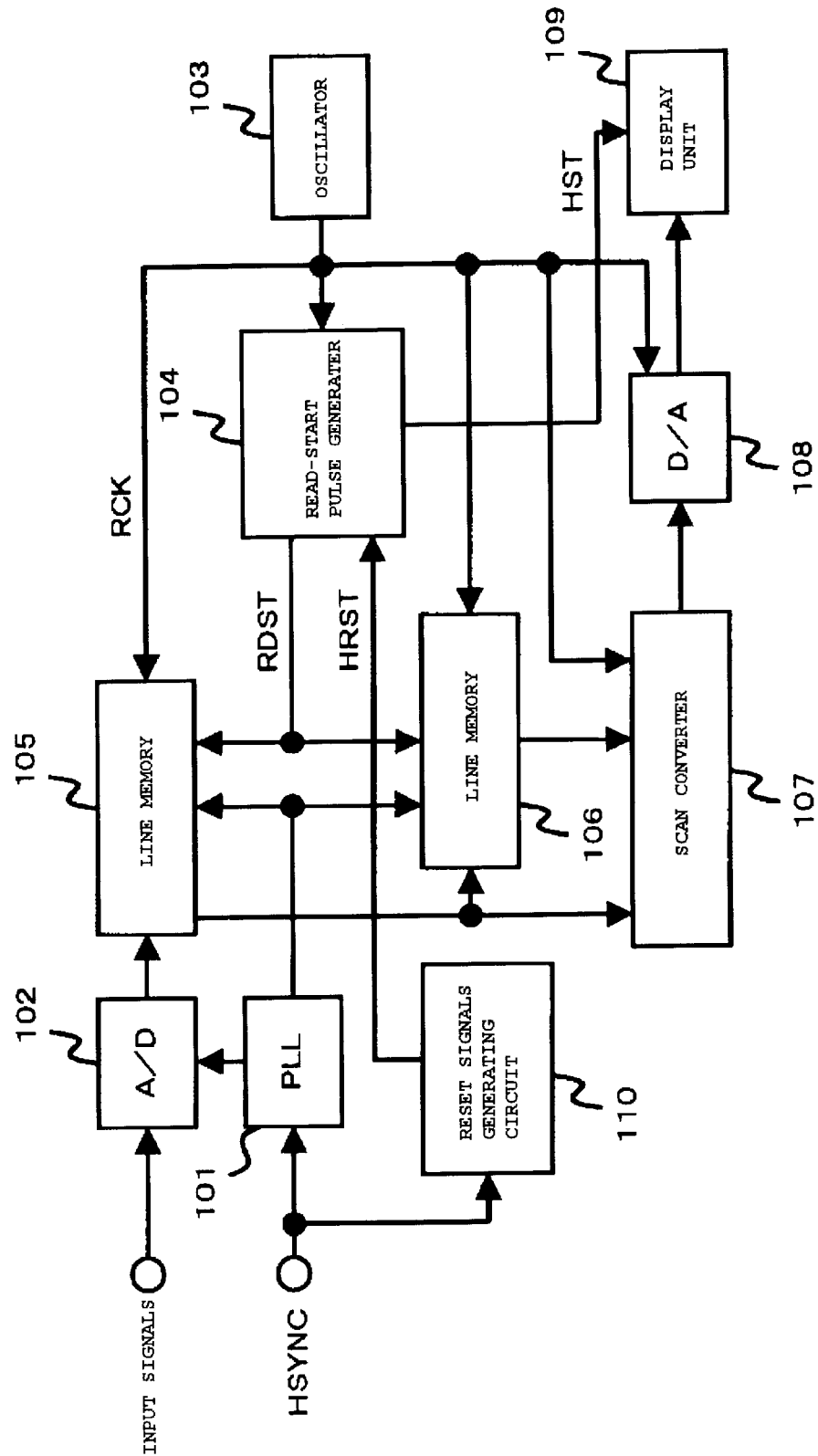
FIG. 9 is a block diagram illustrating the configuration of a conventional image display device.
Figure 10:
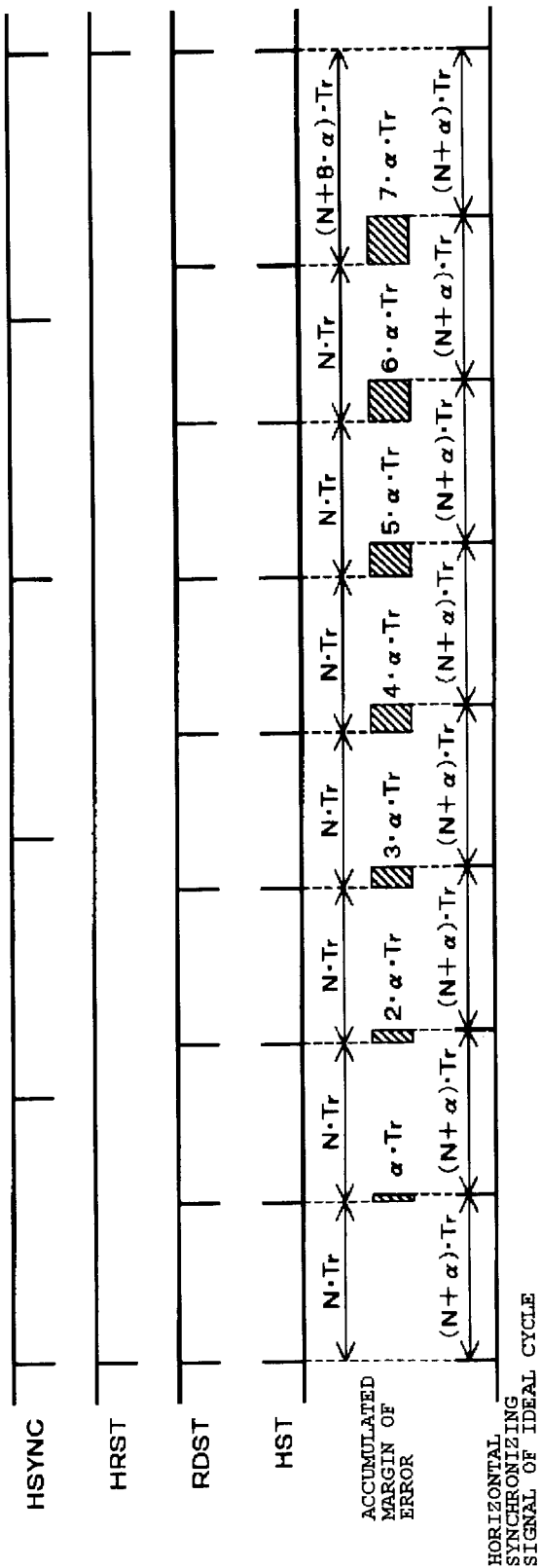
FIG. 10 is an explanatory diagram illustrating the operation of a conventional image display device.

Scaling processing in the vertical direction must be performed after the memory 9 in order to perform interpolation processing for multiple lines. Accordingly, the second signal processing circuit 12 is of a configuration wherein both enlargement and reduction processing can be performed in the vertical direction. Such sharing of the interpolation processing unit used for processing for enlarging and for reducing in the vertical direction enables the size of the circuit to be reduced. Also, details of the scaling processing in the vertical direction of the image has already been described with reference to FIG. 3, and accordingly describing will be omitted here.

Next, the operation of the synchronizing signal generating circuit 11 will be described. FIG. 13 is a diagram illustrating the configuration of the synchronizing signal generating circuit 11. The synchronizing signal generating circuit 11 is subjected to predetermined initialization by the input vertical synchronizing signal V.

Control signals TD (containing integer N and decimal $\alpha$ as cycle information of the horizontal synchronizing signals HP) output by the controller 5 are input, thereby providing the integer N and decimal $\alpha$ which are the cycle information of the horizontal synchronizing signals HP. The decimal $\alpha$ is input to the adder 14, and the integer N is input to the horizontal cycle generator 17. The adder 14 adds the decimal $\alpha$ and the output of the DFF 15, thereby outputting the accumulated addition results A.

The accumulated addition results A output by the adder 14 are input to the DFF 15 and comparator 16. The DFF 15 latches the accumulated addition results A based on the horizontal synchronizing signals HP output from the horizontal synchronizing signal generator 18, and outputs latch data A'.

The horizontal synchronizing signal HP is a control signal indicating the leading end of a line. The accumulated addition results A indicate the current accumulated addition results, and the latch data A' indicates the accumulated addition results from one line back. Hereafter, the latch data A' will be referred to as previous-line accumulated addition results A'. The previous-line accumulated addition results A' output from the DFF 15 are input to the adder 14 again.

At the adder 14, the decimal $\alpha$ is accumulated for the previous-line accumulated addition results A', thereby outputting the current accumulated addition results A. Repeating this operation enables the adder 14 and the DFF 15 to calculate the accumulated addition results A of the decimal $\alpha$.

The current-line accumulated addition results A output from the adder 14 and the previous-line accumulated addition results A' output from the DFF 15 are input to the comparator 16. The comparator 16 makes comparison between the current accumulated addition results A and the previous-line accumulated addition results A', and in the event that the integer component is equal outputs the comparison results C=0, and in the event that the integer component is unequal outputs the comparison results C=1. The comparison results C are input to the horizontal cycle generator 17.

The horizontal cycle generator 17, based on the integer N of the horizontal cycle information output from the controller 5 and the comparison results C output from the comparator 16, outputs the horizontal cycle count value HPW=N in the event that the comparison results are C=0, and outputs the horizontal cycle count value HPW=N+1 in the event that the comparison results are C=1.

The horizontal cycle count value HPW output from the horizontal cycle generator 17 is input to the horizontal synchronizing signal generator 18. This horizontal synchronizing signal generator 18 is initialized based on the vertical synchronizing signals Vi of the input image signals, following which the panel clock PCLK is counted, and a horizontal synchronizing signal HP is output based on the count results and the horizontal cycle count value HPW output from the horizontal cycle generator 17.

The horizontal synchronizing signal HP output from the horizontal synchronizing signal generator 18 is input to the vertical synchronizing signal generator 19 and the DFF 15. The vertical synchronizing signal generator 19 is initialized based on the vertical synchronizing signals Vi of the input image signals, following which the horizontal synchronizing signals HP are counted, and a vertical synchronizing signal VP is output. Thus, the synchronizing signal generating circuit 11 outputs horizontal synchronizing signals HP and vertical synchronizing signals VP.

Figure 18:
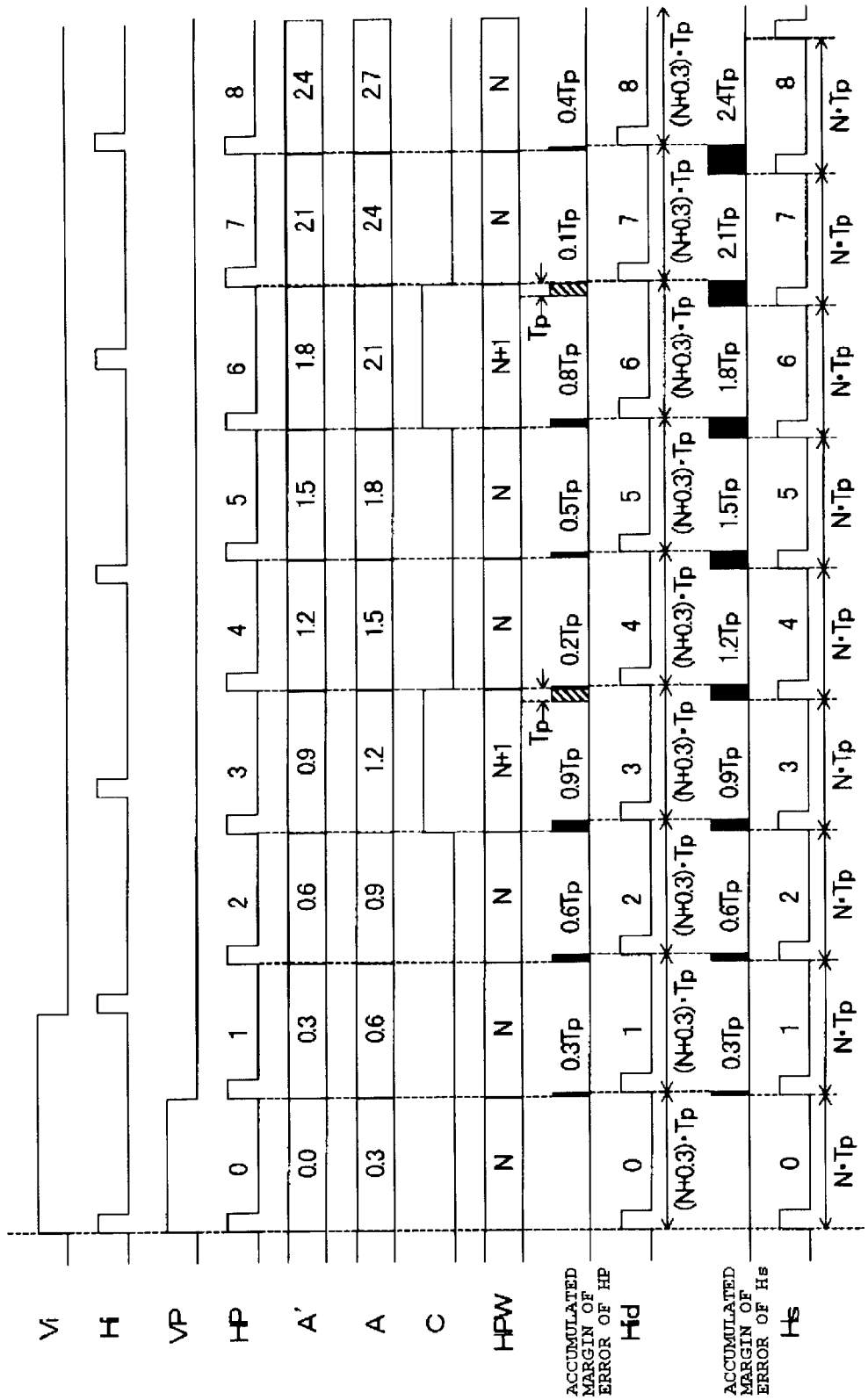
FIG. 18 is an explanatory diagram describing the operation of the synchronizing signal generating circuit according to the first embodiment of the present invention.

FIG. 18 is a timing chart describing the operation of the synchronizing signal generating circuit 11. An example of converting five lines of the input image into eight lines is described here. In this case, the ideal horizontal synchronizing signal cycle for the output image signals is calculated by Tid=Th·5/8.

As described above, the calculation results are obtained in the format of Tid=(N+$\alpha$)·Tp, using the integer N, decimal $\alpha$, and panel clock PCLK cycle Tp. For the sake of describing, a horizontal synchronizing cycle signal Hid generated by this ideal horizontal synchronizing cycle Tid=(N+$\alpha$)·Tp is assumed, and shown in the figure. Also, for the sake of description, a horizontal synchronizing signal Hs generated by the count value N of PCLK is assumed, and shown in the figure. The numerals for HP, Hid, and Hs represent the line Nos. for output image signal lines.

Now, description will be made with an example wherein the decimal $\alpha$ has been found to be 0.3. Here, the ideal horizontal synchronizing signal cycle Tid=(N+0.3)·Tp.

The horizontal synchronizing signal Hs of which the PCLK count value is generated with N has a cycle of N·Tp. A margin of error of 0.3 Tp occurs with the horizontal cycle signal of the ideal cycle Hid for every line, so the accumulated margin or error between Hs and Hid increases with each additional line; 0.3 Tp at the leading end of line 1, 0.6 Tp at the leading end of line 2, and then 0.9 Tp, 1.2 Tp, 1.5 Tp, and so on. This accumulated margin of error in comparison to the horizontal cycle signal of the ideal cycle Hid will hereafter be simply referred to as accumulated margin of error.

Next, the operation of the synchronizing signal generating circuit 11 will be described.

The integer N and decimal $\alpha$=0.3 are input to the synchronizing signal generating circuit 11. The previous-line accumulated addition results A' are initialized to zero by the input vertical synchronizing signals Vi, and line 0 starts. The previous-line accumulated addition results A'=0 and α=0.3 are added, thereby calculating the current accumulated addition results A=A'+α=0.3.

The integer components of the current accumulated addition results A=0.3 and the previous-line accumulated addition results A'=0 are compared, and both are 0, so the comparison results are C=0. In the event of C=0, the horizontal cycle count value HPW=N, so horizontal synchronizing signals HP are generated such that the count value by the PCLK is N, and the next line is started. The cycle of line 0 is N·Tp.

At the leading end of line 1, the current accumulated addition results A are latched to the previous-line accumulated addition results A' by the horizontal synchronizing signals HP, so the previous-line accumulated addition results A' change from A'=0 to A'=0.3.

The decimal α=0.3 is added to this A'=0.3, so that the current accumulated addition results A become A=0.3+0.3=0.6. At line 1 also, the integer component of the current accumulated addition results A and the previous-line accumulated addition results A' are both 0, so the comparison results are C=0, the horizontal cycle count value HPW=N, so horizontal synchronizing signals HP are generated such that the count value by the PCLK is N, and the subsequent line 2 is started. Now, the cycle of line 1 is also N·Tp. In the same way, the cycle of line 2 is also generated so as to be cycle N·Tp.

At the leading end of line 3, the current accumulated addition results A are latched to the previous-line accumulated addition results A' by the horizontal synchronizing signals HP, so the previous-line accumulated addition results A' change from A'=0.6 to A'=0.9. The decimal α=0.3 is added to this A'=0.9, so that the current accumulated addition results A become A=0.9+0.3=1.2.

The integer component of the current accumulated addition results A=1.2 and the previous-line accumulated addition results A'=0.9 are compared, whereby the integer component of the current accumulated addition results A is found to be A=1 and integer component of the previous-line accumulated addition results A' is found to be 0, which means that the results are different, so the comparison results are C=1.

In the event that the comparison results are C=1, the horizontal cycle count value HPW=N+1, so horizontal synchronizing signals HP are generated such that the count value by the PCLK is N+1, and the subsequent line 4 is started. The cycle of line 3 is also (N+1)·Tp.

Subsequently, the horizontal cycle count value HPW is similarly calculated based on the comparison results C of the two accumulated addition results A and A', and the horizontal synchronizing signals HP are generated according to the HPW. HPW=N for lines 4 through 5, HPW=N+1 for line 6, and HPW=N for lines 7 and 8.

The horizontal synchronizing signals HP have a cycle of N·Tp at line 0, and thus are shorter than cycle Tid=(N+0.3)·Tp of the horizontal cycle signal of the ideal cycle Hid by 0.3 Tp. A margin of error of 0.3 Tp occurs at the leading end of line 1 between the horizontal synchronizing signals HP and Hid. The portion equivalent to the margin of error is filled in, in the figure.

The margin of error of 0.3 Tp is accumulated at the leading end of line 2 as well, so a margin of error of 0.6 Tp occurs between HP and Hid. In the same manner, at the leading end of line 3, a margin of error of 0.9 Tp occurs between HP and Hid.

In the event that the horizontal synchronizing signal HP has been generated by cycle N·Tp in line 3 as well, the accumulated margin of error of the HP should further increase by 0.3 Tp and reach 1.2 Tp. However, as described above, the horizontal synchronizing signals HP is generated in line 3 by cycle (N+1)·Tp. The cycle of the horizontal synchronizing signals HP increases by Tp, thus operating to correct the accumulated margin of error of the HP by Tp. Accordingly, the accumulated margin of error at line 3 is suppressed to 0.2 Tp. The hatched portions in the figure indicated the portions wherein the accumulated margin of error of the HP has been corrected by Tp.

Lines 4 and 5 are at cycle N·Tp, so the accumulated margin of error is 0.5 Tp and 0.8 Tp at the leading end of lines 5 and 6, respectively (i.e., increased by 0.3 Tp each). The accumulated margin of error of the HP at line 6 should be 0.8 Tp+0.3 Tp=1.1 Tp, but HP is generated by cycle (N+1)·Tp, so the accumulated margin of error of the HP is corrected by Tp, and suppressed to 0.1 Tp.

Taking note of the operation in line 3, the current accumulated addition results A=1.2, and the previous-line accumulated addition results A'=0.9. The previous-line accumulated addition results A'=0.9 correspond to the accumulated margin of error of the horizontal synchronizing signal Hs, and the current accumulated addition results A=1.2 correspond to the accumulated margin of error of the horizontal synchronizing signal Hs, and both are equal to a coefficient of Tp.

This predicts that, for example in the event that line 3 is generated by cycle N·Tp, the accumulated margin of error at the time of ending line 3 will change from less than Tp to Tp and more. On the other hand, the horizontal synchronizing signals HP are generated by PCLK, so the cycle thereof can only be changed in increments of Tp.

That is to say, in the event that the accumulated margin of error of the horizontal synchronizing signals HP is or exceeds Tp, the cycle of the horizontal synchronizing signal HP is increased by Tp so as to correct the accumulated margin of error of the horizontal synchronizing signals by Tp. Accordingly, horizontal synchronizing signals HP can be generated such that the accumulated margin of error of the horizontal synchronizing signal HP is always less than the PCLK cycle Tp.

By generating the horizontal synchronizing signals HP as described above, the offset in the correlating relation of the reading operation and writing operation at the memory 9 based on the horizontal synchronizing signals HP can be always suppressed to a level smaller than the PCLK cycle Tp as to the ideal timing.

There is no way that memory overtaking will occur, from the perspective that normal image signals have a predetermine blanking period (image-invalid period), as well. Accordingly, image scaling processing can be performed at arbitrary conversion ratios using a clock PCLK which is asynchronous to the input image signals Di.

Description has been thus made regarding a configuration wherein interpolation processing is performed for two sets of image data in the horizontal direction or vertical direction with the first signal processing circuit 8 and the second signal processing circuit 12, but an arrangement may be made wherein interpolation processing is performed for three sets of data.

In the above description, the configuration was such that in the event that the accumulated margin of error of the horizontal synchronizing signals HP is going to be Tp or more, the cycle of the horizontal synchronizing signals HP is increased by Tp so as to correct the accumulated margin of error of the horizontal synchronizing signals HP by Tp, but the amount of correction of the accumulated margin of error can be set appropriately as long as this is within a range wherein overtaking (non-conformity of the read/write timing) does not occur at the memory 9. That is to say, in the event that the accumulated margin of error is going to be 2·Tp, the configuration may be such that the accumulated margin of error is corrected by 2·Tp. Of course, the configuration may be such that the accumulated margin of error is corrected by 3·Tp in the event that the accumulated margin of error is going to be 3·Tp, as well. Thus, the configuration may be such that the accumulated margin of error is corrected by k·Tp in the event that the accumulated margin of error is going to be k·Tp. Accordingly, in the event that the margin of error is going to be 3·Tp or more, the integer k may be used to correct the accumulated margin of error by k·Tp, so long as this is within a range wherein overtaking does not occur at the memory 9.

Also, configuration may be such that interpolation processing is performed for four sets of image data, and interpolation processing according to cubic convolution for example, may be performed. Of course, interpolation processing may be performed for five or more sets of image data, as well. The greater the number of sets of image data for reference for interpolation processing is, the easier it is to realize the desired filter properties, i.e., image quality, but on the other hand, the magnitude of the circuit increase. The number of sets of image data referred to for the interpolation processing is determined by a trade-off between the necessary image quality and realizable circuit size.

Second Embodiment

Figure 19:
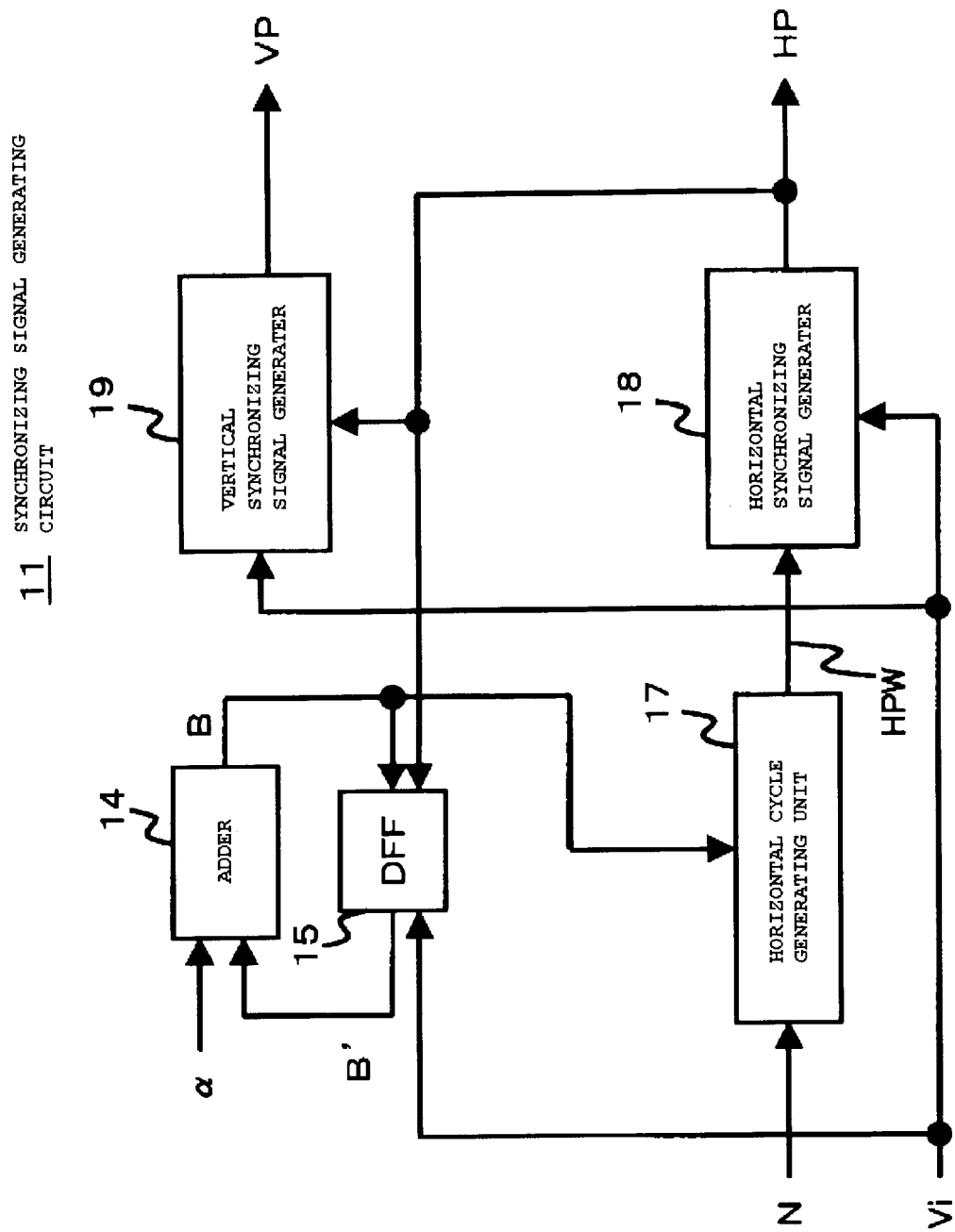
FIG. 19 is a block diagram describing the configuration of the synchronizing signal generating circuit according to a second embodiment of the present invention.

FIG. 19 is a diagram illustrating the configuration of the synchronizing signal generating circuit 11 according to the second embodiment, which is another configuration of the synchronizing signal generating circuit 11 according to the first embodiment. Reference numeral 14 denotes an adder, 15 denotes a DFF, 17 denotes a horizontal cycle generator, 18 denotes a horizontal synchronizing signal generator, and 19 denotes a vertical synchronizing signal generator.

The operation will now be described. The synchronizing signal generating circuit 11 is subjected to predetermined initializing processing by an input vertical synchronizing signal Vi. Control signals TD output by the controller 5 are input, thereby providing the integer N and decimal α which are the cycle information of the horizontal synchronizing signals HP.

The decimal α is input to the adder 14, and the integer N is input to the horizontal cycle generator 17. The adder 14 adds the decimal α and the output B' of the DFF 15, thereby outputting the addition results B. The addition results B output by the adder 14 are input to the DFF 15 and the horizontal cycle generator 17.

The DFF 15 latches the decimal component of the addition results B based on the horizontal synchronizing signals HP output from the horizontal synchronizing signal generator 18, and outputs latched data B'. The horizontal synchronizing signals HP are control signals indicating the leading end of the line. The latched data B' output from the DFF 15 is input to the adder 14. At the adder 14, the latched data B' and the decimal α are added, and the addition results B are output.

The horizontal cycle generator 17 receives input of the integer N of the horizontal cycle information output from the controller 5 and the addition results B output from the adder 14. In the event that the addition results B are less than 1, the horizontal cycle generator 17 outputs the horizontal cycle count value HPW=N, and outputs the horizontal cycle count value HPW=N+1 in the event that the addition results B are 1 or more.

The horizontal cycle count value HPW output from the horizontal cycle generator 17 is input to the horizontal synchronizing signal generator 18. This horizontal synchronizing signal generator 18 is initialized based on the vertical synchronizing signals Vi of the input image signals, following which the panel clock PCLK is counted, and a horizontal synchronizing signal HP is output based on the count results and the horizontal cycle count value HPW output from the horizontal cycle generator 17.

The horizontal synchronizing signal HP output from the horizontal synchronizing signal generator 18 is input to the vertical synchronizing signal generator 19 and the DFF 15. The vertical synchronizing signal generator 19 is initialized based on the vertical synchronizing signals Vi of the input image signals, following which the horizontal synchronizing signals HP are counted, and a vertical synchronizing signal VP is output. Thus, the synchronizing signal generating circuit 11 outputs horizontal synchronizing signals HP and vertical synchronizing signals VP.

Figure 20:
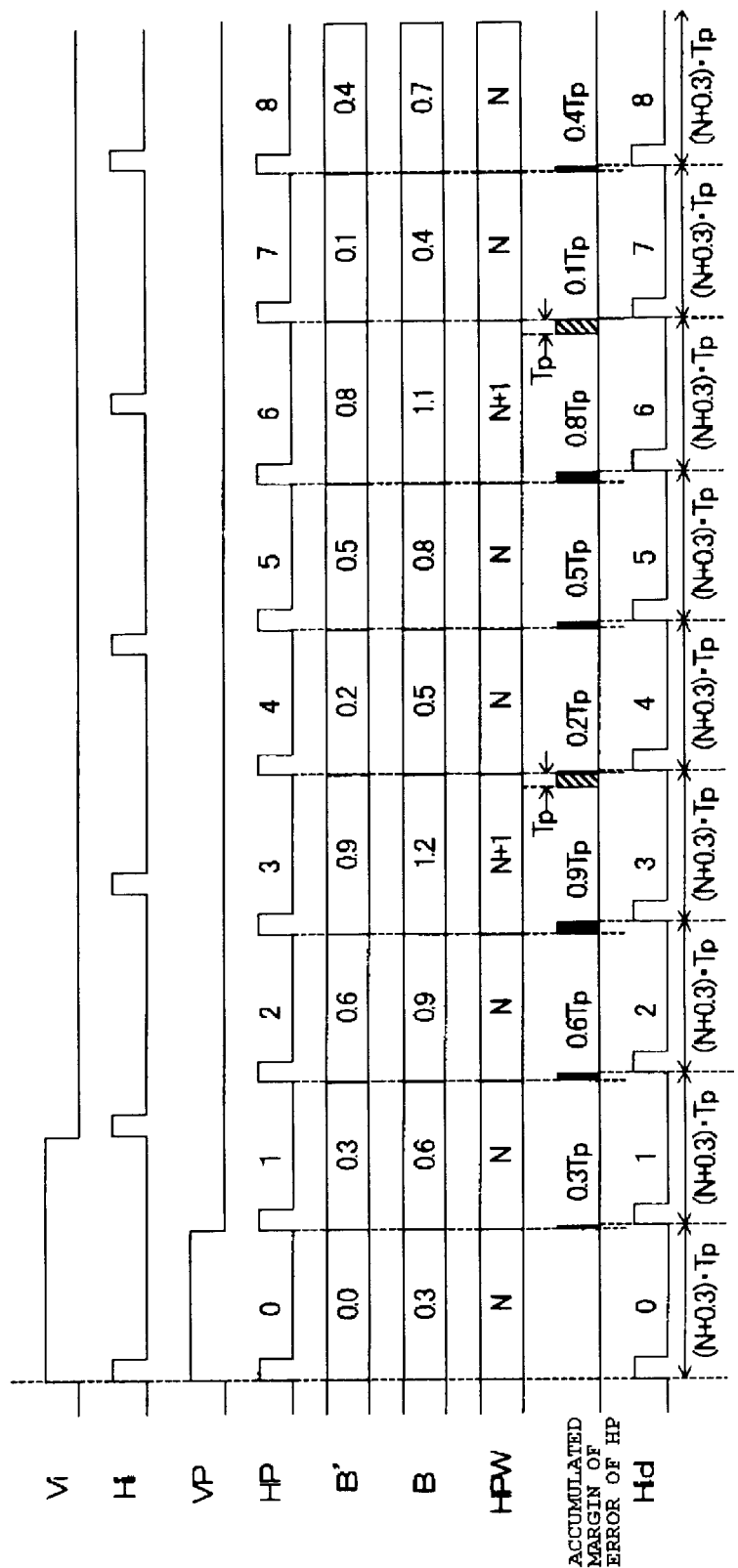
FIG. 20 is an explanatory diagram describing the operation of the synchronizing signal generating circuit according to the second embodiment of the present invention.

FIG. 20 is a timing chart describing the operation of the synchronizing signal generating circuit 11 according to the second embodiment. An example of converting five lines of the input image into eight lines is described here. In this case, the ideal horizontal synchronizing signal cycle for the output image signals is calculated by Tid=Th·⅝.

As described above, the calculation results are obtained in the format of Tid=(N+α)·Tp, using the integer N, decimal α, and panel clock PCLK cycle Tp. For the sake of describing, a horizontal synchronizing signal Hid generated by this ideal horizontal synchronizing signal cycle Tid=(N+α)·Tp is assumed, and shown in the figure. The numerals provided above the horizontal synchronizing signal HP and horizontal synchronizing signal Hid indicate line Nos. of the output image signals. Now, description will be made with an example wherein the decimal α has been found to be 0.3. Here, the ideal horizontal synchronizing cycle Tid=(N+0.3)·Tp.

The integer N and decimal α=0.3 are input to the synchronizing signal generating circuit 11. The latched data B' is initialized to zero by the input vertical synchronizing signals Vi, and line 0 starts. The latched data B'=0 and α=0.3 are added, thereby calculating the addition results B=B'+α=0.3 are calculated.

The addition results B=0.3 are less than 1, so the horizontal cycle count value HPW=N is obtained. At line 1, following counting of the PCLK by the horizontal cycle count value HPW=N, so horizontal synchronizing signals HP are generated and the next line is started. The cycle of line 0 is N·Tp.

At the leading end of line 1, the decimal component of the addition results B are latched to the latched data B' by the horizontal synchronizing signals HP, so the latched data B' changes from B'=0 to B'=0.3. The decimal α=0.3 is added to this latched data B'=0.3, so the addition results B=0.6.

The addition results B are less than 1 at line 1 as well, so the horizontal synchronizing cycle count value HPW=N. Horizontal synchronizing signals HP according to the PCLK are generated such that the count value is HPW=N, and the next line 2 starts. The cycle of line 1 is also N·Tp. In the same manner, line 2 is generated such that the cycle is N·Tp.

At the leading end of line 3, the integer component of the addition results B is latched by the latched data B' by the horizontal synchronizing signals HP, so the latched data B' changes from B'=0.6 to B'=0.9. The latched data B'=0.9 and the decimal α=0.3 are added, and the addition results become B=1.2.

Addition results of B=1.2 means that the results are 1 or greater, so the horizontal cycle count value can be obtained as HPW=N+1. Horizontal synchronizing signals HP are generated such that the count value by the PCLK is HPW=N+1, and the subsequent line 4 is started. The cycle of line 3 is also (N+1)·Tp.

In the same manner, the horizontal cycle count value HPW is calculated for line 4 on based on the addition results B, and the horizontal synchronizing signals HP are generated according to the HPW. HPW=N for lines 4 through 5, HPW=N+1 for line 6, and HPW=N for lines 7 and 8.

The horizontal synchronizing signals HP have a cycle of N·Tp at line 0, and thus are shorter than cycle Tid=(N+0.3)·Tp of the ideal horizontal synchronizing cycle Hid by 0.3 Tp. A margin of error of 0.3 Tp occurs at the leading end of line 1 between the horizontal synchronizing signals HP and the horizontal synchronizing signals Hid. The portion equivalent to the margin of error is filled in, in the figure.

The margin of error of 0.3 Tp is accumulated at the leading end of line 2 as well, so an accumulated margin of error of 0.6 Tp occurs between the horizontal synchronizing signal HP and horizontal synchronizing signal Hid. In the same manner, at the leading end of line 3, a margin of error of 0.9 Tp occurs between the horizontal synchronizing signal HP and horizontal synchronizing signal Hid. These accumulated margins of error will hereafter be simply referred to as accumulated margin of error of the horizontal synchronizing signals HP.

In the event that the horizontal synchronizing signal HP has been generated by cycle N·Tp in line 3 as well, the accumulated margin of error of the horizontal synchronizing signal HP should further increase by 0.3 Tp and reach 1.2 Tp. However, as described above, the horizontal synchronizing signal HP is generated in line 3 by cycle (N+1)·Tp. The cycle of the horizontal synchronizing signals HP increases by Tp, thus operating to correct the accumulated margin of error of the HP by Tp.

Accordingly, the accumulated margin of error at line 3 is suppressed to 0.2 Tp. The hatched portions in the figure indicated the portions wherein the accumulated margin of error of the horizontal synchronizing signal HP has been corrected by Tp. Lines 4 and 5 are at cycle N·Tp, so the accumulated margin of error of the horizontal synchronizing signal HP is 0.5 Tp and 0.8 Tp at the leading end of lines 5 and 6, respectively (i.e., increased by 0.3 Tp each).

The accumulated margin of error of the horizontal synchronizing signal HP at line 6 should be 0.8 Tp+0.3 Tp=1.1 Tp, but the horizontal synchronizing signal HP is generated by cycle (N+1)·Tp, so the accumulated margin of error of the horizontal synchronizing signal HP is corrected by Tp, and thus suppressed to 0.1 Tp.

Taking note of the operation in line 3, the addition results B=1.2, and the latched data B'=0.9. The latched data B'=0.9 corresponds to the accumulated margin of error of the HP of the previous line. Also, the current addition results A=1.2 correspond to the accumulated margin of error of the HP, in the event that the horizontal synchronizing signal HP has been generated such that the cycle of line 3 will be N·Tp, for example.

The addition results B and the latched data B' each are equal to a coefficient of Tp of the accumulated margin of error corresponding to each. This predicts that the accumulated margin of error at the time of ending line 3 will change from less than Tp to Tp or more.

On the other hand, the horizontal synchronizing signals HP are generated by PCLK, so the cycle thereof can only be changed in increments of Tp. That is to say, in the event that the accumulated margin of error of the horizontal synchronizing signals HP is or exceeds Tp, the cycle of the horizontal synchronizing signal HP is increased by Tp so as to correct the accumulated margin of error of the HP by Tp. Accordingly, horizontal synchronizing signals HP can be generated such that the accumulated margin of error of the horizontal synchronizing signal HP is always less than the PCLK cycle Tp.

A separate operation of the configuration of the synchronizing signal generating circuit 11 shown in FIG. 19 will now be described.

Here, the expression can be changed as follows:

$$N+\alpha=N+1-1+\alpha=(N+1)-(1-\alpha)$$

With N'=N+1 and $\beta=1-\alpha$, the ideal horizontal cycle can be expressed as Tid=(N+α)·Tp=(N'-β)·Tp, wherein N' is an integer and wherein $0\leq\beta<1$ holds. Here, a case of controlling the synchronizing signal generating circuit 11 with such an integer N' and decimal β will be studied.

The operation will be described with the integer N in FIG. 19 substituted with an integer N', and the decimal α substituted with a decimal β.

The synchronizing signal generating circuit 11 is subjected to predetermined initializing processing by an input vertical synchronizing signal Vi. Control signals TD output by the controller 5 are input, thereby providing the integer N' and decimal β which are the cycle information of the horizontal synchronizing signals HP.

The decimal β is input to the adder 14, and the integer N' is input to the horizontal cycle generator 17. The adder 14 adds the decimal β and the output B' of the DFF 15, thereby outputting the addition results B. The addition results B output by the adder 14 are input to the DFF 15 and the horizontal cycle generator 17.

The DFF 15 latches the decimal component of the addition results B based on the horizontal synchronizing signals HP output from the horizontal synchronizing signal generator 18, and outputs latched data B'. The horizontal synchronizing signals HP are control signals indicating the leading end of the line. The latched data B' output from the DFF 15 is input to the adder 14. At the adder 14, the latched data B' and the decimal β are added, and the addition results B are output.

The horizontal cycle generator 17 receives input of the integer N' of the horizontal cycle information output from the controller 5 and the addition results B output from the adder 14. In the event that the addition results B are less than 1, the horizontal cycle generator 17 outputs the horizontal cycle count value HPW=N', and outputs the horizontal cycle count value HPW=N'-1 in the event that the addition results B are 1 or more.

The horizontal cycle count value HPW output from the horizontal cycle generator 17 is input to the horizontal synchronizing signal generator 18. This horizontal synchronizing signal generator 18 is initialized based on the vertical synchronizing signals Vi of the input image signals, following which the panel clock PCLK is counted, and a horizontal synchronizing signal HP is output based on the count results and the horizontal cycle count value HPW output from the horizontal cycle generator 17.

The horizontal synchronizing signal HP output from the horizontal synchronizing signal generator 18 is input to the vertical synchronizing signal generator 19 and the DFF 15. The vertical synchronizing signal generator 19 is initialized based on the vertical synchronizing signals Vi of the input image signals, following which the horizontal synchronizing signals HP are counted, and a vertical synchronizing signal VP is output. Thus, the synchronizing signal generating circuit 11 outputs horizontal synchronizing signals HP and vertical synchronizing signals VP.

Figure 21:
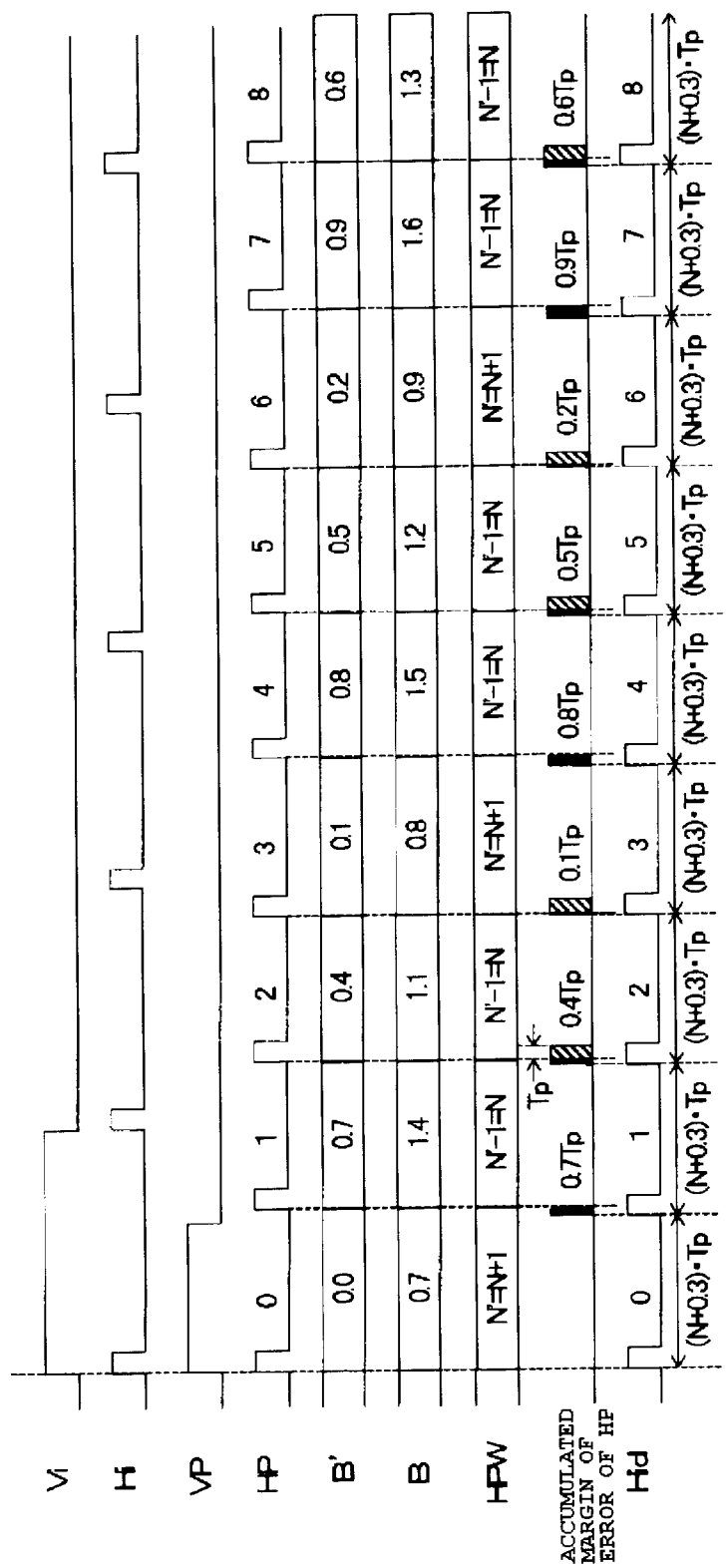
FIG. 21 is an explanatory diagram describing other operation of the synchronizing signal generating circuit according to the second embodiment of the present invention.

FIG. 21 is a diagram describing the another operation of the synchronizing signal generating circuit 11 according to the second embodiment of the present invention. An example of converting five lines of the input image into eight lines is described here also, and the ideal horizontal synchronizing signal cycle for the output image signals is calculated by Tid=Th·⅝. The calculation results are obtained in the format of Tid=(N+α)·Tp=(N'−β)·Tp. For the sake of description, a horizontal synchronizing signal Hid generated by this ideal horizontal synchronizing cycle Tid is assumed, and shown in the figure. The numerals provided above the horizontal synchronizing signal HP and horizontal synchronizing signal Hid indicate line Nos. of the output image signals.

Here also, description will be made with an example wherein the decimal α=0.3. In this case, the decimal β=1−α=0.7. Also, the ideal horizontal synchronizing signal cycle Tid=(N+0.3)·Tp=(N'−0.7)·Tp.

The integer N' and decimal β=0.7 are input to the synchronizing signal generating circuit 11. The latched data B' is initialized to zero by the input vertical synchronizing signals Vi, and line 0 starts. The latched data B'=0 and the decimal β=0.7 are added, thereby calculating the addition results B=B'+β0.7 are calculated.

The addition results B=0.7 are less than 1, so the horizontal cycle count value HPW=N' is obtained. At line 0, following counting of the PCLK by the horizontal cycle count value HPW=N', horizontal synchronizing signals HP are generated and the next line is started. The cycle of line 0 is N'·Tp=(N+1)·Tp.

At the leading end of line 1, the decimal component of the addition results B are latched to B' by the horizontal synchronizing signals HP, so the latched data B' changes from B'=0 to B'=0.7. The decimal β=0.7 is added to B'=0.7, so the addition results B=1.4. The addition results B are more than 1, so the horizontal cycle count value is calculated by HPW=N'−1=N.

Horizontal synchronizing signals HP according to the PCLK are generated such that the count value is HPW=N'−1=N, and the next line 2 starts. The cycle of line 1 is (N'−1)·Tp=N·Tp.

In the same manner, line 2 and subsequent lines have the horizontal synchronizing count value HPW calculated based on the addition results B, and the horizontal synchronizing signals HP are generated according to the HPW. At line 2, HPW=N'−1=N, at line 3, HPW=N'=N+1, and at lines 4 and 5, HPW=N'−1=N.

The horizontal synchronizing signals HP have a cycle of N'·Tp=(N+1)·Tp at line 0, and thus are longer than cycle Tid=(N+0.3)·Tp of the ideal cycle horizontal synchronizing signal Hid by 0.7 Tp. A margin of error of 0.7 Tp occurs at the leading end of line 1 between the horizontal synchronizing signals HP and the horizontal synchronizing signals Hid. The portion equivalent to the margin of error is filled in, in the figure.

Also, in this case as well, the margin of error of 0.7 Tp is accumulated at the leading end of line 2, in the event that the horizontal synchronizing signals HP are generated by the cycle N·Tp, so the accumulated margin of error of the HP should reach 1.4 Tp. However, as described above, the horizontal synchronizing signal HP is generated in line 1 by cycle (N'−1)·Tp=N·Tp.

Thus, the cycle of the horizontal synchronizing signals HP decreases by Tp, thus operating to correct the accumulated margin of error of the HP by Tp. Accordingly, the accumulated margin of error at line 1 is suppressed to 0.4 Tp. The hatched portions in the figure indicated the portions wherein the accumulated margin of error of the HP has been corrected by Tp.

The accumulated margin of error of the HP at line 2 should be 0.4 Tp+0.7 Tp=1.1 Tp, but the HP is generated by cycle (N'−1)·Tp N·Tp, so the accumulated margin of error of the HP is corrected by Tp, and thus suppressed to 0.1 Tp.

Taking note of the operation in line 1, the addition results B=1.4, and the latched data B'=0.7. The latched data B'=0.7 corresponds to the accumulated margin of error of the horizontal synchronizing signal HP of the previous line.

Also, the addition results B=1.4 correspond to the accumulated margin of error of the horizontal synchronizing signal HP, in the event that the horizontal synchronizing signal HP has been generated such that the cycle of line 1 will be N'·Tp=(N+1)·Tp, for example. The addition results B and the latched data B' each are equal to a coefficient of Tp of the accumulated margin of error corresponding to each.

This predicts that the accumulated margin of error at the time of ending line 1 will change from 0.7 Tp to 1.4 Tp, and particularly predicts change from less than Tp to Tp or more. On the other hand, the horizontal synchronizing signals HP are generated by PCLK, so the cycle thereof can only be changed in increments of Tp.

That is to say, in the event that the accumulated margin of error of the horizontal synchronizing signals HP is or exceeds Tp, the cycle of the horizontal synchronizing signal HP is decreased by Tp so as to correct the accumulated margin of error by Tp. Accordingly, horizontal synchronizing signals HP can be generated such that the accumulated margin of error of the horizontal synchronizing signal HP is always less than the PCLK cycle Tp.

According to such operation of the horizontal synchronizing signal generating circuit 11, even in cases wherein such an integer N' and decimal α are input as cycle information, horizontal synchronizing signals HP can be generated such that the accumulated margin of error of the horizontal synchronizing signal HP is always less than the PCLK cycle Tp.

Third Embodiment

Figure 22:
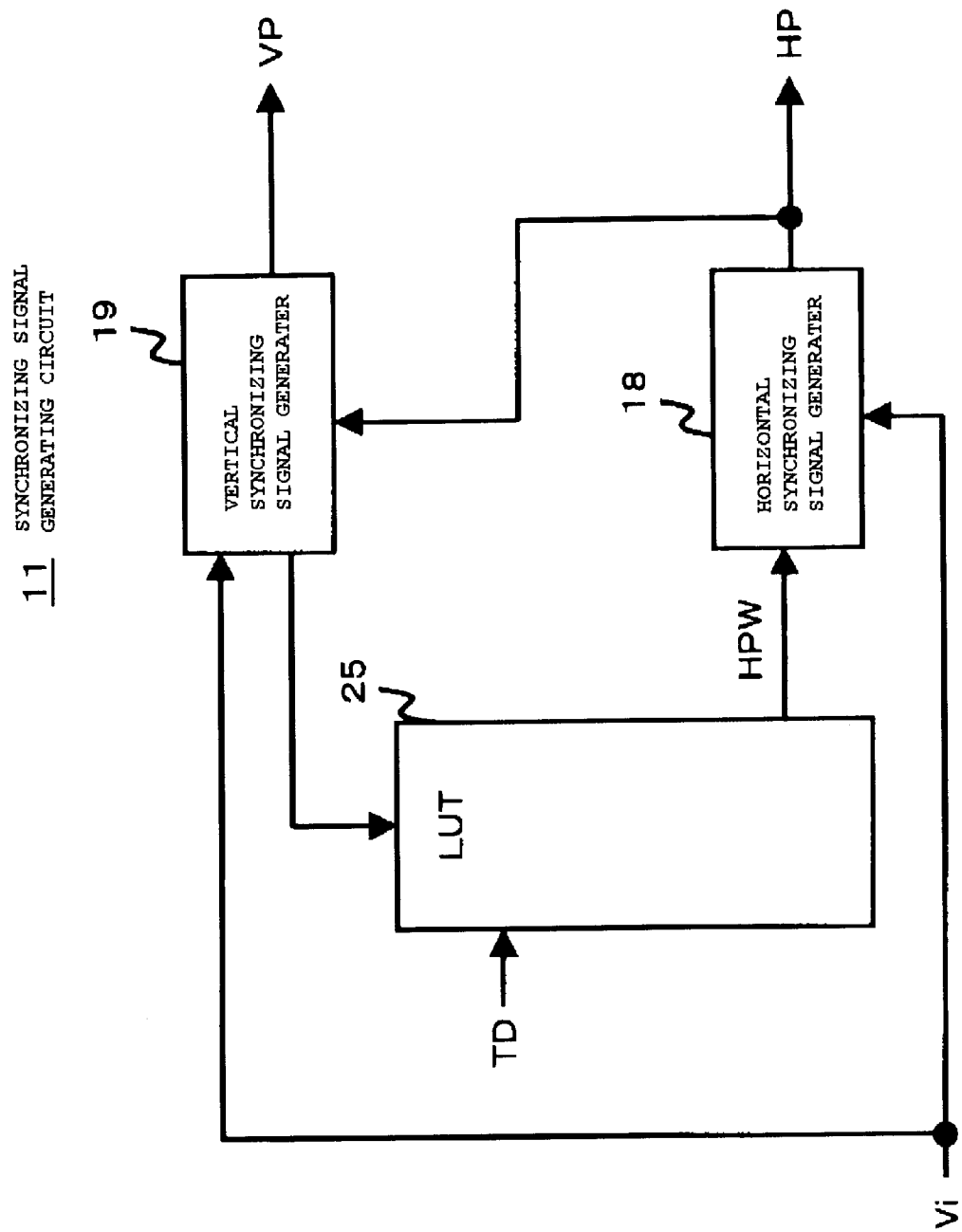
FIG. 22 is a block diagram illustrating the configuration of the synchronizing signal generating circuit according to a third embodiment of the present invention.

FIG. 22 is a diagram illustrating the configuration of the synchronizing signal generating circuit 11 according to a third embodiment, comprising another configuration of the synchronizing signal generating circuit 11 according to the first embodiment. Reference numeral 18 denotes a horizontal synchronizing signal generator, 19 denotes a vertical synchronizing signal generator, and 25 denotes a look-up table (LUT).

Figure 23:
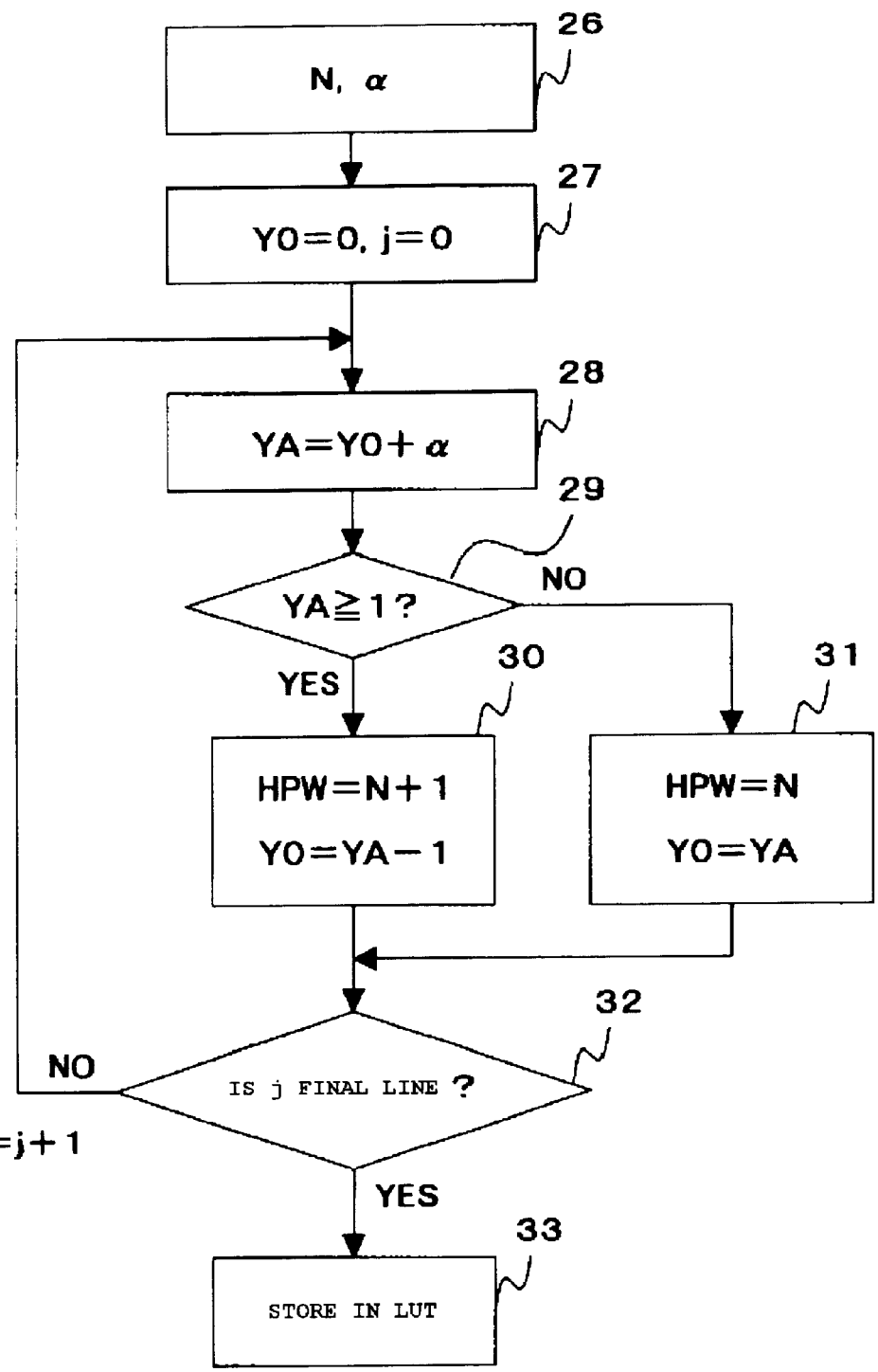
FIG. 23 is a flowchart describing the operation of the controller according to the third embodiment of the present invention.
Figure 24:
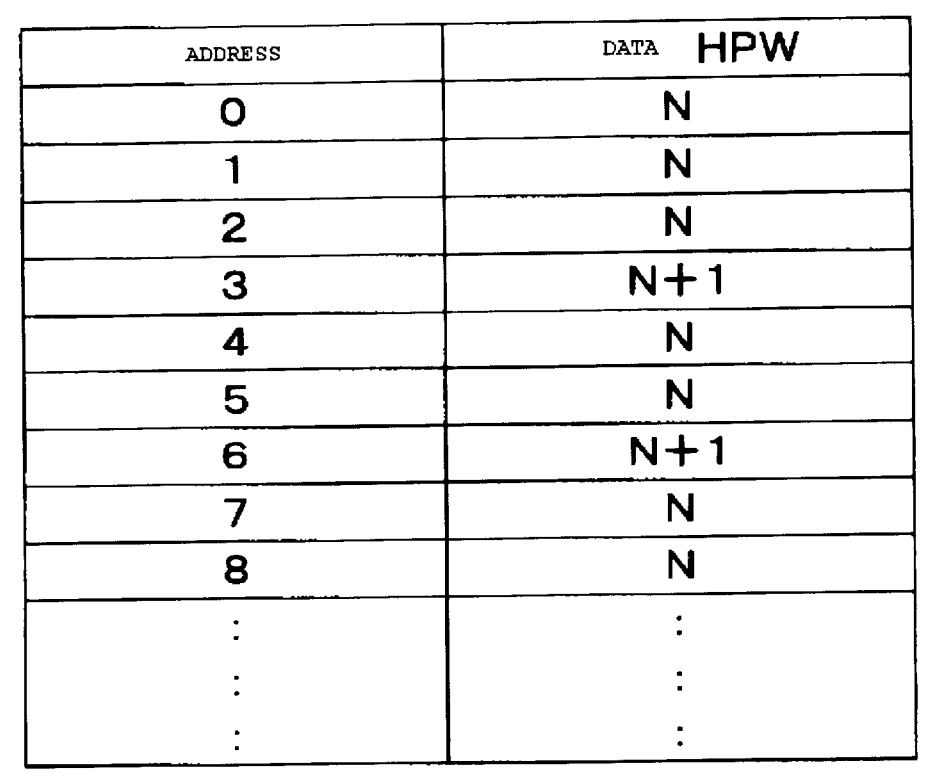

FIG. 23 is a flowchart illustrating the operation of the controller 5 in the third embodiment, showing a different processing for Step 24 (setting the synchronizing signals generating circuit) in the first embodiment. FIG. 24 is an example illustrating the table data of the LUT 25 in the third embodiment.

Table data such as shown in FIG. 24 is stored in the LUT 25 beforehand. This table data is arranged such that the addresses and line positions of output image signals correspond, and N or N+1 is stored as the horizontal cycle count value HPW of the line positions corresponding to the respective addresses (described in detail later).

The synchronizing signal generating circuit 11 is subjected to predetermined initialization by the input vertical synchronizing signals Vi. The vertical synchronizing signal generator 19 outputs the initialized line count results. For example, let us say that the initial value of the line count results is 0.

The line count results output from the vertical synchronizing signal generator 19 are input to the LUT 25. The LUT 25 performs table reading with the initialized line count results as 0, and outputs a horizontal cycle count value HPW.

The horizontal cycle count value HPW is input to the horizontal synchronizing signal generator 18. The horizontal synchronizing signal generator 18 performs counting of the panel clock PCLK, and outputs horizontal synchronizing signals HP based on the horizontal cycle count value HPW output from the LUT 25. The horizontal synchronizing signals HP are input to the vertical synchronizing signal generator 19.

The vertical synchronizing signal generator 19 counts the horizontal synchronizing signal HP and generates vertical synchronizing signals VP, and also outputs the count results of the horizontal synchronizing signal HP as the line count results. For example, in this case, the initial value 0 of the line count results is incremented, and line count results of 1 is output. The line count results are input to the LUT 25. Such operations are repeated until the next Vi is input, thereby generating horizontal synchronizing signals HP.

Next, the operation of the controller 5 at the time of storing the horizontal cycle count value HPW in the LUT 25 will be described. FIG. 23 is a flowchart illustrating the operation of the controller 5 in the third embodiment, showing a different processing for Step 24 (setting the synchronizing signals generating circuit) in the first embodiment.

In step 26, the integer N and decimal $\alpha$ ($0 \leq \alpha < 1$) which is the horizontal cycle information calculated in Step 23 of the flowchart shown in FIG. 14, is obtained. In Step 27, variables YO and j are initialized (YO=0, j=0).

In Step 28, the addition results YO+$\alpha$ are substituted into a variable YA. In Step 29, judgment is made regarding whether or not the variable YA to which the addition results YO+$\alpha$ have been substituted is 1 or more. In the event that YA>1 holds, Step 30 is executed, otherwise Step 31 is executed.

In Step 30, the horizontal cycle count value is calculated as HPW=N+1, and YA-1 (equivalent to the decimal component of YA in the event that YA$\geq$1 holds) is substituted into the variable YO.

On the other hand, in Step 31, the horizontal cycle count value is calculated as HPW=N, and YA is substituted into the variable YA without change. In Step 32, judgment is made whether or not the line is the final line, based on the variable j.

In the event that the line is not the final line, j is also incremented by 1 and the flow returns to Step 28 and repeats the processing until the final line. In the event that the line is the last line, the horizontal cycle count value HPW has been calculated for all lines, and in Step 33 table writing is performed to the LUT 25. Thus, table data for the LUT 25 can be generated.

The horizontal cycle count value HPW generated here is a horizontal cycle count value HPW such that the accumulated margin of error of the horizontal synchronizing signal HP can always be maintained less than the PCLK cycle Tp, as already described with the second embodiment.

Configuring the synchronizing signal generating circuit 11 as described above allows horizontal synchronizing signals HP to be generated with an accumulated margin of error that is always less than the PCLK cycle Tp.

Also, changing the table data of the LUT 25 allows the user to freely adjust the cycle of the horizontal synchronizing signal HP.

Fourth Embodiment

Figure 25:
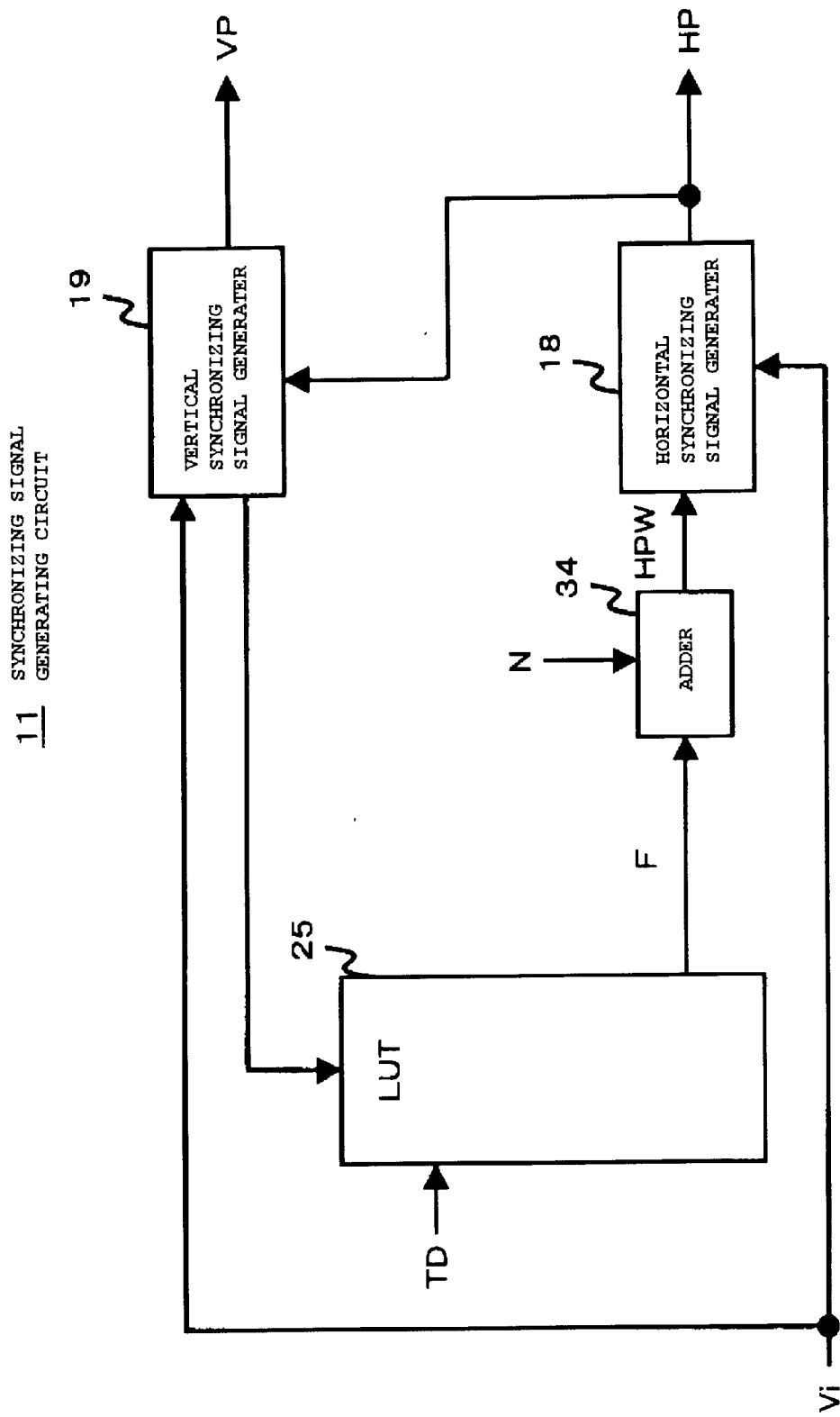
FIG. 25 is a block diagram illustrating the configuration of the synchronizing signal generating circuit according to a fourth embodiment of the present invention.

FIG. 25 is a diagram illustrating the configuration of the synchronizing signal generating circuit 11 according to a fourth embodiment, comprising another configuration of the synchronizing signal generating circuit 11 according to the first embodiment. Reference numeral 18 denotes a horizontal synchronizing signal generator, 19 denotes a vertical synchronizing signal generator, 25 denotes a look-up table (LUT), and 34 denotes an adder.

Figure 26:
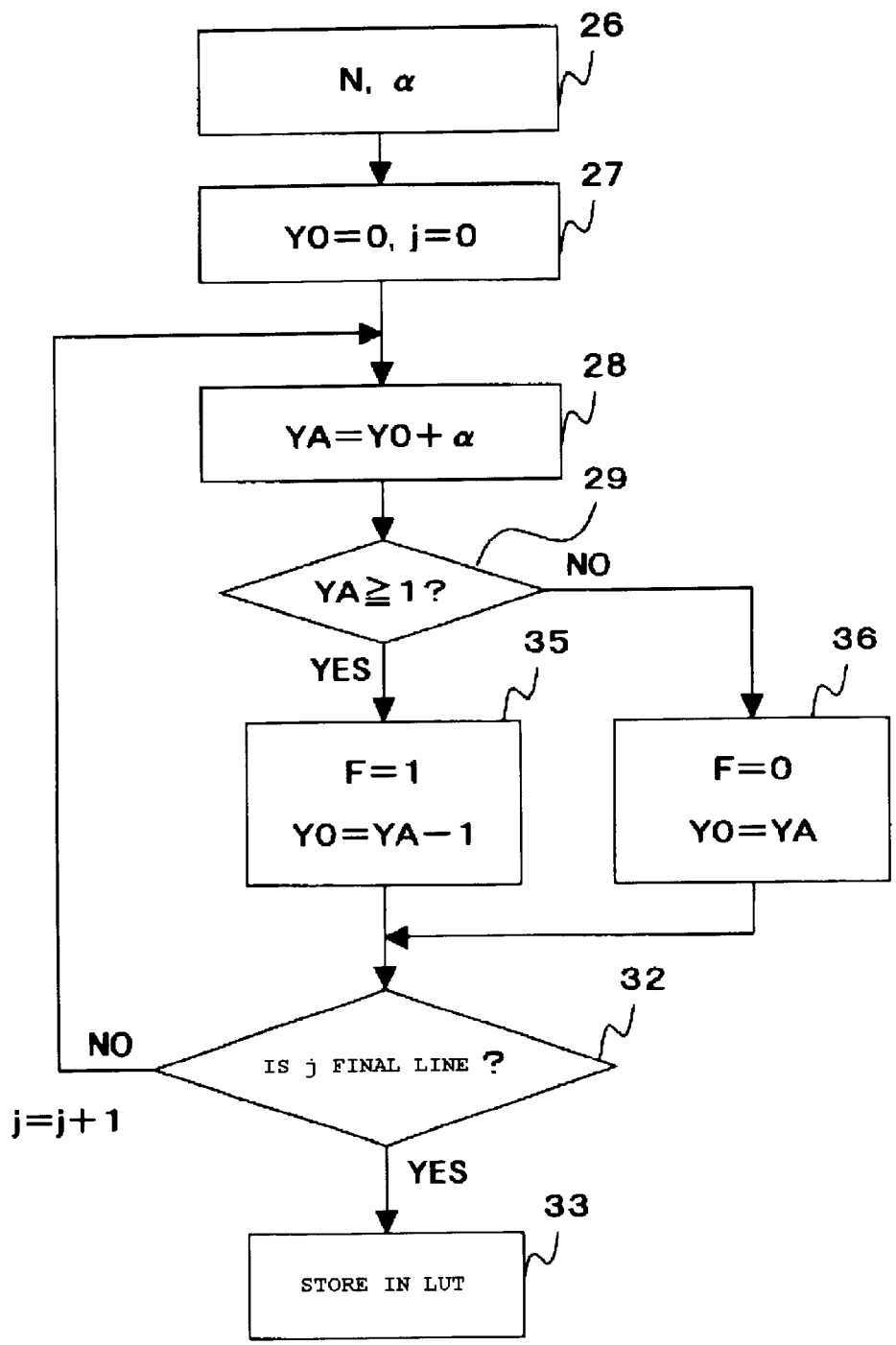
FIG. 26 is a flowchart describing the operation of the controller according to the fourth embodiment of the present invention.
Figure 27:
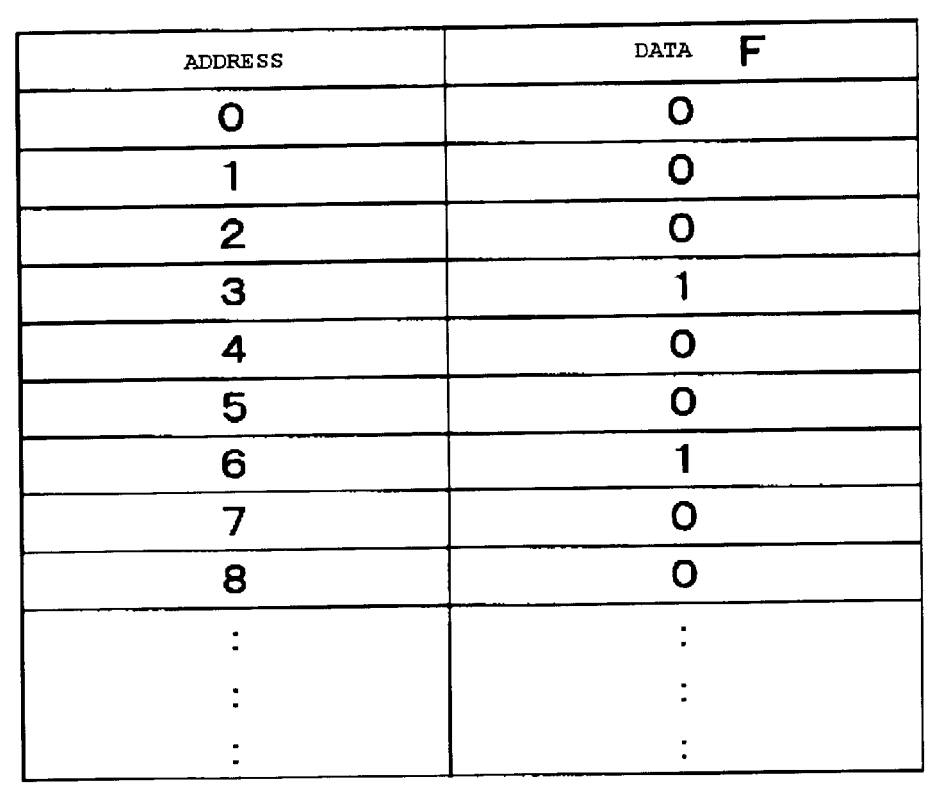

FIG. 26 is a flowchart illustrating the operation of the controller 5 in the fourth embodiment, showing a different processing for Step 24 (setting the synchronizing signals generating circuit) in the first embodiment. FIG. 27 is a diagram illustrating the table data of the LUT 25 in the fourth embodiment.

Table data such as shown in FIG. 27 is stored in the LUT 25 beforehand. This table data is arranged such that the addresses and line positions of output image signals correspond, and addition data F for calculating the horizontal cycle count value HPW of the line positions corresponding to the respective addresses is stored (described in detail later). Here, the addition data F is either 0 or 1.

The synchronizing signal generating circuit 11 is subjected to predetermined initialization by the input vertical synchronizing signals Vi. The vertical synchronizing signal generator 19 outputs the initialized line count results. The line count results output from the vertical synchronizing signal generator 19 are input to the LUT 25.

The LUT 25 performs table reading with the initialized line count results of 0 as the address, and outputs addition data F. The addition data F is input to the adder 34. Also, the integer N which is cycle information of the horizontal synchronizing signal HP is input to the adder 34 via the control signal TD output from the controller 5.

The adder 34 performs adding of the integer N and the addition data F. The addition results represent the horizontal cycle count value HPW of the horizontal synchronizing signal HP; in the event that the addition data F=0 holds, HPW=N, and in the event that the addition data F=1 holds, HPW=N+1.

The horizontal cycle count value HPW output from the adder 34 is input to the horizontal synchronizing signal generator 18. The horizontal synchronizing signal generator 18 performs counting of the panel clock PCLK, and outputs horizontal synchronizing signals HP based on the horizontal cycle count value HPW. The horizontal synchronizing signals HP are input to the vertical synchronizing signal generator 19.

The vertical synchronizing signal generator 19 counts the horizontal synchronizing signal HP and generates vertical synchronizing signals VP, and also outputs the count results of the horizontal synchronizing signal HP as the line count results. The line count results output from the vertical synchronizing signal generator 19 are input to the LUT 25, and the addition data F of the next line is read out of the LUT 25. Such operations are repeated until the next Vi is input, thereby generating horizontal synchronizing signals HP.

Next, the operation of the controller 5 at the time of storing the addition data F in the LUT 25 will be described. FIG. 26 is a flowchart illustrating the operation of the controller 5 in the fourth embodiment, showing a different processing for Step 24 (setting the synchronizing signals generating circuit) in the first embodiment.

In step 26, the integer N and decimal $\alpha$ ($0 \leq \alpha < 1$) which is the horizontal cycle information calculated in Step 23 of the flowchart shown in FIG. 14, is obtained. In Step 27, variables YO and j are initialized (YO=0, j=0).

In Step 28, the addition results YO+$\alpha$ are substituted into a variable YA. In Step 29, judgment is made regarding whether or not the variable YA to which the addition results YO+$\alpha$ have been substituted is 1 or more. In the event that YA$\geq$1 holds, Step 35 is executed, otherwise Step 36 is executed.

In Step 35, 1 is substituted for the addition data F, and YA−1 (equivalent to the decimal component of YA in the event that YA≧1 holds) is substituted into the variable YO. On the other hand, in Step 36, 0 is substituted for the addition data F, and YA is substituted into the variable YO without change.

In Step 32, judgment is made whether or not the line is the final line, based on the variable j. In the event that the line is not the last line, j is incremented by 1 and the flow returns to Step 28 and repeats the processing until the final line.

In the event that the line is the last line, the addition data F has been calculated for all lines, and in Step 33 table writing is performed to the LUT 25. Thus, table data for the LUT 25 can be generated.

The horizontal cycle count value HPW generated here based on the addition data F is a horizontal cycle count value HPW such that the accumulated margin of error of the horizontal synchronizing signal HP can always be maintained less than the PCLK cycle Tp, as already described with the second embodiment.

Configuring the synchronizing signal generating circuit 11 as described above allows horizontal synchronizing signals HP to be generated with an accumulated margin of error that is always less than the PCLK cycle Tp.

Also, changing the table data of the LUT 25 allows the user to freely adjust the cycle of the horizontal synchronizing signal HP.

Also, the LUT 25 according to the fourth embodiment stores addition data F of 0 or 1, and thus can be realized with a smaller circuit size than the LUT 25 according to the third embodiment.

Fifth Embodiment

Figure 28:
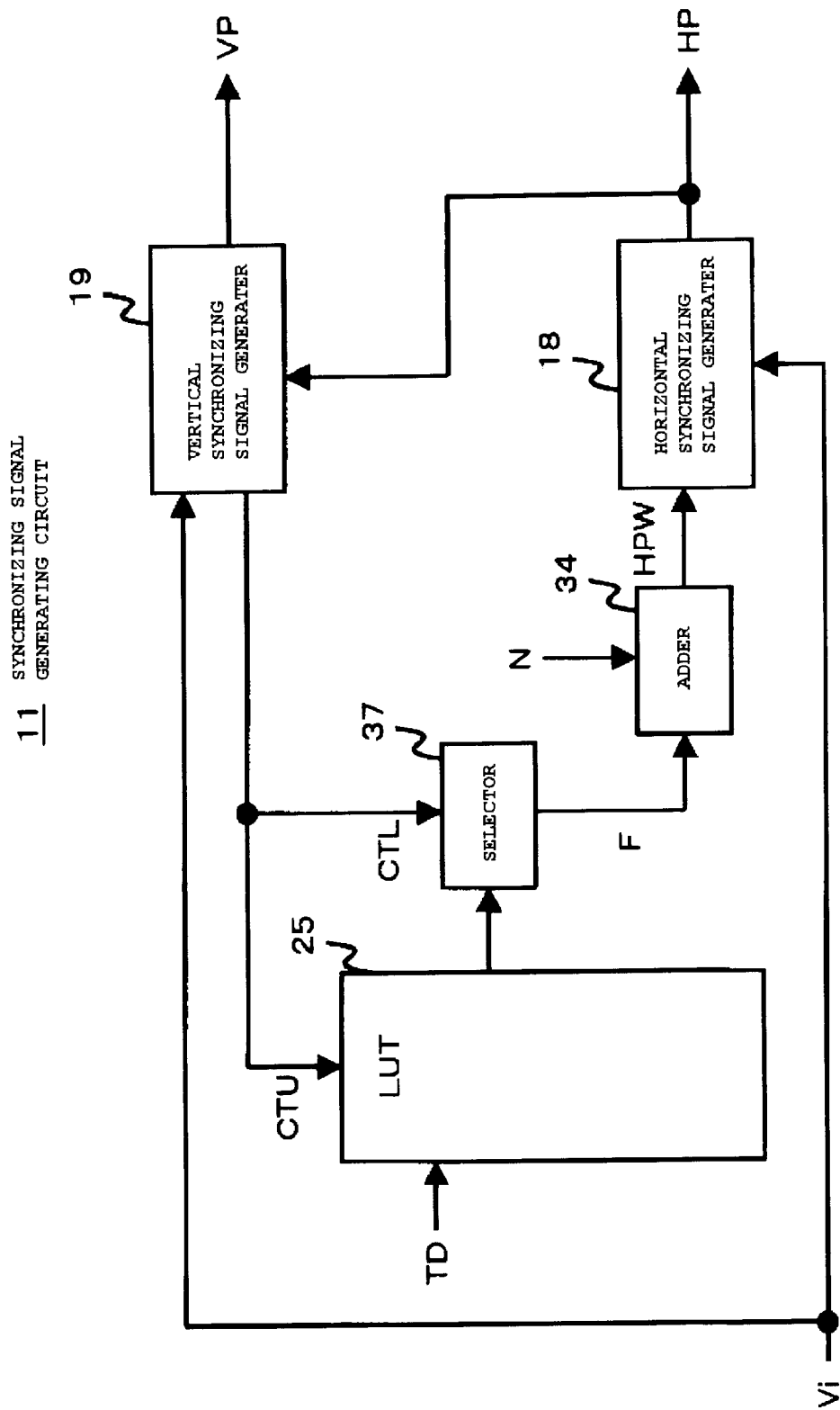
FIG. 28 is a block diagram illustrating the configuration of the synchronizing signal generating circuit according to a fifth embodiment of the present invention.
Figure 29:
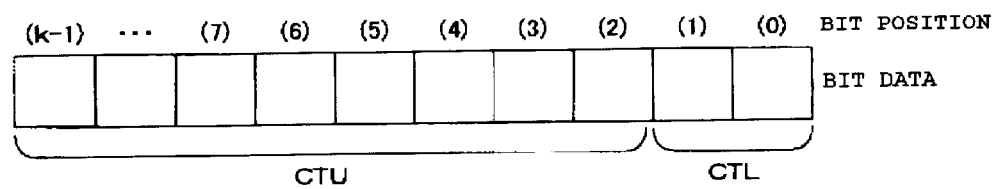
FIGS. 29A through 29C are explanatory diagrams illustrating LUT table data according to the fifth embodiment of the present invention.

FIG. 28 is a diagram illustrating the configuration of the synchronizing signal generating circuit 11 according to a fifth embodiment, comprising another configuration of the synchronizing signal generating circuit 11 according to the first embodiment. Reference numeral 18 denotes a horizontal synchronizing signal generator, 19 denotes a vertical synchronizing signal generator, 25 denotes a look-up table (LUT), 34 denotes an adder, and 37 denotes a selector. FIGS. 29A through 29C are diagrams illustrating the LUT table data according to the fourth embodiment, and the line count results output by the vertical synchronizing signal generating unit 19.

Table data such as shown in FIG. 29A is stored in the LUT 25 beforehand. This figure shows addition data F shown as an example for the description of the third embodiment being grouped into sets of four, and being stored to a single address.

For example, the addition data F corresponding to lines 0 through 3 is stored in bits b0 through b3 at the address 0, and the addition data F corresponding to lines 4 through 7 is stored in bits b0 through b3 at the address 1. According to this configuration, four lines worth of addition data F are stored to one address, so the number of addresses in the LUT 25 is reduced to ¼ of the number of lines.

The synchronizing signal generating circuit 11 is subjected to predetermined initialization by the input vertical synchronizing signals Vi. The vertical synchronizing signal generator 19 outputs the initialized line count results. Address information CTU and bit position information CTL are calculated from the line count results, the address information CTU is input to the LUT 25, and the bit position information CTL is input to the selector 37.

FIG. 29B shows the relation of bit position between the line count results and address information CTU and bit position information CTL. Handling the line count results of binary data of k bits in size, the lower two bits of the line count results correspond to the bit position information CTL, and the upper (k−2) bits correspond to the address information CTU.

The address information CTU and bit position information CTL are the quotient and remainder having divided the line count results by 4, but this can be obtained simply by bit manipulation of the line count results, since the divisor 4 is an exponentiation of 2.

As shown in the example, even in the event that the number of sets of addition data F stored to one address in the LUT 25 is another exponentiation of 2 (e.g., 2, 8, 16, etc.), the address information CTU and bit position information CTL can be obtained with no more than a similar bit manipulation.

FIG. 29C shows the relation between the line count results and address information CTU and bit position information data CTL. In the event that the line count results are 0, 1, 2, and 3, CTU=0 holds, and CTL is 0, 1, 2, and 3. In the event that the line count results are 4 through 7, CTU=1 holds, and in the event that the line count results are 8 through 11, CTU+2 holds. The CTL in this case repeats 0, 1, 2, and 3.

The LUT 25 performs reading out of the table based on the address information CTU, and outputs table data. for example, in the event that the line count results are 6, CTU=1 in the example shown in FIG. 29C, so the address 1 is read out, and making reference to FIG. 29A the table data is "0100" (binary).

The table data "0100" in this case is input to the selector 37. The selector 37 performs predetermined selection from the table data output from the LUT 25, based on the bit position information CTL, and outputs the selected addition data F.

In the event that the line count results are 6 for example, as a selection example for this case, making reference to FIG. 29C the bit position information CTL+2, so "1" which corresponds to data b2 is selected from the table data "0100", and addition data F=1 is output.

The addition data F is input to the adder 34. Also, the integer N which is cycle information of the horizontal synchronizing signal HP is input to the adder 34 via the control signal TD output from the controller 5. Here, the adder 34 performs adding of the integer N and the addition data F.

The addition results represent the horizontal cycle count value HPW of the horizontal synchronizing signal HP; in the event that the addition data F=0 holds, HPW=N, and in the event that the addition data F=1 holds, HPW=N+1. The horizontal cycle count value HPW output from the adder 34 is input to the horizontal synchronizing signal generator 18.

The horizontal synchronizing signal generator 18 performs counting of the panel clock PCLK, and outputs horizontal synchronizing signals HP based on the horizontal cycle count value HPW. The horizontal synchronizing signals HP are input to the vertical synchronizing signal generator 19.

The vertical synchronizing signal generator 19 counts the horizontal synchronizing signal HP and generates vertical synchronizing signals VP, and also outputs the count results of the horizontal synchronizing signal HP as the line count results.

The line count results output from the vertical synchronizing signal generator 19 are input to the LUT 25 and selector 37. Such operations are repeated until the next Vi is input, thereby generating horizontal synchronizing signals HP and vertical synchronizing signals VP.

The operations of the controller 5 at the time of storing the addition data F to the LUT 25 are the same except for the operation of the controller 5 in the fourth embodiment and for Step 33 in the flowchart shown in FIG. 26. Accordingly, here, only step 33 shown in FIG. 26 will be described, and description of the other steps will be omitted.

The controller 5 according to the fifth embodiment stores the addition data for a predetermined number of lines to one address in the LUT 25. In the case of storing four lines of addition data to one address such as the example shown in FIG. 29, the number of address in the table data are reduced to ¼, so the amount of time necessary for storing the table data to the LUT 25 can be reduced.

Sixth Embodiment

Figure 30:
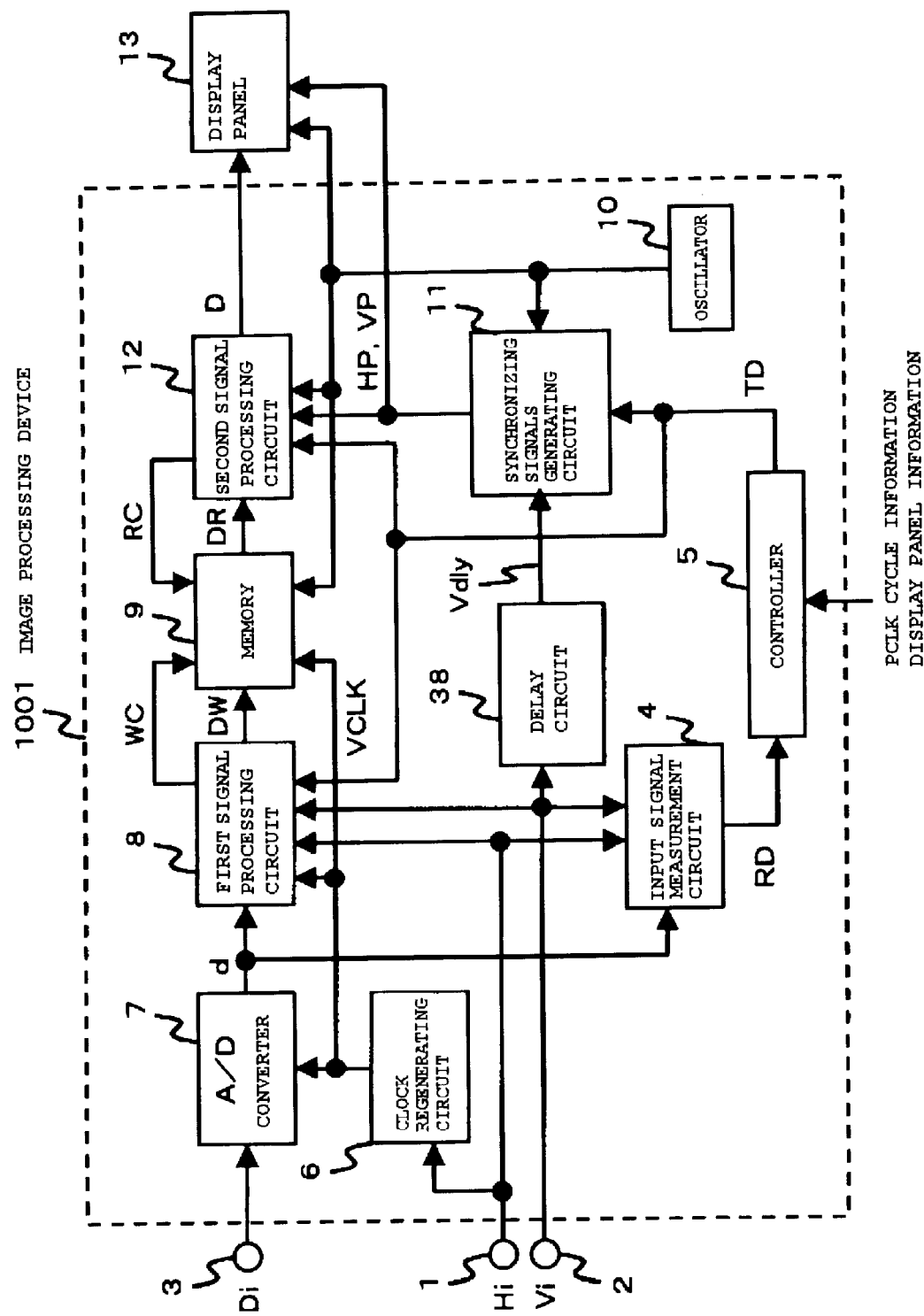
FIG. 30 is a block diagram illustrating the configuration of an image display device and an image processing device according to a sixth embodiment of the present invention.
Figure 31:
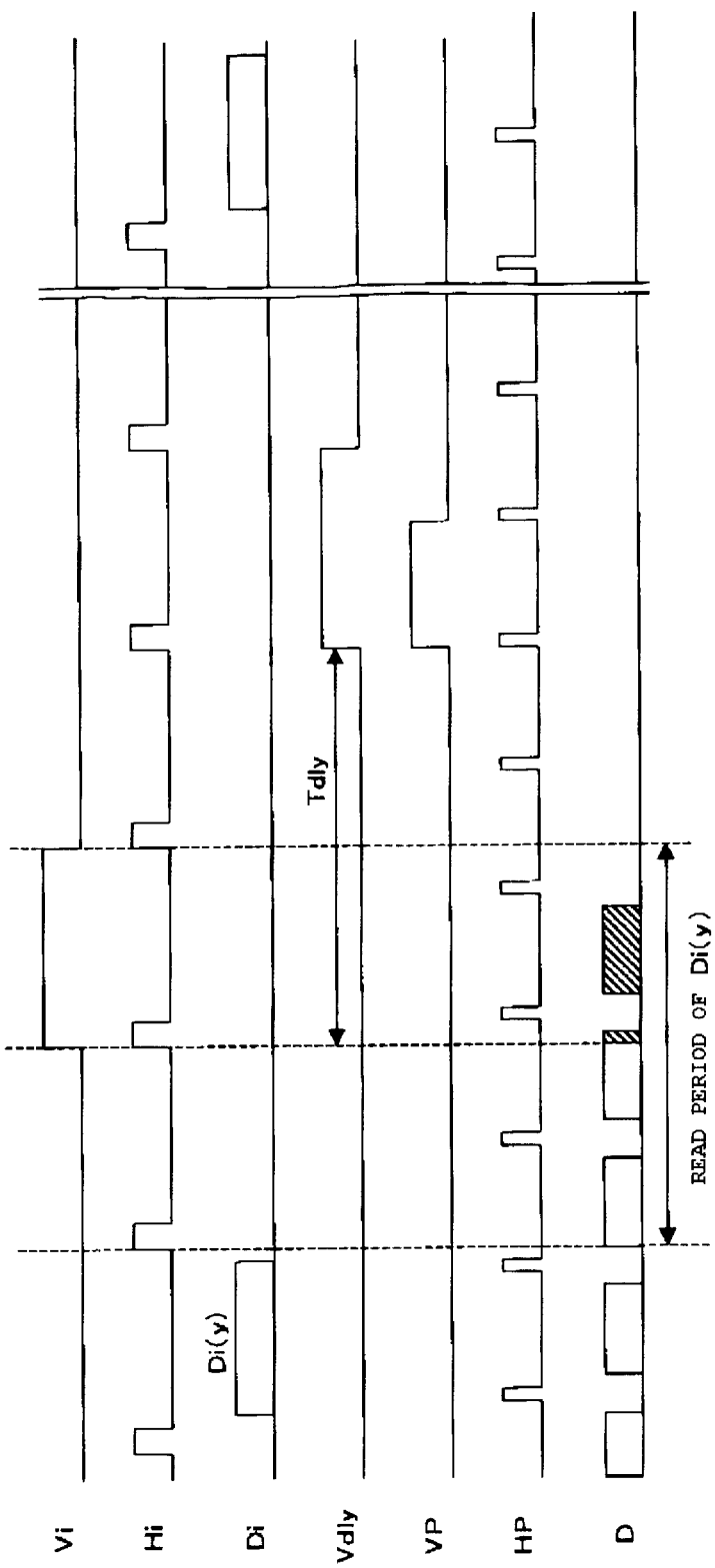
FIG. 31 is an explanatory diagram illustrating the operation of the image display device and image processing device according to the sixth embodiment of the present invention.

FIG. 30 is a diagram illustrating the image display device and image processing device according to a sixth embodiment of the present invention. In the figure, reference numeral 38 denotes a delay circuit. Reference numeral 1001 denotes the image processing device. FIG. 31 is a timing chart for describing the operation of the delay circuit 38.

With the configuration shown in FIG. 30, a delay circuit 38 have been added to the configuration shown in FIG. 12, and other configurations are the same as that described with reference to the first embodiment, so description of the other configurations will be omitted.

Parts other than the delay circuit 38 operate the same as the image display device and image processing device according to the first embodiment. Here, description will be made regarding the operation of the delay circuit 38.

The vertical synchronizing signals Vi of the input image signals are input via the terminal 2 to the input signal measuring circuit 4 and the delay circuit 38. The delay circuit 38 performs predetermined delay processing to the input vertical synchronizing signals Vi, and outputs delayed vertical synchronizing signals Vdly.

The delayed vertical synchronizing signals Vdly output from the delay circuit 38 are input to the first signal processing circuit 8 and the synchronizing signal generating circuit 11. The first signal processing circuit 8 and the synchronizing signal generating circuit 11 operate according to the delayed vertical synchronizing signals Vdly.

FIG. 31 is a timing chart describing the operation of the delay circuit 38. Di(y) represents image data of the final line, where a writing operation to the memory is performed during the line period shown in the figure. Assuming that the line memory is for three lines, for example, one line memory is written to every three lines.

The image data Di(y) is subjected to reading from the memory and interpolation processing during the two-line period following the line regarding which writing has been performed, and image data D which has been subjected to scaling processing is generated. However, in the event that there is only one line for the period from the final line of image data Di(y) to the next vertical synchronizing signal Vi (hereafter referred to as "vertical front porch"), the vertical synchronizing signal Vi is input before the scaling processing of the image ends, so the hatched portion of the image data D subjected to scaling processing cannot be generated.

Conversely, the delay circuit 38 generates a vertical synchronizing signal Vdly wherein the input vertical synchronizing signal Vi has been delayed by an amount of time Tdly. Scaling processing of the image is executed based on this delayed vertical synchronizing signal Vdly, so initialization of the image scaling processing before the scaling processing of the image ends, can be prevented.

The image display device and image processing device according to the sixth embodiment are configured thus, so image scaling processing can be completed for image signals with a short vertical front porch, as well.

Seventh Embodiment

Figure 32:
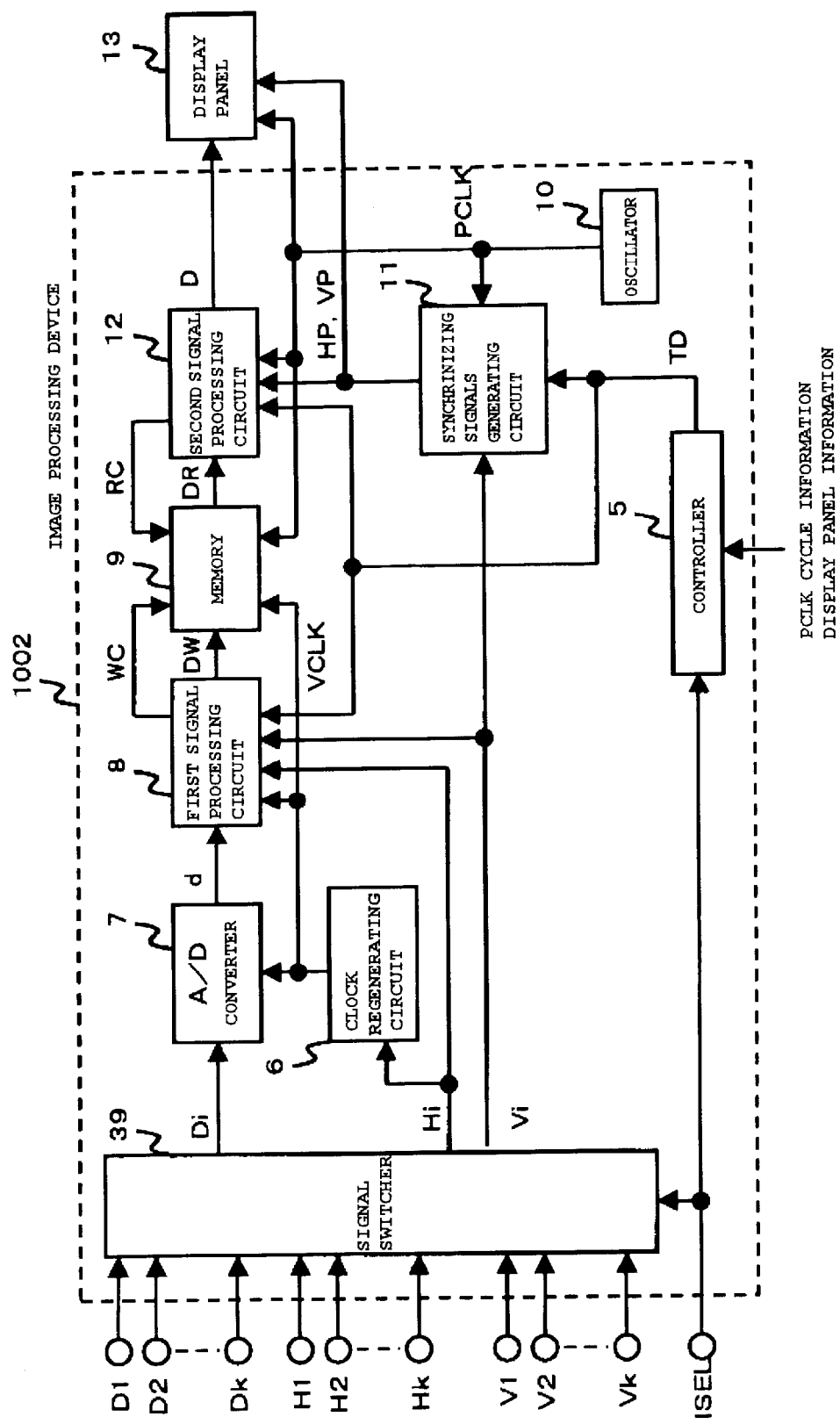
FIG. 32 is a block diagram illustrating the configuration of an image display device and an image processing device according to a seventh embodiment of the present invention.

FIG. 32 is a diagram illustrating the image display device and image processing device according to a seventh embodiment of the present invention. In the figure, reference numeral 39 denotes a signal switcher. Reference numeral 1002 denotes the image processing device. The configuration shown here is a configuration shown in FIG. 12 wherein the input signal measure circuit 4 has been removed and a signal switcher 39 has been added; other configurations are the same as that described with reference to the first embodiment, so description of the other configurations will be omitted.

From the terminals, k types of image signals are input, and the respective image data D1 through Dk, horizontal synchronizing signals H1 through Hk, and vertical synchronizing signals V1 through Vk are input to the signal switcher 39. Let us say that image signals input to one terminal are either individual, or picture signals containing format information. That is to say, format information of the input image signals can be determined for each terminal.

A switching signal ISEL is input to the signal switcher 39 and the controller 5. The signal switcher 39 selects one type of the k types of image signal input based on the switching signal ISEL, and outputs image signals Di and horizontal synchronizing signals Hi and vertical synchronizing signals Vi.

The horizontal synchronizing signals Hi are input to the clock regenerating circuit 6 and the first signal processing circuit 8. The vertical synchronizing signals Vi are input to the first signal processing circuit 8 and the synchronizing signal generating circuit 11. the image signals Di are input to the A/D converter 7.

The controller 5 determines the horizontal synchronizing signal cycle of the selected input image signals and the image size, based on the input switching signal ISEL. Format information of image signals corresponding to the switching signals ISEL are stored in the controller 5, or the configuration is such that format information if the image signals selected via the switching signal ISEL is input to the controller 5.

The controller 5 outputs control signals TD, based on the cycle of the determined horizontal synchronizing signal Hi and input image size, and input display panel information and PCLK cycle information, in order to control the first signal processing circuit 8, the second signal processing circuit 12, and the synchronizing signal generating circuit 11. The operation of the controller 5 has already been described with reference to FIG. 14 and so forth, so description here will be omitted. Also, the other portions have already been described as well, so description thereof will be omitted.

Providing the signal switcher 39 allows image scaling processing to be executed for multiple image input signals of differing formats, even without performing measurement of input image signals, since format information of the image signals can be determined according to the switching signal ISEL.

While various embodiments have been described, the embodiments according to the above description are not necessarily restricted to hardware; rather, the present invention may be realized by software, or by firmware which is a mixture of software and hardware.

The invention may be embodied in other specific forms without departing from the spirit or essential parts thereof. The above embodiments are therefore to be considered in all respects as illustrative and not restrictive, the scope of the invention being indicated by the appended claims rather than by the foregoing description, and all changes which

What is claimed is:

1. An image display device, comprising:

first clock generating means for generating and outputting a first clock based on input horizontal synchronizing signals corresponding to horizontal lines making up input image signals;

second clock generating means for generating and outputting a second clock;

storage means configured so as to accumulate image data sampled from said input image signals based on said first clock using said first clock output from said first clock generating means, and read out said accumulated image data using said second clock output from said second clock generating means;

control means for outputting control signals for controlling the cycle of output horizontal synchronizing signals at the time of reading out and displaying said accumulated image data from said storage means, according to image size information of said input image signals, cycle information of said input horizontal synchronizing signals, and cycle information of said second clock; and synchronizing signal generating means for outputting said output horizontal synchronizing signals based on said control signals output from said control means.

2. The image display device according to claim 1, further comprising input signal measuring means for measuring the cycle of said horizontal synchronizing signals of input image signals and the image size, said measuring means disposed in front of said control means.

3. The image display device according to claim 1, wherein control signals contain first and second cycle information by which the cycle of said second clock is multiplied, and wherein said synchronizing signal generating means output said output horizontal synchronizing signals according to the accumulated addition results of said second cycle information.

4. The image display device according to claim 1, wherein control signals contain first and second cycle information by which the cycle of said second clock is multiplied, and wherein, at the time of said synchronizing signal generating means outputting said output horizontal synchronizing signals according to the accumulated addition results of said second cycle information, the cycle of output horizontal synchronizing signals in the case of exceeding one cycle of the second clock with regard to the accumulated addition results and the cycle of output horizontal synchronizing signals in the case of not exceeding one cycle of the second clock with regard to the accumulated addition results differ.

5. The image display device according to claim 1, wherein output horizontal synchronizing signals are output according to the line position of horizontal lines making up said output image signals.

6. The image display device according to claim 1, wherein, at the time of outputting output horizontal synchronizing signals according to the line position of horizontal lines making up said output image signals, said synchronizing signal generating means outputs said output horizontal synchronizing signals based on the line position of horizontal lines making up output image signals and a certain value by which is multiplied the cycle of said second clock set corresponding to said line position.

7. The image display device according to claim 1, wherein, at the time of outputting output horizontal synchronizing signals according to the line position of horizontal lines making up said output image signals, said synchronizing signal generating means outputs said output horizontal synchronizing signals based on the line position of horizontal lines making up output image signals and an addition value to be added to a certain predetermined value by which is multiplied the cycle of said second clock set corresponding to said line position.

8. The image display device according to claim 1, wherein, at the time of outputting output horizontal synchronizing signals according to the line position of horizontal lines making up said output image signals, said synchronizing signal generating means outputs said output horizontal synchronizing signals based on the line position of horizontal lines making up output image signals and a plurality of predetermined certain values by which are multiplied the cycle of said second clock set corresponding to said line position, said certain value being selected from said plurality of certain values.

9. The image display device according to claim 1, further comprising delay means for delaying vertical synchronizing signals of input image signals.

10. The image display device according to claim 1, further comprising multiple input terminals, wherein input image signals input from said input terminals are selected by external switching signals and wherein said control means outputs control signals corresponding to said switching signals.

11. An image display method comprising the steps of:

generating a first clock based on input horizontal synchronizing signals corresponding to horizontal lines making up input image signals;

generating a second clock;

accumulating in a storage means image data sampled from said input image signals based on said first clock using said first clock;

reading out from said storage means said accumulated image data using said second clock;

outputting control signals for controlling the cycle of output horizontal synchronizing signals at the time of reading out and displaying said accumulated image data from said storage means, according to image size information of said input image signals, cycle information of said input horizontal synchronizing signals, and cycle information of said second clock; and outputting said output horizontal synchronizing signals based on said control signals.

12. The image display device according to claim 11, further comprising a step for measuring the cycle of said horizontal synchronizing signals of input image signals and the image size.

13. The image display device according to claim 11, wherein control signals contain first and second cycle information by which the cycle of said second clock is multiplied, and wherein said output horizontal synchronizing signals are output according to the accumulated addition results of said second cycle information.

14. The image display device according to claim 11, wherein control signals contain first and second cycle information by which the cycle of said second clock is multiplied, and wherein, at the time of outputting said output horizontal synchronizing signals according to the accumulated addition results of said second cycle information, the cycle of output horizontal synchronizing signals in the case of exceeding one cycle of the second clock with regard to the accumulated addition results and the cycle of output horizontal synchronizing signals in the case of not exceeding one cycle of the second clock with regard to said accumulated addition results differ.

15. The image display device according to claim 11, wherein output horizontal synchronizing signals are output according to the line position of horizontal lines making up said output image signals.

16. The image display device according to claim 11, wherein, at the time of outputting output horizontal synchronizing signals according to the line position of horizontal lines making up said output image signals, said output horizontal synchronizing signals are output based on the line position of horizontal lines making up output image signals and a certain value by which is multiplied the cycle of said second clock set corresponding to said line position.

17. The image display device according to claim 11, wherein, at the time of outputting output horizontal synchronizing signals according to the line position of horizontal lines making up said output image signals, said output horizontal synchronizing signals are output based on the line position of horizontal lines making up output image signals and an addition value to be added to a certain predetermined value by which is multiplied the cycle of said second clock set corresponding to said line position.

18. The image display device according to claim 11, wherein, at the time of outputting output horizontal synchronizing signals according to the line position of horizontal lines making up said output image signals, said output horizontal synchronizing signals are output based on the line position of horizontal lines making up output image signals and a plurality of predetermined certain values by which are multiplied the cycle of said second clock set corresponding to said line position, said certain value being selected from a plurality of certain values.

19. The image display device according to claim 11, wherein vertical synchronizing signals of input image signals are delayed.

20. The image display device according to claim 11, wherein multiple input image signals are selected by external switching signals and wherein control signals are output corresponding to said switching signals.

21. A device for converting images, comprising:
an input clock generation module configured to generate an input clock based on input horizontal synchronization signals;
an output synchronization signal generation module configured to generate output vertical and horizontal synchronization signals based on said input horizontal synchronization signals and input vertical synchronization signals; and
an image conversion module configured to generate output image signals based on input image signals and on said output vertical and horizontal synchronization signals.

22. The device of claim 21, wherein said output synchronization signal generation module comprises:
an input signal measurement circuit configured to measure a cycle of said input horizontal synchronizing signals and an image size of said input image signals;
a panel clock generator configured to generate a panel clock;
a controller configured to calculate horizontal and vertical conversion ratios and a cycle of said output horizontal synchronization signals based on output from said input signal measurement circuit, and a cycle Tp of said panel clock; and
a synchronization signal generating circuit configured to generate said output horizontal and vertical synchronization signals based on said input vertical synchronization signals, said panel clock, and information output from said controller.

23. The device of claim 22, wherein said panel clock is asynchronous with respect to said input clock.

24. The device of claim 22, wherein said image conversion module comprises:
an A/D converter configured to convert said input image signals to sampled video signals based on said input clock;
a first signal processing circuit configured to generate image data of said sampled video signals based on said information output from said controller and said input horizontal and vertical synchronization signals; and
a second signal processing circuit configured to generate said output image signals based on said image data, said information output from said controller, said panel clock, and said output horizontal and vertical synchronization signals.

25. The device of claim 24, wherein said second signal processing circuit is configured to performed image size conversion of said image data based on said horizontal and vertical conversion ratios.

26. The device of claim 24, further comprising a memory, wherein said first signal processing circuit is configured to write said image data into said memory and said second signal processing circuit is configured to read said image data from said memory.

27. The device of claim 22, wherein said controller is further configured to calculate said horizontal and vertical conversion ratios and said cycle of said output horizontal synchronization signals based on a size of a display panel.

28. A method for converting images, comprising:
generating an input clock based on input horizontal synchronization signals;
generating output vertical and horizontal synchronization signals based on said input horizontal synchronization signals and input vertical synchronization signals; and
generating output image signals based on input image signals and on said output vertical and horizontal synchronization signals.

29. The method of claim 28, wherein the step of generating said output vertical and horizontal synchronization signals comprises:
measuring a cycle of said input horizontal synchronizing signals and an image size of said input image signals;
generating a panel clock;
calculating horizontal and vertical conversion ratios and a cycle of said output horizontal synchronization signals based on results of said measuring step, and a cycle Tp of said panel clock; and
generating said output horizontal and vertical synchronization signals based on said input vertical synchronization signals, said panel clock, and results from said calculating step.

30. The method of claim 29, wherein said panel clock is asynchronous with respect to said input clock.

31. The method of claim 29, wherein the step of generating output image signals comprises:
converting said input image signals to sampled video signals based on said input clock;
generating image data of said sampled video signals based on said vertical and horizontal conversions ratios, said cycle of said output horizontal synchronization signals, and said input horizontal and vertical synchronization signals; and generating said output image signals based on said image data, said cycle of said output horizontal synchronization signals, said panel clock, and said output horizontal and vertical synchronization signals.

32. The method of claim 31, wherein the step of generating said output image signals comprises performing image size conversion of said image data based on said horizontal and vertical conversion ratios.

33. The method of claim 31, further comprising:
writing said image data into a memory; and
reading said image data from said memory in the step of generating said output image signals.

34. The method of claim 29, wherein the step of calculating said horizontal and vertical conversion ratios and said cycle of said output horizontal synchronization signals includes calculating based on a size of a display panel.

35. The image display device according to claim 1, wherein said control means is further configured to output control signals for controlling the cycle of output horizontal synchronizing signals according to a display panel size information.

36. An image display method according to claim 11, wherein the step of outputting control signals further comprises controlling the cycle of output horizontal synchronizing signals according to a display panel size information.

37. The device of claim 22, wherein said synchronization signal generating circuit is configured to:
receive a first cycle information N and a second cycle information $\alpha$ from said controller, wherein N is an integer and $\alpha$ is a decimal such that $0 \leq \alpha < 1$ and wherein a relationship between an ideal cycle Tid of output horizontal synchronization signal and the cycle Tp of the panel clock is such that $Tid=(N+\alpha)*Tp$;
determine, over iterations of outputting the horizontal synchronization signals, whether or not an adjustment is needed at each iteration;
generate the output horizontal synchronization signal after N cycles of the panel clock in a current iteration if it is determined that the adjustment is not needed; and
generate the output horizontal synchronization signal after N+k cycles of the panel clock in the current iteration if it is determined that the adjustment is needed, wherein k is an integer.

38. The device of claim 37, wherein k=1.

39. The device of claim 37, wherein said synchronization signal generating circuit is further configured to generate the output vertical synchronization signal substantially synchronized with the output horizontal synchronization signal upon receipt of the input vertical synchronization signal.

40. The device of claim 22, wherein said synchronization signal generating circuit is configured to:
receive a first cycle information N' and a second cycle information $\alpha$, wherein N' is an integer and $\beta$ is a decimal such that $0 \leq \beta < 1$ and wherein a relationship between an ideal cycle Tid of output horizontal synchronization signal and the cycle Tp of the panel clock is such that $Tid=(N'-\beta)*Tp$;
determine, over iterations of outputting the horizontal synchronization signals, whether or not an adjustment is needed at each iteration;
generate the output horizontal synchronization signal after N' cycles of the panel clock in a current iteration if it is determined that the adjustment is not needed; and
generate the output horizontal synchronization signal after N'–k cycles of the panel clock in the current iteration if it is determined that the adjustment is needed, wherein k is an integer.

41. The device of claim 40, wherein k=1.

42. The device of claim 40, wherein said synchronization signal generating circuit is further configured to generate the output vertical synchronization signal substantially synchronized with the output horizontal synchronization signal upon receipt of the input vertical synchronization signal.

43. The method of claim 29, wherein said step of generating said output horizontal and vertical signals comprises:
receiving a first cycle information N and a second cycle information $\alpha$, wherein N is an integer and $\alpha$ is a decimal such that $0 \leq \alpha < 1$ and wherein a relationship between an ideal cycle Tid of output horizontal synchronization signal and the cycle Tp of the panel clock is such that $Tid=(N+\alpha)*Tp$;
determining, over iterations of outputting the horizontal synchronization signals, whether or not an adjustment is needed at each iteration;
generating the output horizontal synchronization signal after N cycles of the panel clock in a current iteration if it is determined that the adjustment is not needed; and
generating the output horizontal synchronization signal after N+k cycles of the panel clock in the current iteration if it is determined that the adjustment is needed, wherein k is an integer.

44. The method of claim 43, wherein k=1.

45. The method of claim 43, wherein said step of generating said output horizontal and vertical signals further comprises generating the output vertical synchronization signal substantially synchronized with the output horizontal synchronization signal upon receipt of the input vertical synchronization signal.

46. The method of claim 29, wherein said step of generating said output horizontal and vertical signals comprises:
receiving a first cycle information N' and a second cycle information $\alpha$, wherein N' is an integer and $\beta$ is a decimal such that $0 \leq \beta < 1$ and wherein a relationship between an ideal cycle Tid of output horizontal synchronization signal and the cycle Tp of the panel clock is such that $Tid=(N'-\beta)*Tp$;
determining, over iterations of outputting the horizontal synchronization signals, whether or not an adjustment is needed at each iteration;
generating the output horizontal synchronization signal after N' cycles of the panel clock in a current iteration if it is determined that the adjustment is not needed; and
generating the output horizontal synchronization signal after N'–k cycles of the panel clock in the current iteration if it is determined that the adjustment is needed, wherein k is an integer.

47. The method of claim 46, wherein k=1.

48. The method of claim 46, wherein said step of generating said output horizontal and vertical signals further comprises generating the output vertical synchronization signal substantially synchronized with the output horizontal synchronization signal upon receipt of the input vertical synchronization signal.

49. A synchronizing signal generating circuit, comprising:
a horizontal cycle count determiner configured to output a horizontal cycle count HPW based on a first cycle information N and a second cycle information $\alpha$, wherein:
N is an integer and $\alpha$ is a decimal such that $0 \leq \alpha < 1$,
a relationship between an ideal cycle Tid of an output horizontal synchronizing signal and a cycle Tp of a panel clock is $Tid=(N+\alpha)*Tp$, HPW=N if an adjustment is not needed in a current iteration of generating the output horizontal synchronizing signal, and HPW=N+k if an adjustment is needed in the current iteration, wherein k is an integer; and a horizontal synchronizing signal generator configured to receive the horizontal cycle count HPW and generate the output horizontal synchronizing signal after counting HPW cycles of the panel clock during the current iteration.

50. The synchronizing signal generating circuit of claim 49, further comprising a vertical synchronizing signal generator configured to generate an output vertical synchronizing signal substantially synchronized with the output horizontal synchronizing signal upon receipt of an input vertical synchronizing signal.

51. The synchronizing signal generating circuit of claim 49, wherein said horizontal cycle count determiner comprises:

an adjustment indicator circuit configured to receive the second cycle information $\alpha$ and to output an adjustment indicating information C to indicate whether or not the adjustment is needed in the current iteration; and a horizontal cycle generating unit configured to receive the adjustment indicating information C from said adjustment indicator circuit and to output the horizontal cycle count HPW such that HPW=N if C indicates that the adjustment is not needed in the current iteration and HPW=N+k if C indicates that the adjustment is needed in the current iteration.

52. The synchronizing signal generating circuit of claim 51, wherein k=1 and wherein said adjustment indicator circuit comprises:

an adder configured to receive the second cycle information $\alpha$ and to receive a previous iteration accumulated value A' to output a current iteration accumulated value A such that A=A'+$\alpha$;

a delay device configured to receive the current iteration accumulated value A and to output A as A' in a next iteration; and a comparator configured to compare integer portions of A and A' and output C to indicate that the adjustment is not needed in the current iteration if the integer portions of A and A' are equal and output C to indicate that the adjustment is needed in the current iteration if the integer portions of A and A' are not equal.

53. The synchronizing signal generating circuit of claim 51, wherein k=1 and wherein said adjustment indicator circuit comprises:

an adder configured to receive the second cycle information $\alpha$ and to receive a previous iteration accumulated value B' to output a current iteration accumulated value B such that B=B'+$\alpha$; and a delay device configured to receive the current iteration accumulated value B and to output a decimal component of B as B' in a next iteration, wherein an integer portion of B serves as the adjustment indicator for the current iteration.

54. The synchronizing signal generating circuit of claim 49, wherein said horizontal cycle count determiner comprises:

a look-up table such that each address of said look-up table includes a value of the horizontal cycle count HPW, wherein said look-up table is configured to output a corresponding HPW value upon input of an address value; and a vertical synchronizing signal generator configured to supply to said look-up table a line count value in the current iteration, wherein the line count value is used as the address value for the look-up table.

55. The synchronizing signal generating circuit of claim 54, wherein said vertical synchronizing signal generator is further configured to:

generate an output vertical synchronizing signal substantially synchronized with the output horizontal synchronizing signal upon receipt of an input vertical synchronizing signal, and generate an initial line count value upon receipt of an input vertical synchronizing signal.

56. The synchronizing signal generating circuit of claim 49, wherein said horizontal cycle count determiner comprises:

a look-up table such that each address of said look-up table includes an add value F, wherein said look-up table is configured to output the corresponding add value F upon input of an address value;

an adder configured to receive the first cycle information N and the add value F and output the horizontal cycle count HPW such that HPW=N+F; and a vertical synchronizing signal generator configured to supply to said look-up table a line count value in the current iteration, wherein the line count value is used as the address value for the look-up table.

57. The synchronizing signal generating circuit of claim 56, wherein said vertical synchronizing signal generator is further configured to:

generate an output vertical synchronizing signal substantially synchronized with the output horizontal synchronizing signal upon receipt of an input vertical synchronizing signal, and generate an initial line count value upon receipt of an input vertical synchronizing signal.

58. The synchronizing signal generating circuit of claim 49, wherein said horizontal cycle count determiner comprises:

a look-up table such that each address of said look-up table includes multiple add values with each add value F occupying particular bit positions, wherein said look-up table is configured to output the corresponding multiple add values upon input of an address value CTU;

a selector configured to receive the multiple add values from the look-up table and select a particular add value F upon input of a selector value CTL;

an adder configured to receive the first cycle information N and the particular add value F and output the horizontal cycle count HPW such that HPW=N+F; and a vertical synchronizing signal generator configured to supply the address value CTU to said look-up table and the selector value CTL to said look-up table in the current iteration.

59. The synchronizing signal generating circuit of claim 58, wherein said vertical synchronizing signal generator is further configured to:

generate an output vertical synchronizing signal substantially synchronized with the output horizontal synchronizing signal upon receipt of an input vertical synchronizing signal, and generate an initial line count value upon receipt of an input vertical synchronizing signal.

60. A synchronizing signal generating circuit, comprising:
a horizontal cycle count determiner configured to output a horizontal cycle count HPW based on a first cycle information N' and a second cycle information β, wherein:
N' is an integer and β is a decimal such that $0 \leq \beta < 1$,
a relationship between an ideal cycle Tid of an output horizontal synchronizing signal and a cycle Tp of a panel clock is Tid=(N'-β)*Tp,
HPW=N' if an adjustment is not needed in a current iteration of generating the output horizontal synchronizing signal, and
HPW=N'-k if an adjustment is needed in the current iteration, wherein k' is an integer; and
a horizontal synchronizing signal generator configured to receive the horizontal cycle count HPW and generate the output horizontal synchronizing signal after counting HPW cycles of the panel clock during the current iteration.

61. The synchronizing signal generating circuit of claim 60, further comprising a vertical synchronizing signal generator configured to generate an output vertical synchronizing signal substantially synchronized with the output horizontal synchronizing signal upon receipt of an input vertical synchronizing signal.

62. The synchronizing signal generating circuit of claim 60, wherein said horizontal cycle count determiner comprises:
an adjustment indicator circuit configured to receive the second cycle information β and to output an adjustment indicating information C to indicate whether or not the adjustment is needed in the current iteration; and
a horizontal cycle generating unit configured to receive the adjustment indicating information C from said adjustment indicator circuit and to output the horizontal cycle count HPW such that HPW=N' if C indicates that the adjustment is not needed in the current iteration and HPW=N'-k if C indicates that the adjustment is needed in the current iteration.

63. The synchronizing signal generating circuit of claim 62, wherein k=1 and wherein said adjustment indicator circuit comprises:
an adder configured to receive the second cycle information β and to receive a previous iteration accumulated value A' to output a current iteration accumulated value A such that A=A'+β;
a delay device configured to receive the current iteration accumulated value A and to output A as A' in a next iteration; and
a comparator configured to compare integer portions of A and A' and output C to indicate that the adjustment is not needed in the current iteration if the integer portions of A and A' are equal and output C to indicate that the adjustment is needed in the current iteration if the integer portions of A and A' are not equal.

64. The synchronizing signal generating circuit of claim 62, wherein k=1 and wherein said adjustment indicator circuit comprises:
an adder configured to receive the second cycle information α and to receive a previous iteration accumulated value B' to output a current iteration accumulated value B such that B=B'+β; and
a delay device configured to receive the current iteration accumulated value B and to output a decimal component of B as B' in a next iteration,
wherein an integer portion of B serves as the adjustment indicator for the current iteration.

65. The synchronizing signal generating circuit of claim 60, wherein said horizontal cycle count determiner comprises:
a look-up table such that each address of said look-up table includes a value of the horizontal cycle count HPW, wherein said look-up table is configured to output a corresponding HPW value upon input of an address value; and
a vertical synchronizing signal generator configured to supply to said look-up table a line count value in the current iteration, wherein the line count value is used as the address value for the look-up table.

66. The synchronizing signal generating circuit of claim 65, wherein said vertical synchronizing signal generator is further configured to:
generate an output vertical synchronizing signal substantially synchronized with the output horizontal synchronizing signal upon receipt of an input vertical synchronizing signal, and
generate an initial line count value upon receipt of an input vertical synchronizing signal.

67. The synchronizing signal generating circuit of claim 60, wherein said horizontal cycle count determiner comprises:
a look-up table such that each address of said look-up table includes a subtract value F', wherein said look-up table is configured to output the corresponding add value F upon input of an address value;
an adder configured to receive the first cycle information N' and the subtract value F' and output the horizontal cycle count HPW such that HPW=N'-F'; and
a vertical synchronizing signal generator configured to supply to said look-up table a line count value in the current iteration, wherein the line count value is used as the address value for the look-up table.

68. The synchronizing signal generating circuit of claim 67, wherein said vertical synchronizing signal generator is further configured to:
generate an output vertical synchronizing signal substantially synchronized with the output horizontal synchronizing signal upon receipt of an input vertical synchronizing signal, and
generate an initial line count value upon receipt of an input vertical synchronizing signal.

69. The synchronizing signal generating circuit of claim 60, wherein said horizontal cycle count determiner comprises:
a look-up table such that each address of said look-up table includes multiple subtract values with each add subtract P occupying particular bit positions, wherein said look-up table is configured to output the corresponding multiple subtract values upon input of an address value CTU;
a selector configured to receive the multiple subtract values from the look-up table and select a particular subtract value F' upon input of a selector value CTL;
an adder configured to receive the first cycle information N and the particular subtract value F' and output the horizontal cycle count HPW such that HPW=N'-F; and
a vertical synchronizing signal generator configured to supply the address value CTU to said look-up table and the selector value CTL to said look-up table in the current iteration.

70. The synchronizing signal generating circuit of claim 69, wherein said vertical synchronizing signal generator is further configured to:

generate an output vertical synchronizing signal substantially synchronized with the output horizontal synchronizing signal upon receipt of an input vertical synchronizing signal, and generate an initial line count value upon receipt of an input vertical synchronizing signal.

71. A method for generating synchronizing signals, comprising:

generating a horizontal cycle count HPW based on a first cycle information N and a second cycle information $\alpha$, wherein:

N is an integer and $\alpha$ is a decimal such that $0 \leq \alpha < 1$, a relationship between an ideal cycle Tid of an output horizontal synchronizing signal and a cycle Tp of a panel clock is Tid=(N+$\alpha$)*Tp, HPW=N if an adjustment is not needed in a current iteration of generating the output horizontal synchronizing signal, and HPW=N+k if an adjustment is needed in the current iteration, wherein k is an integer; and generating the output horizontal synchronizing signal after counting HPW cycles of the panel clock during the current iteration.

72. The method for generating synchronizing signals of claim 71, further comprising generating an output vertical synchronizing signal substantially synchronized with the output horizontal synchronizing signal upon receipt of an input vertical synchronizing signal.

73. The method for generating synchronizing signals of claim 71, wherein said step of generating the horizontal cycle count HPW comprises:

determining whether or not the adjustment is needed in the current iteration;

generating the horizontal cycle count HPW such that HPW=N if it is determined that the adjustment is not needed in the current iteration; and generating the horizontal cycle count HPW such that HPW=N+k if it is determined that the adjustment is needed in the current iteration.

74. The method for generating synchronizing signals of claim 73, wherein k=1 and wherein said step of determining whether or not the adjustment is needed comprises:

receiving the second cycle information $\alpha$;

receiving a previous iteration accumulated value A';

generating a current iteration accumulated value A such that A=A'+$\alpha$;

outputting the current iteration accumulated value A in a next iteration as the previous accumulated value A';

comparing A and A' in the current iteration;

indicating that the adjustment is not needed in the current iteration if integer portions of A and A' are equal; and indicating that the adjustment is needed in the current iteration if the integer portions of A and A' are not equal.

75. The method for generating synchronizing signals of claim 73, wherein k=1 and wherein said adjustment indicator circuit comprises:

receiving the second cycle information $\alpha$;

receiving a previous iteration accumulated value B';

generating a current iteration accumulated value B such that B=B'+$\alpha$;

outputting a decimal component of the current iteration accumulated value B in a next iteration as the previous accumulated value B'; and indicating that the adjustment is not needed in the current iteration if the integer portion of B=0; and indicating that the adjustment is needed in the current iteration if the integer portion of B$\neq$0.

76. The method for generating synchronizing signals of claim 71, wherein said step of generating the horizontal cycle count HPW comprises:

generating a line count value in the current iteration;

supplying the line count value as an address to a look-up table, wherein each address of said look-up table includes a value of the horizontal cycle count HPW; and generating the horizontal cycle count HPW based on an output from said look-up table.

77. The method for generating synchronizing signals of claim 76, further comprising:

generating an output vertical synchronizing signal substantially synchronized with the output horizontal synchronizing signal upon receipt of an input vertical synchronizing signal; and generating an initial line count value upon receipt of an input vertical synchronizing signal.

78. The method for generating synchronizing signals of claim 71, wherein said step of generating the horizontal cycle count HPW comprises:

generating a line count value in the current iteration;

supplying the line count value as an address to a look-up table, wherein said each address of said look-up table includes an add value F; and generating the horizontal cycle count HPW by adding the add value F output from said look-up table and the first cycle information N such that HPW=N+F.

79. The method for generating synchronizing signals of claim 78, further comprising:

generating an output vertical synchronizing signal substantially synchronized with the output horizontal synchronizing signal upon receipt of an input vertical synchronizing signal; and generating an initial line count value upon receipt of an input vertical synchronizing signal.

80. The method for generating synchronizing signals of claim 71, wherein said step of generating the horizontal cycle count HPW comprises:

generating an address value CTU and a selector value CTL in the current iteration;

supplying the address value CTU as an address to a look-up table, wherein said each address of said look-up table includes multiple add values with each add value F occupying particular bit positions;

receiving the multiple add values output from said look-up table;

selecting a particular add value F from the multiple add values based on the selector value CTL;

generating the horizontal cycle count HPW by adding the particular add value F and the first cycle information N such that HPW=N+F.

81. The method for generating synchronizing signals of claim 80, further comprising:

generating an output vertical synchronizing signal substantially synchronized with the output horizontal synchronizing signal upon receipt of an input vertical synchronizing signal; and generating an initial line count value upon receipt of an input vertical synchronizing signal.

82. A method for generating synchronizing signals, comprising:

generating a horizontal cycle count HPW based on a first cycle information N' and a second cycle information β, wherein:
N' is an integer and β is a decimal such that $0 \leq \beta < 1$,
a relationship between an ideal cycle Tid of an output horizontal synchronizing signal and a cycle Tp of a panel clock is $Tid=(N'-\beta)*Tp$,
HPW=N' if an adjustment is not needed in a current iteration of generating the output horizontal synchronizing signal, and
HPW=N'-k if an adjustment is needed in the current iteration, wherein k is an integer; and generating the output horizontal synchronizing signal after counting HPW cycles of the panel clock during the current iteration.

83. The method for generating synchronizing signals of claim 82, further comprising generating an output vertical synchronizing signal substantially synchronized with the output horizontal synchronizing signal upon receipt of an input vertical synchronizing signal.

84. The method for generating synchronizing signals of claim 82, wherein said step of generating the horizontal cycle count HPW comprises:

determining whether or not the adjustment is needed in the current iteration;

generating the horizontal cycle count HPW such that HPW=N' if it is determined that the adjustment is not needed in the current iteration; and generating the horizontal cycle count HPW such that HPW=N'-k if it is determined that the adjustment is needed in the current iteration.

85. The method for generating synchronizing signals of claim 84, wherein k=1 and wherein said step of determining whether or not the adjustment is needed comprises:

receiving the second cycle information β;

receiving a previous iteration accumulated value A';

generating a current iteration accumulated value A such that A=A'+β;

outputting the current iteration accumulated value A in a next iteration as the previous accumulated value A';

comparing A and A' in the current iteration;

indicating that the adjustment is not needed in the current iteration if integer portions of A and A' are equal; and indicating that the adjustment is needed in the current iteration if the integer portions of A and A' are not equal.

86. The method for generating synchronizing signals of claim 84, wherein k=1 and wherein said adjustment indicator circuit comprises:

receiving the second cycle information β;

receiving a previous iteration accumulated value B';

generating a current iteration accumulated value B such that B=B'+α;

outputting a decimal component of the current iteration accumulated value B in a next iteration as the previous accumulated value B'; and indicating that the adjustment is not needed in the current iteration if the integer portion of B=0; and indicating that the adjustment is needed in the current iteration if the integer portion of B≠0.

87. The method for generating synchronizing signals of claim 82, wherein said step of generating the horizontal cycle count HPW comprises:

generating a line count value in the current iteration;

supplying the line count value as an address to a look-up table, wherein each address of said look-up table includes a value of the horizontal cycle count HPW; and generating the horizontal cycle count HPW based on an output from said look-up table.

88. The method for generating synchronizing signals of claim 87, further comprising:

generating an output vertical synchronizing signal substantially synchronized with the output horizontal synchronizing signal upon receipt of an input vertical synchronizing signal; and generating an initial line count value upon receipt of an input vertical synchronizing signal.

89. The method for generating synchronizing signals of claim 82, wherein said step of generating the horizontal cycle count HPW comprises:

generating a line count value in the current iteration;

supplying the line count value as an address to a look-up table, wherein said each address of said look-up table includes an subtract value F'; and generating the horizontal cycle count HPW by subtracting the subtract value F' output from said look-up table and the first cycle information N' such that HPW=N'-F'.

90. The method for generating synchronizing signals of claim 89, further comprising:

generating an output vertical synchronizing signal substantially synchronized with the output horizontal synchronizing signal upon receipt of an input vertical synchronizing signal; and generating an initial line count value upon receipt of an input vertical synchronizing signal.

91. The method for generating synchronizing signals of claim 82, wherein said step of generating the horizontal cycle count HPW comprises:

generating an address value CTU and a selector value CTL in the current iteration;

supplying the address value CTU as an address to a look-up table, wherein said each address of said look-up table includes multiple subtract values with each subtract value F' occupying particular bit positions;

receiving the multiple subtract values output from said look-up table;

selecting a particular subtract value F' from the multiple add values based on the selector value CTL;

generating the horizontal cycle count HPW by subtracting the particular subtract value F' and the first cycle information N' such that HPW=N'-F'.

92. The method for generating synchronizing signals of claim 91, further comprising:

generating an output vertical synchronizing signal substantially synchronized with the output horizontal synchronizing signal upon receipt of an input vertical synchronizing signal; and generating an initial line count value upon receipt of an input vertical synchronizing signal.

* * * * *